(12) United States Patent
Chang et al.

(10) Patent No.: US 12,512,440 B2
(45) Date of Patent: Dec. 30, 2025

(54) SEMICONDUCTOR STRUCTURE, STACKED STRUCTURE WITH TERMINAL COMPRISING CAPPING LAYER AND MANUFACTURING METHOD THEREOF

(71) Applicant: Taiwan Semiconductor Manufacturing Company, Ltd., Hsinchu (TW)

(72) Inventors: Wei-Chung Chang, Taipei (TW); Ming-Che Ho, Tainan (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 332 days.

(21) Appl. No.: 18/152,141

(22) Filed: Jan. 9, 2023

(65) Prior Publication Data
US 2024/0096849 A1 Mar. 21, 2024

Related U.S. Application Data

(60) Provisional application No. 63/407,720, filed on Sep. 18, 2022.

(51) Int. Cl.
| H01L 23/498 | (2006.01) |
| H01L 21/56 | (2006.01) |
| H01L 21/768 | (2006.01) |
| H01L 23/00 | (2006.01) |
| H01L 23/538 | (2006.01) |
| H01L 25/065 | (2023.01) |

(52) U.S. Cl.
CPC ........ *H01L 25/0655* (2013.01); *H01L 21/565* (2013.01); *H01L 21/76829* (2013.01); *H01L 23/49838* (2013.01); *H01L 23/5389* (2013.01); *H01L 24/16* (2013.01); *H01L 24/24* (2013.01); *H01L 23/49827* (2013.01); *H01L 2224/16135* (2013.01); *H01L 2224/2401* (2013.01)

(58) Field of Classification Search
CPC .......... H01L 25/0655; H01L 23/49838; H01L 23/5389; H01L 24/16; H01L 24/14; H01L 21/565; H01L 21/76829
See application file for complete search history.

(56) References Cited

U.S. PATENT DOCUMENTS

| 8,993,380 B2 | 3/2015 | Hou et al. |
| 9,000,584 B2 | 4/2015 | Lin et al. |

(Continued)

*Primary Examiner* — Michael Jung
(74) *Attorney, Agent, or Firm* — JCIPRNET

(57) ABSTRACT

A semiconductor structure includes a semiconductor die, a redistribution circuit structure, and a terminal. The redistribution circuit structure is disposed on and electrically coupled to the semiconductor die. The terminal is disposed on and electrically coupled to the redistribution circuit structure, where the redistribution circuit structure is disposed between the semiconductor die and the terminal, and the terminal includes an under-bump metallization (UBM) and a capping layer. The UBM is disposed on and electrically coupled to the redistribution circuit structure, where the UBM includes a recess. The capping layer is disposed on and electrically coupled to the UBM, where the UBM is between the capping layer and the redistribution circuit structure, and the capping layer fills the recess of the UBM.

20 Claims, 36 Drawing Sheets

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2014/0091473 A1* | 4/2014 | Len ................ H01L 21/4853 438/118 |
| 2014/0203397 A1* | 7/2014 | Yen ................ H01L 23/5227 438/381 |
| 2015/0108634 A1* | 4/2015 | Liu ................ H01L 21/31133 257/737 |
| 2020/0343179 A1* | 10/2020 | Kuo ................ H01L 24/92 |
| 2024/0014152 A1* | 1/2024 | van Gemert ........ H01L 24/03 |

\* cited by examiner

SEMICONDUCTOR STRUCTURE, STACKED STRUCTURE WITH TERMINAL COMPRISING CAPPING LAYER AND MANUFACTURING METHOD THEREOF

CROSS-REFERENCE TO RELATED APPLICATION

This application claims the priority benefits of U.S. provisional application Ser. No. 63/407,720, filed on Sep. 18, 2022. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
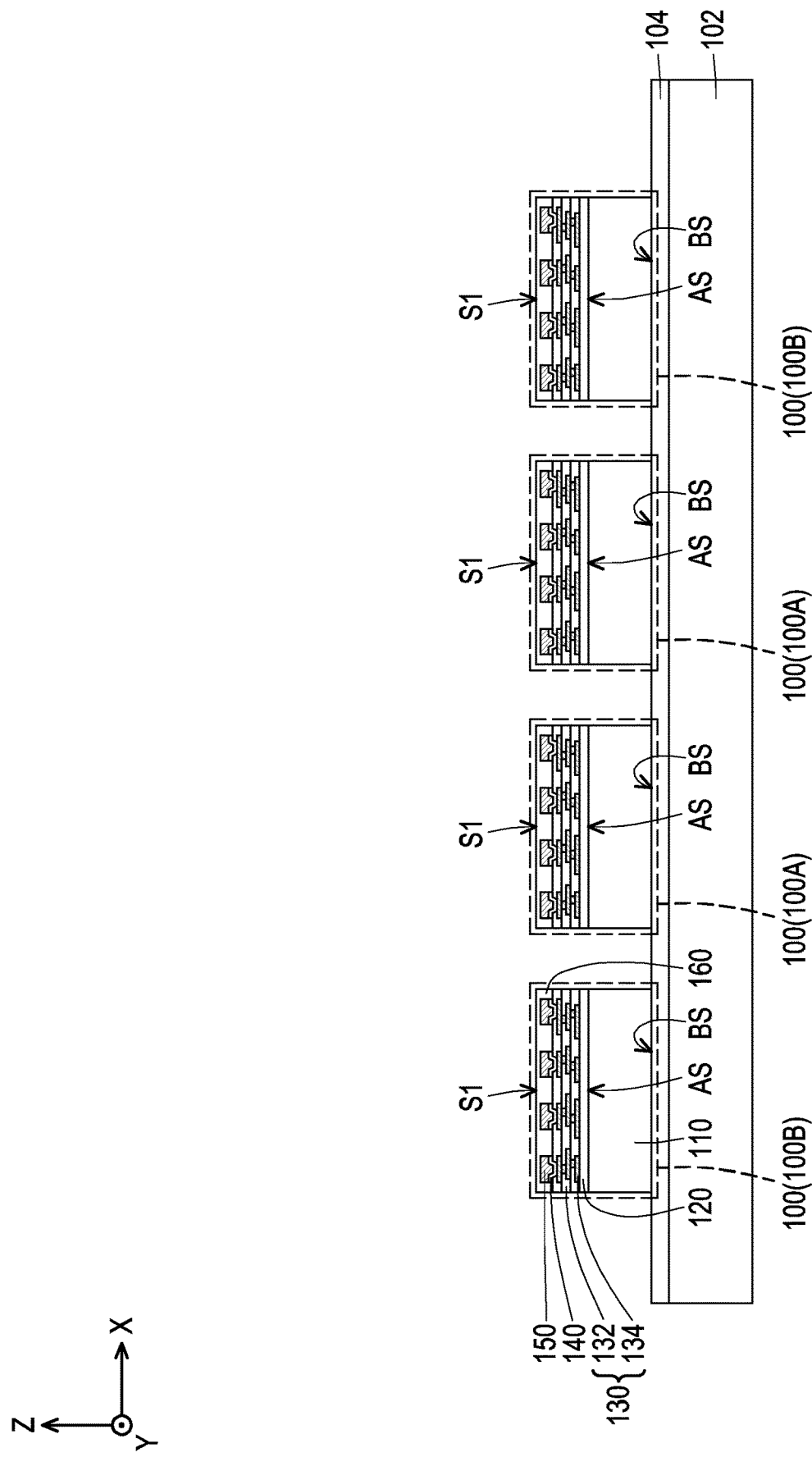
FIG. 1 through FIG. 12 are schematic cross-sectional views of various stages in a manufacturing method of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

It should be appreciated that the following embodiment(s) of the disclosure provides applicable concepts that can be embodied in a wide variety of specific contexts. The specific embodiment(s) discussed herein is merely illustrative and is related to a semiconductor structure including a cap structure disposing over an under-bump metallization (UBM), and is not intended to limit the scope of the disclosure. In accordance with some embodiments, the semiconductor structure includes semiconductor dies, a routing structure disposed over the semiconductor dies and electrically coupled thereto, a plurality of UBMs disposed over the routing structure and electrically coupled thereto, and a plurality of capping layers (or saying a caping structure having a plurality of separated segments) disposed over the UBMs and electrically coupled thereto. In In the case, the capping layers provides high degrees of planarity at their outermost surfaces, where a void (e.g., air voids) can be greatly suppressed or eliminated from an joint after a solder joint process between the semiconductor structure and an additional semiconductor package or structure, thereby improving the performance of the semiconductor structure. Thus, the reliability of the semiconductor structure is ensured.

Figure 9:
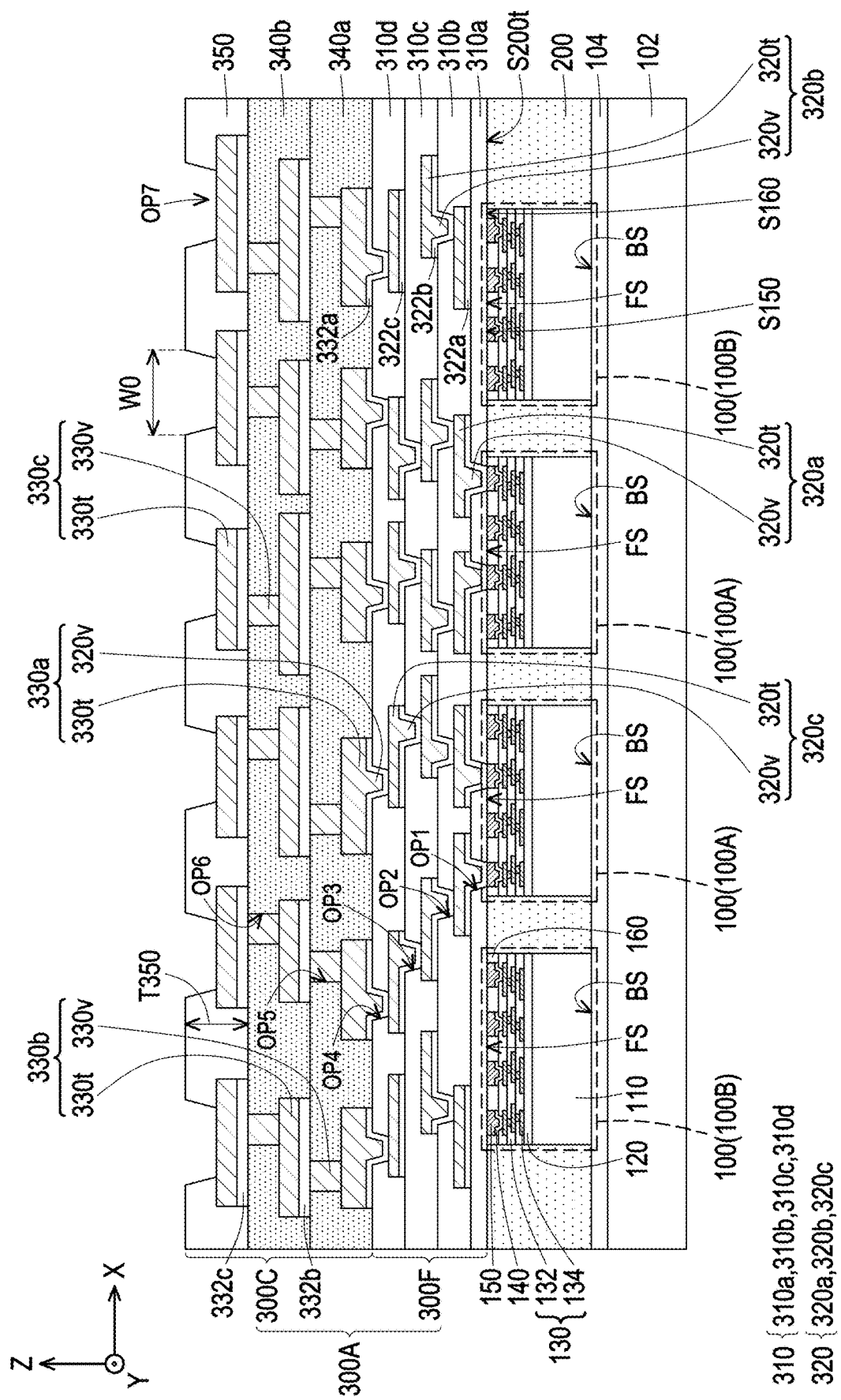
Figure 10:
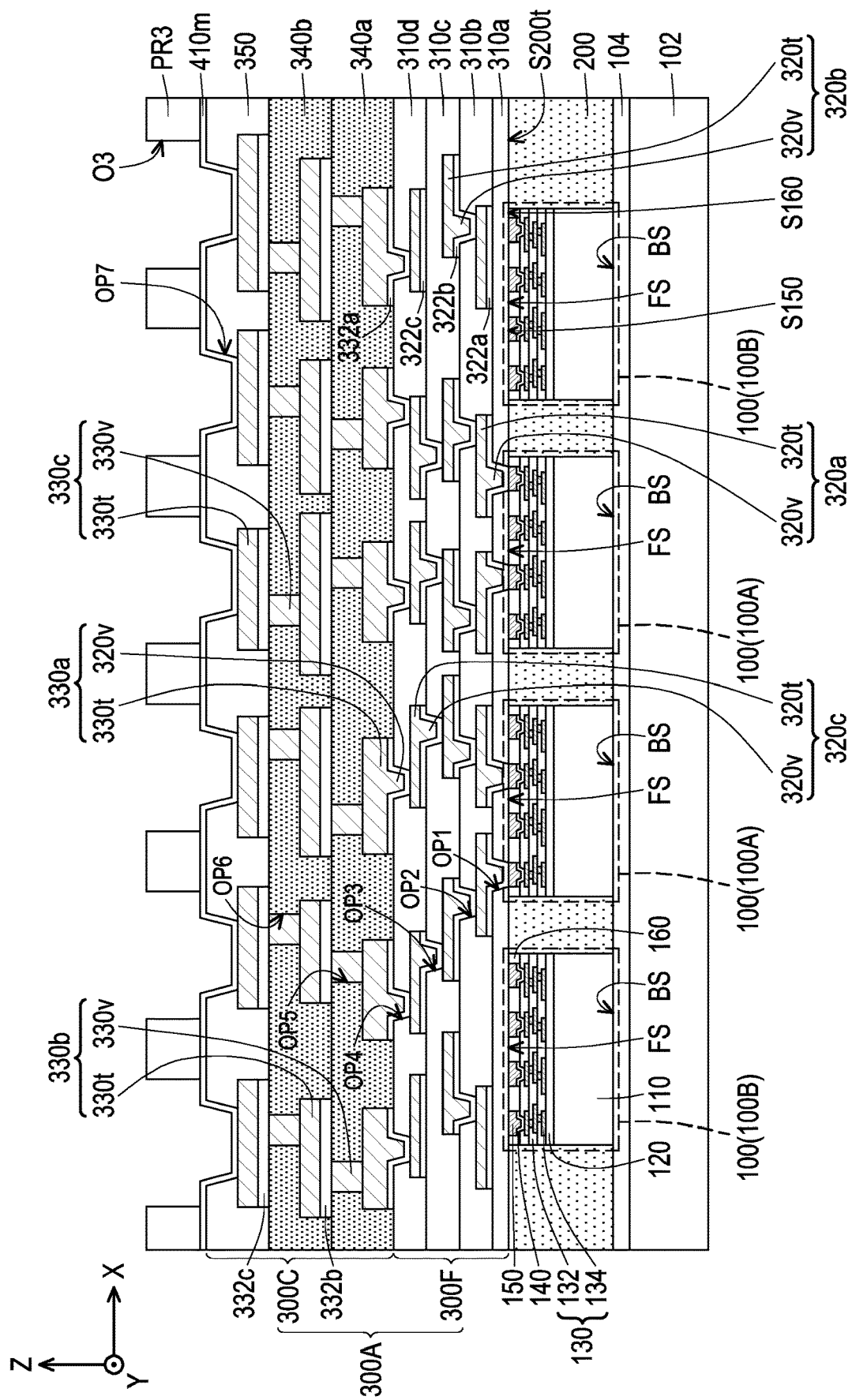
Figure 11:
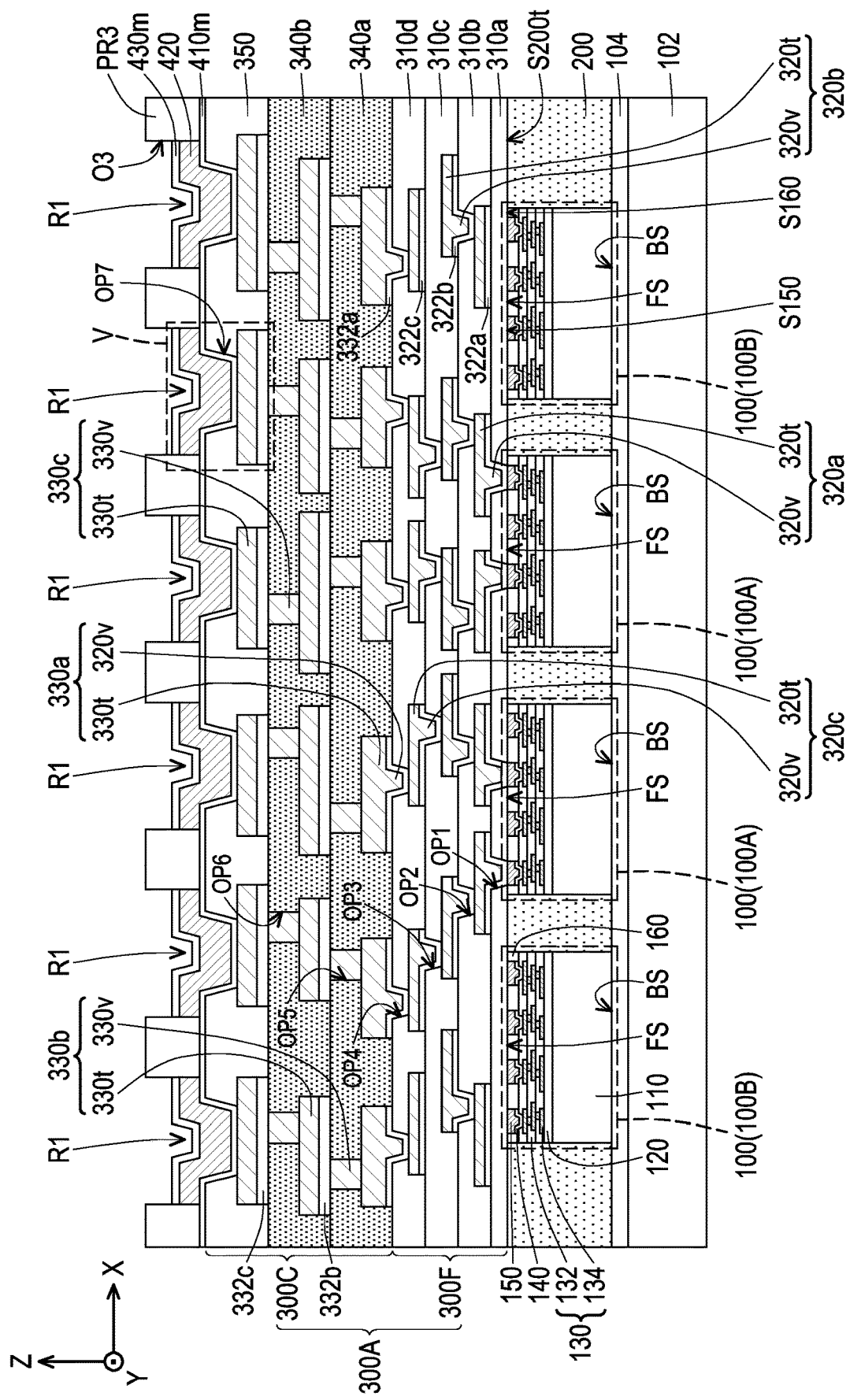
Figure 12:
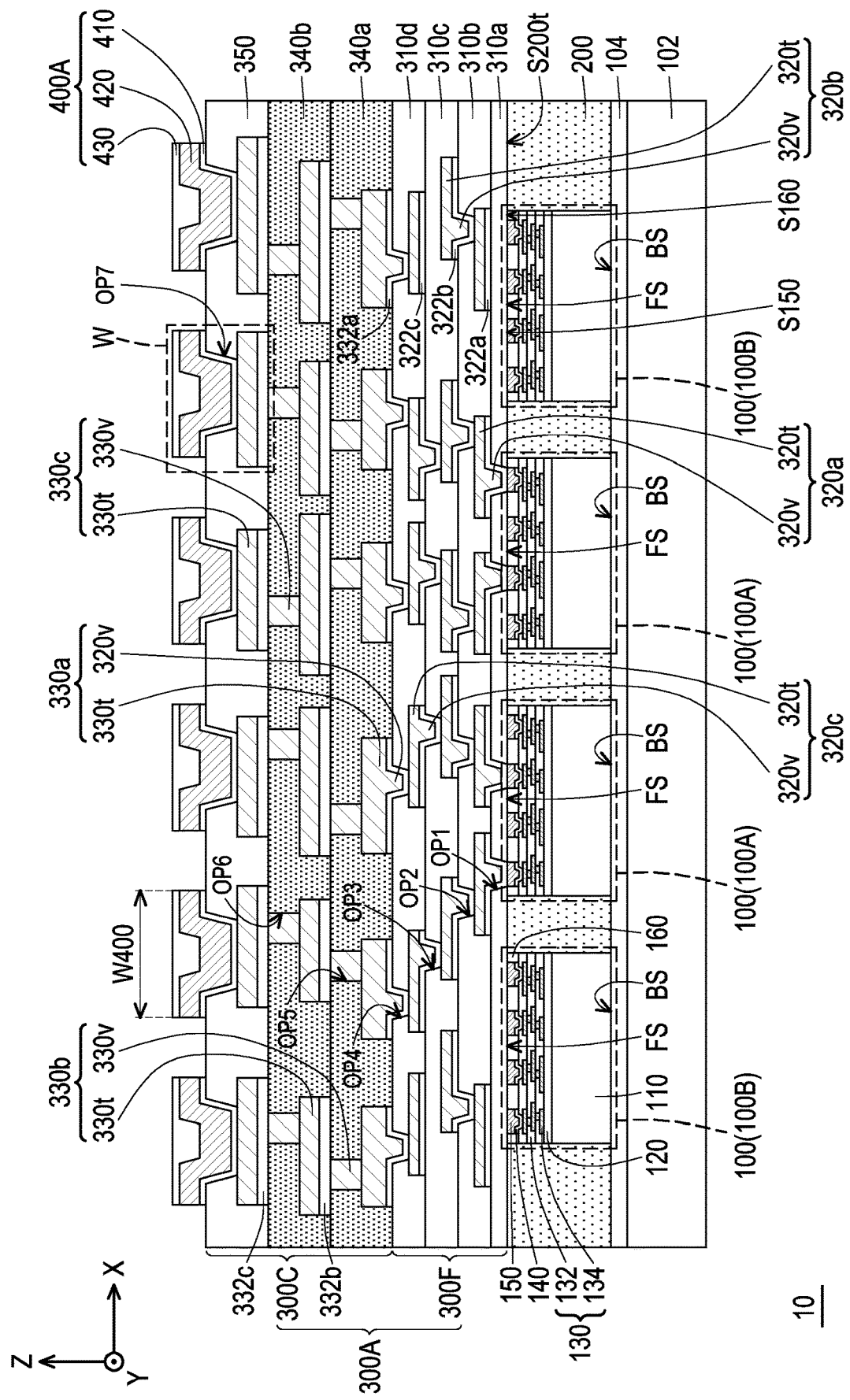
Figure 13:
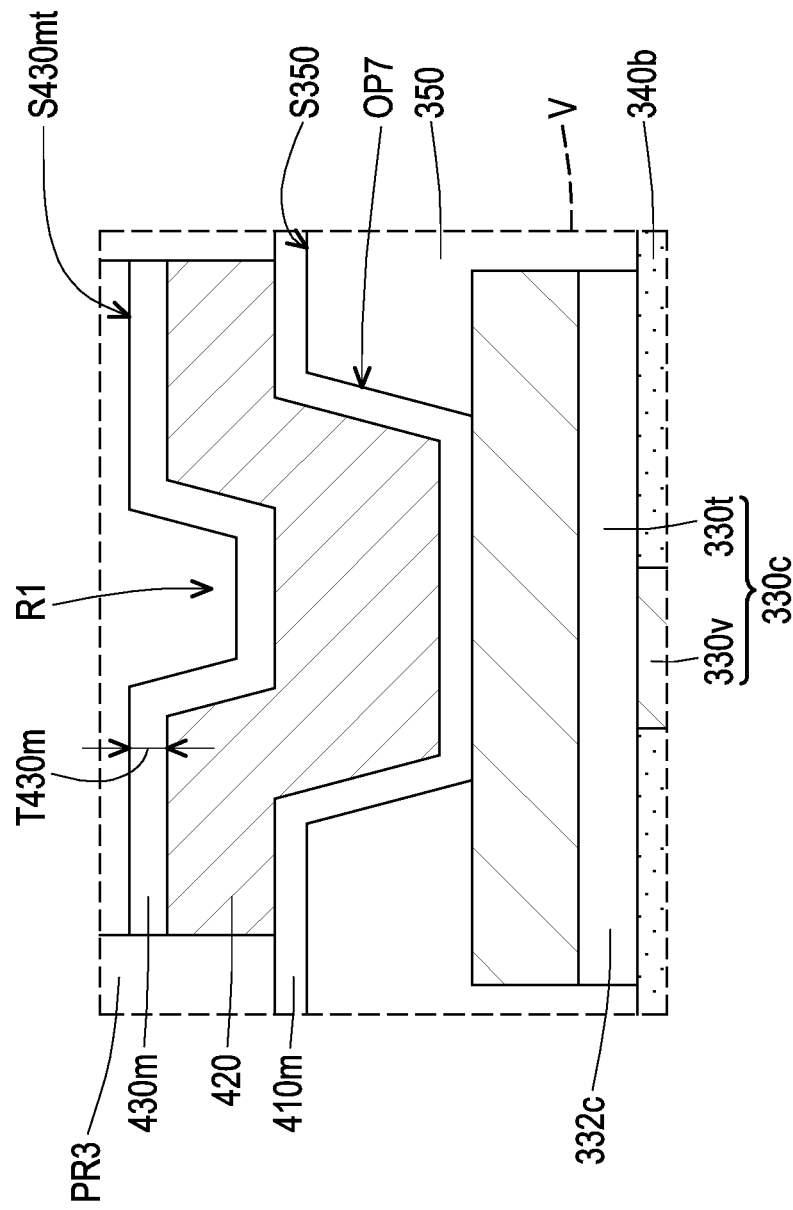
FIG. 13 is an enlarged and schematic cross-sectional view showing a configuration of terminals included in the semiconductor structure depicted in FIG. 11 before reflowing.
Figure 14:
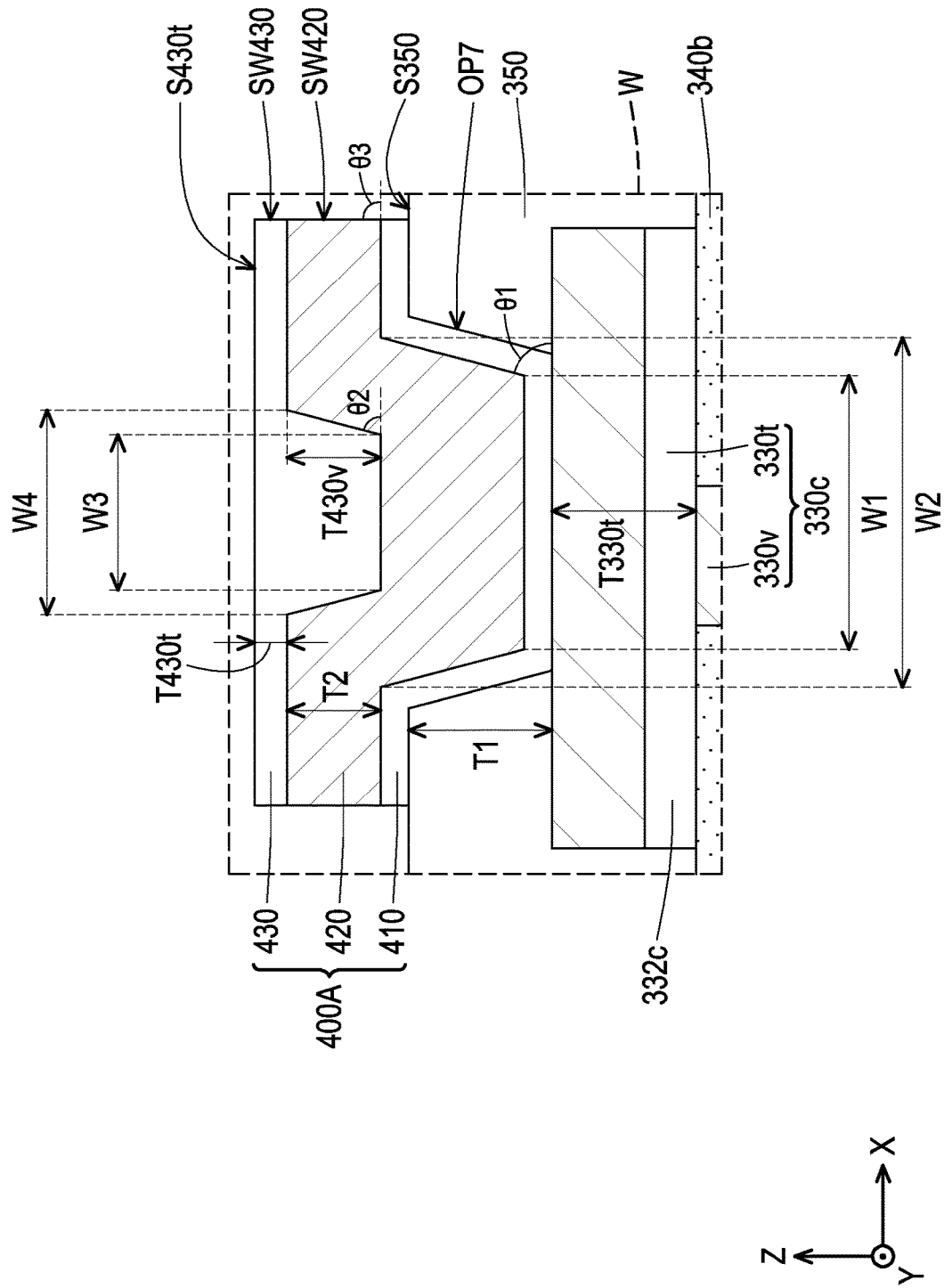
FIG. 14 is an enlarged and schematic cross-sectional view showing a configuration of terminals included in the semiconductor structure depicted in FIG. 12 after reflowing.
Figure 15:
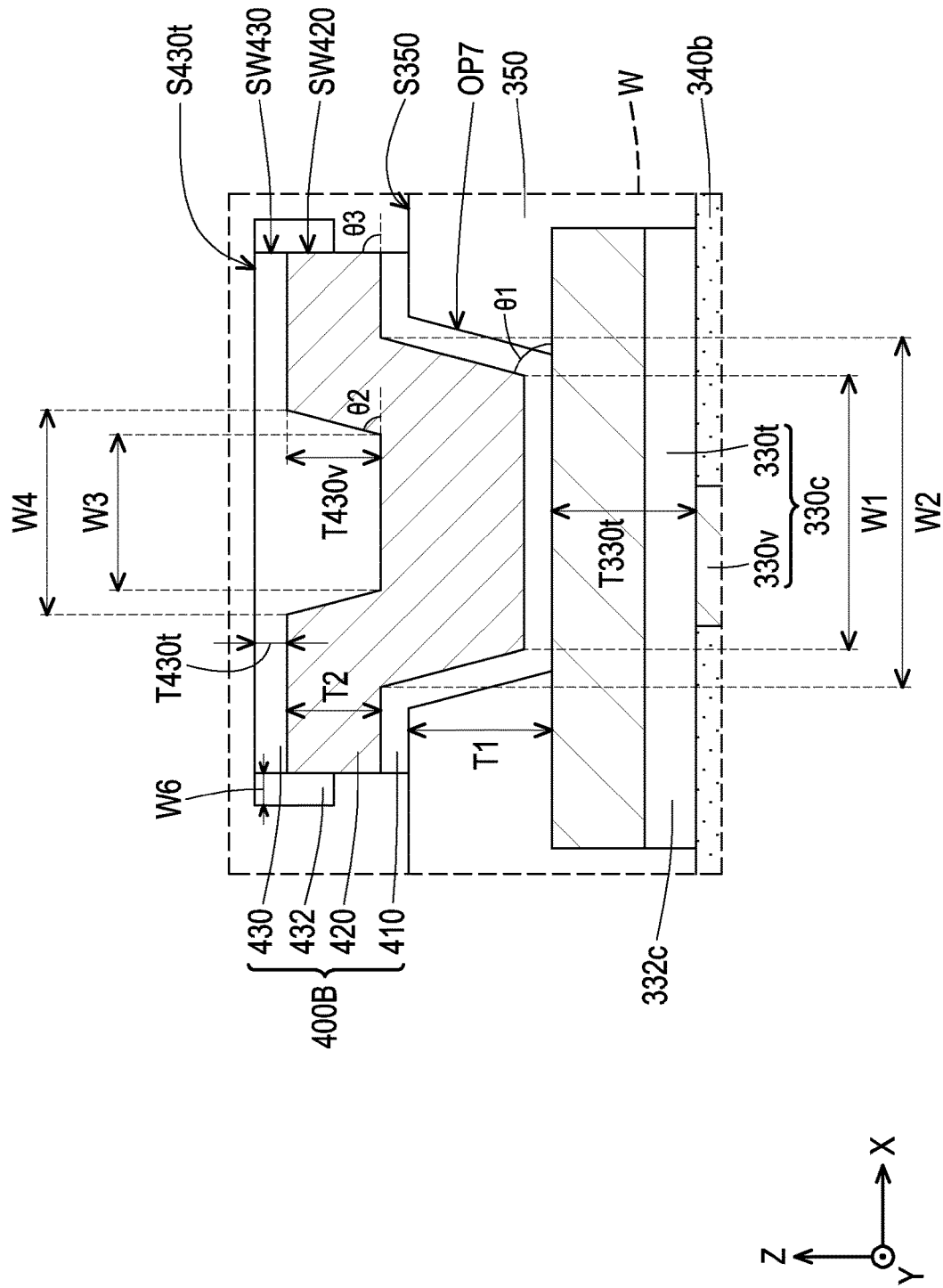
FIG. 15 through FIG. 17 are schematic cross-sectional views respectively showing various embodiments of terminals included in a semiconductor structure in accordance with alternative embodiments of the disclosure.
Figure 16:
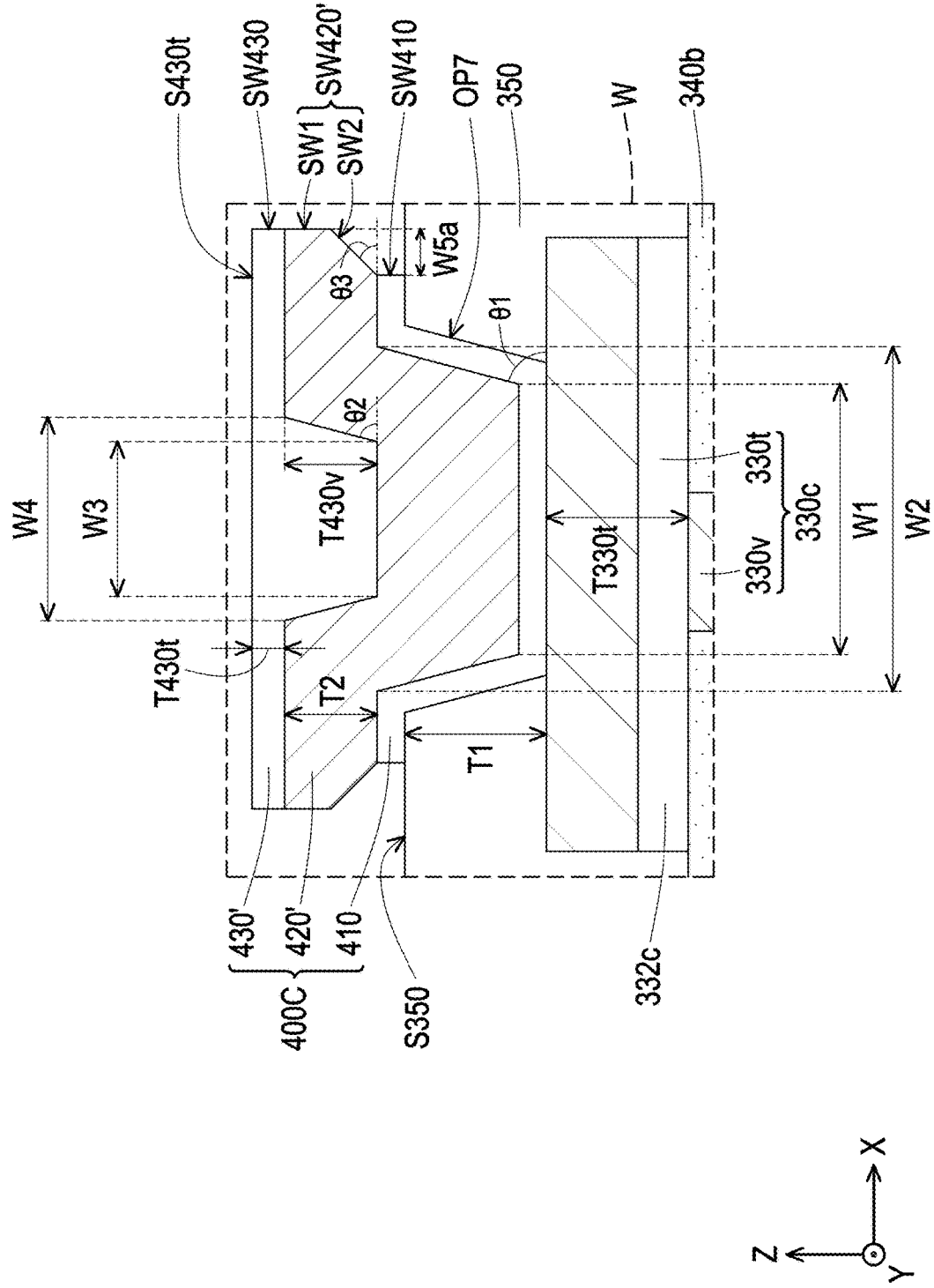
Figure 17:
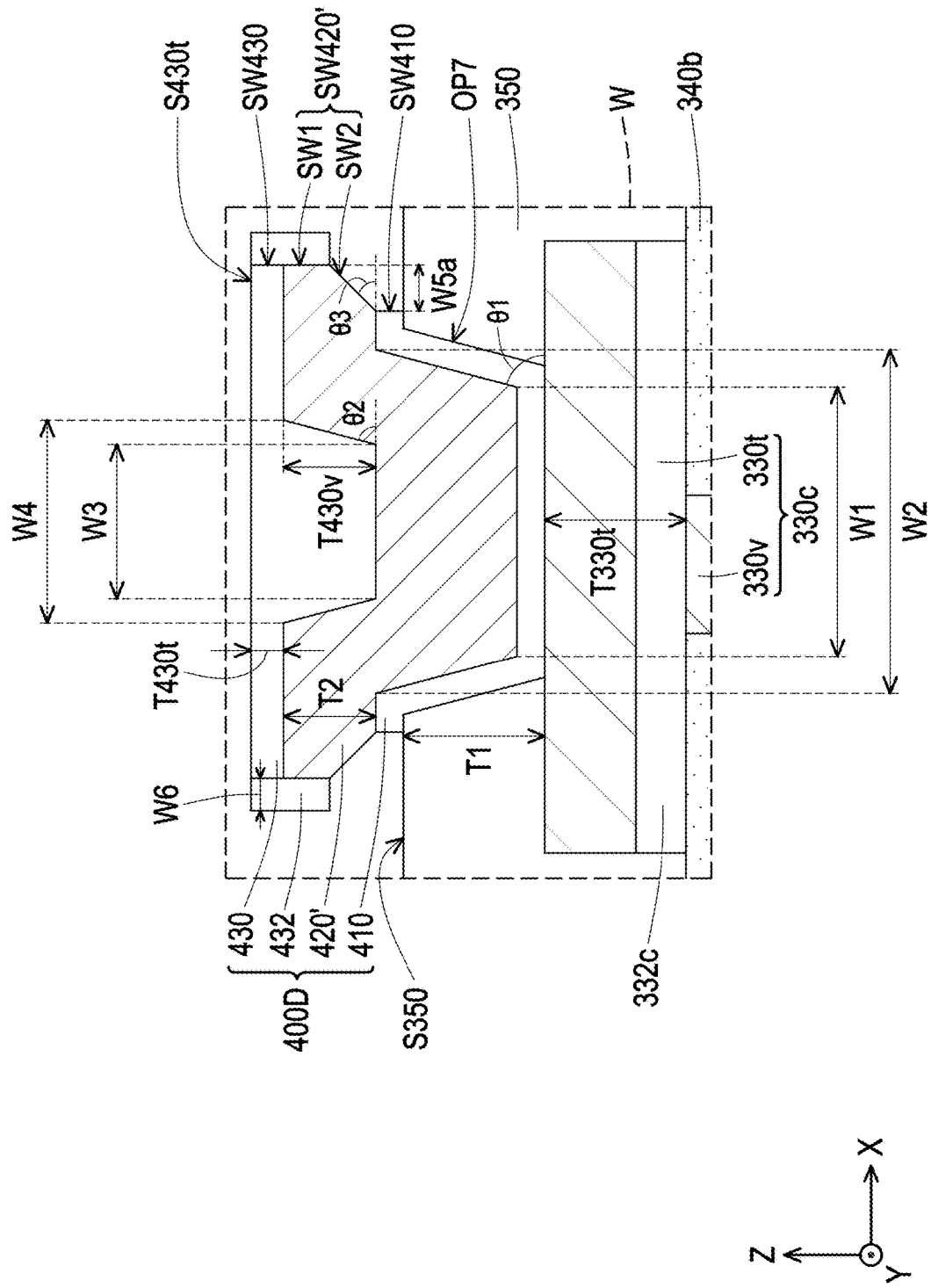

FIG. 1 through FIG. 12 are schematic cross-sectional views of various stages in a manufacturing method of a semiconductor structure 10 in accordance with some embodiments of the disclosure. FIG. 13 is an enlarged and schematic cross-sectional view showing a configuration of terminals included in the semiconductor structure 10 depicted in FIG. 11 before reflowing, where the enlarged and schematic cross-sectional view of FIG. 13 is outlined in a dashed box V as shown in FIG. 11. FIG. 14 is an enlarged and schematic cross-sectional view showing a configuration of terminals included in the semiconductor structure 10 depicted in FIG. 12 after reflowing, where the enlarged and schematic cross-sectional view of FIG. 14 is outlined in a dashed box W as shown in FIG. 12. FIG. 15 through FIG. 17 are schematic cross-sectional views respectively showing various embodiments of terminals included in a semiconductor structure in accordance with alternative embodiments of the disclosure. In embodiments, the manufacturing method is part of a wafer level packaging process. It is to be noted that the process steps described herein cover a portion of the manufacturing processes used to fabricate the semiconductor structure involving a plurality of semiconductor die (or chip) and a routing structure connected thereto, where a plurality of terminals (with high degrees of planarity at the outermost surfaces) are disposed on and electrically connected to the routing structures. The embodiments are intended to provide further explanations but are not used to limit the scope of the disclosure. Accordingly, it is understood that additional processes may be provided before, during, and after the illustrated method, and that some other processes may only be briefly described herein. In the disclosure, it should be appreciated that the illustration of components throughout all figures is schematic and is not in scale. Throughout the various views and illustrative embodiments of the disclosure, the elements similar to or substantially the same as the elements described previously will use the same reference numbers, and certain details or descriptions (e.g., the materials, formation processes, positioning configurations, electrical connections, etc.) of the same elements would not be repeated. For clarity of illustrations, the drawings are illustrated with orthogonal axes (X, Y and Z) of a Cartesian coordinate system according to which the views are oriented; however, the disclosure is not specifically limited thereto.

Referring to FIG. 1, in some embodiments, a carrier 102 is provide. In some embodiments, the carrier 102 may be a glass carrier, a ceramic carrier, or any suitable carrier for carrying a semiconductor wafer or a reconstituted wafer for the manufacturing method of the semiconductor structure. In alternative embodiments, the carrier 102 may be a reclaim wafer or a reconstituted wafer for the manufacturing method of the semiconductor structure. For a non-limiting example, as the material of the carrier 102 is a Si substrate, the carrier 102 may serve as a heat dissipating element for the semiconductor structure 10. In such embodiments, the carrier 102 may further be used for warpage control. For another non-limiting example, as the carrier 102 is a glass carrier, the carrier 102 may be then removed after the manufacture of the semiconductor structure 10. In one embodiment, the carrier 102 may be a temporary supporting structure, which may be removed during the manufacturing method of the semiconductor structure 10. Or, the carrier 102 may be a mechanical supporting structure, which may not be removed after the manufacturing method of the semiconductor structure 10.

In some embodiments, the carrier 102 is coated with a debond layer 104 (as shown in FIG. 1). The material of the debond layer 104 may be any material suitable for bonding and debonding the carrier 102 from the above layer(s) or any wafer(s) disposed thereon. In some embodiments, the debond layer 104 includes a dielectric material layer made of a dielectric material including any suitable polymer-based dielectric material (such as benzocyclobutene (BCB), polybenzoxazole (PBO)). For a non-limiting example, the debond layer 104 includes a dielectric material layer made of an epoxy-based thermal-release material, which loses its adhesive property when heated, such as a light-to-heat-conversion (LTHC) release coating film. For another non-limiting example, the debond layer 104 includes a dielectric material layer made of an ultra-violet (UV) glue, which loses its adhesive property when exposed to UV lights. The debond layer 104 may be dispensed as a liquid and cured on the carrier 102, may be a laminate film laminated onto the carrier 102, or may be formed on the carrier 102 by any suitable method. For example, as shown in FIG. 1, an illustrated top surface of the debond layer 104, which is opposite to an illustrated bottom surface contacting the carrier 102, is leveled and has a high degree of coplanarity. In certain embodiments, the debond layer 104 is a LTHC layer with good chemical resistance, and such layer enables room temperature debonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and an top surface of the buffer layer may further provide a high degree of coplanarity. In some embodiments, the buffer layer may be a dielectric material layer. In some embodiments, the buffer layer may be a polymer layer which made of polyimide (PI), PBO, BCB, or any other suitable polymer-based dielectric material. In some embodiments, the buffer layer may be Ajinomoto Buildup Film (ABF), Solder Resist film (SRF), or the like. In other words, the buffer layer is an optional dielectric layer, and may be omitted based on the demand; the disclosure is not limited thereto. For example, the buffer layer may be formed by a suitable fabrication technique such as spin-coating, lamination, deposition, or the like.

Continued on FIG. 1, in some embodiments, a plurality of semiconductor dies 100 are provided. In some embodiments, each of the semiconductor dies 100 includes a semiconductor substrate 110, a device layer 120 having semiconductor devices (not shown) formed thereon, an interconnect structure 130 formed on the device layer 120 and over the semiconductor substrate 110, a plurality of connecting pads 140 formed on the interconnect structure 130, a plurality of connecting vias 150 formed on the connecting pads 140, and a protection layer 160 covers the interconnect structure 130, the connecting pads 140 and the connecting vias 150. In some embodiments, the semiconductor substrate 110 includes a bulk semiconductor, a semiconductor-on-insulator (SOI) substrate, other supporting substrate (e.g., quartz, glass, etc.), combinations thereof, or the like, which may be doped or undoped. In some embodiments, the semiconductor substrate 110 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), etc.), combinations thereof, or other suitable materials. The compound semiconductor substrate may have a multilayer structure, or the substrate may include a multilayer compound semiconductor structure. The alloy SiGe may be formed over a silicon substrate. The SiGe substrate may be strained.

In some embodiments, the device layer 120 includes the semiconductor devices formed on (and/or partially formed in) the semiconductor substrate 110, where the semiconductor devices include active devices (e.g., transistors, diodes, memory, etc.) and/or passive devices (e.g., capacitors, resistors, inductors, jumper, etc.), or other suitable electrical components. The device layer 120 may be disposed at an active surface AS of the semiconductor substrate 110 proximal to the interconnect structure 130, as shown in FIG. 1. In some embodiments, the semiconductor substrate 110 has the active surface AS and a bottom surface (may also referred to as bottom side, rear surface, or rear side) BS opposite to the active surface AS along the stacking direction Z of the interconnect structure 130, the device layer 120, and the semiconductor substrate 110. In some embodiments, the device layer 120 is interposed between the interconnect structure 130 and the active surface AS of the semiconductor substrate 110.

The device layer 120 may include circuitry (not shown) formed in a front-end-of-line (FEOL), and the interconnect structure 130 may be formed in a back-end-of-line (BEOL). In some embodiments, the interconnect structure 130 includes an inter-layer dielectric (ILD) layer formed over the device layer 120, and an inter-metallization dielectric (IMD) layer formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers which is not limited thereto.

In some embodiments, the interconnect structure 130 including one or more dielectric layers 132 and one or more metallization layer 134 in alternation. The metallization layer 134 may be embedded in the dielectric layers 132. In some embodiments, the interconnect structure 130 is electrically coupled to the semiconductor devices of the device layer 120 to one another and to external components (e.g., test pads, bonding conductors, etc.) formed thereon. For example, the metallization layer 134 in the dielectric layers 132 route electrical signals between the semiconductor devices of the device layer 120. The semiconductor devices of the device layer 120 and the metallization layer 134 are interconnected to perform one or more functions including memory structures (e.g., a memory cell), processing structures (e.g., a logic cell), input/output (I/O) circuitry (e.g., an I/O cell), or the like. The uppermost layer of the interconnect structure 130 may be a passivation layer made of one or more suitable dielectric materials such as silicon oxide, silicon nitride, low-k dielectrics, polyimide (PI), combinations of these, or the like. In some embodiments, as shown in FIG. 1, the passivation layer (e.g., the uppermost layer of the dielectric layers 132) of the interconnect structure 130 has an opening exposing at least a portion of a topmost layer of the metallization layer 134 for further electrical connection.

The dielectric layers 132 may be PI, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The etching process may include a dry etching, a wet etching, or a combination thereof. In some embodiments, the dielectric layers 132 are formed by suitable fabrication techniques such as spin-on coating, chemical vapor deposition (CVD), plasma-enhanced chemical vapor deposition (PECVD) or the like.

The metallization layer 134 may be made of conductive materials formed by electroplating or deposition, such as copper, copper alloy, aluminum, aluminum alloy, or combinations thereof, which may be patterned using a photolithography and etching process. The etching process may include a dry etching, a wet etching, or a combination thereof. In some embodiments, the metallization layer 134 are patterned copper layers or other suitable patterned metal layers. For example, may be metal lines, metal vias, metal pads, metal traces, etc. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The numbers of the dielectric layers 132 and the number of the metallization layers 134 are not limited in the disclosure, and may be selected and designated based on demand and design layout.

In some embodiments, as illustrated in FIG. 1, the connecting pads 140 are disposed over and electrically coupled to the topmost layer of the metallization layer 134 of the interconnect structure 130 exposed by the passivation layer (e.g., the uppermost layer of the dielectric layers 132) of the interconnect structure 130 for testing and/or further electrical connection. The connecting pads 140 may be made of aluminum, copper, or alloys thereof or the like, and may be formed by an electroplating process. The disclosure is not limited thereto. Some of the connecting pads 140 may be testing pads, and some of the connecting pads 140 may be conductive pads for further electrical connection. In alternative embodiments, the connecting pads 140 may be optional for simple structure and cost benefits. In such alternative embodiments, the connecting vias 150 may directly connect to the uppermost metallization layer 134.

In some embodiments, the connecting vias 150 are respectively disposed on and electrically connected to the connecting pads 140 for providing an external electrical connection to the circuitry and semiconductor devices of the device layer 120. In one embodiment, the connecting vias 150 may be formed of conductive materials such as copper, gold, aluminum, the like, or combinations thereof, and may be formed by an electroplating process or the like. The connecting vias 150 may be bond vias, bond pads or bond bumps, or combinations thereof. The disclosure is not limited thereto. The connecting vias 150 may serve as bonding conductors for further electrical connection and may be formed over the connecting pads 140 (serving as the conductive pads for further electrical connection). The connecting vias 150 may be electrically coupled to the semiconductor devices of the device layer 120 through the interconnect structure 130 and the connecting pads 140.

Alternatively, both of the connecting pads 140 and the connecting vias 150 may be formed on the interconnect structure 130. For example, the connecting vias 150 are disposed on and electrically connected to the topmost layer of the metallization layer 134 of the interconnect structure 130 exposed by the passivation layer (e.g., the uppermost layer of the dielectric layers 132) of the interconnect structure 130. That is, the connecting vias 150 and the connecting pads 140 may all be disposed on the topmost layer of the metallization layer 134 of the interconnect structure 130 exposed by the passivation layer in a manner of side-by-side. In such embodiments, the connecting pads 140 may be testing pads for testing while the connecting vias 150 may be the bonding conductors for further electrical connection. The connecting vias 150 may be electrically coupled to the semiconductor devices of the device layer 120 through the interconnect structure 130.

In some embodiments, the protection layer 160 is formed on the interconnect structure 130 to cover the interconnect structure 130, the connecting pads 140, and the connecting vias 150. That is to say, the protection layer 160 prevents any possible damage(s) occurring on the connecting pads 140 and the connecting vias 150 during the transfer of the semiconductor dies 100. In addition, in some embodiments, the protection layer 160 further acts as a passivation layer for providing better planarization and evenness. In some embodiments, top surfaces of the connecting vias 150 are not accessibly revealed by a top surface S1 of the protection layer 160, as shown in FIG. 1.

The protection layer 160 may include one or more layers of dielectric materials, such as silicon nitride, silicon oxide, high-density plasma (HDP) oxide, tetra-ethyl-ortho-silicate (TEOS), undoped silicate glass (USG), silicon oxynitride, PBO, PI, silicon carbon, silicon carbon oxynitride, diamond like carbon (DLC), and the like, or a combination thereof. It should be appreciated that the protection layer 160 may include etch stop material layer(s) (not shown) interposed between the dielectric material layers depending on the process requirements. For example, the etch stop material layer is different from the overlying or underlying dielectric material layer(s). The etch stop material layer may be formed of a material having a high etching selectivity relative to the overlying or underlying dielectric material layer(s) so as to be used to stop the etching of layers of dielectric materials.

In some embodiments, the semiconductor dies 100 are picked and placed over the carrier 102 and disposed on the debond layer 104. In some embodiments, the semiconductor dies 100 are faced upwards and placed onto the debond layer 104 over the carrier 102. As shown in FIG. 1, a surfaces S1 of the protection layers 160 of the semiconductor dies 100 are disposed away from the debond layer 104, where the bottom surfaces BS of the semiconductor dies 100 are disposed on the illustrated top surface of the debond layer 104, for example. The surfaces S1 of the protection layers 160 of the semiconductor dies 100 are facing upwards and accessibly revealed, in this case.

The semiconductor dies 100 may be referred to as semiconductor dies or chips, independently, including a digital chip, an analog chip, or a mixed signal chip. In some embodiments, the semiconductor dies 100 are, independently, a logic die such as a central processing unit (CPU), a graphics processing unit (GPU), a neural network processing unit (NPU), a deep learning processing unit (DPU), a tensor processing unit (TPU), a system-on-a-chip (SoC), an application processor (AP), and a microcontroller; a power management die such as a power management integrated circuit (PMIC) die; a wireless and radio frequency (RF) die; a baseband (BB) die; a sensor die such as a photo/image sensor chip; a micro-electro-mechanical-system (MEMS) die; a signal processing die such as a digital signal processing (DSP) die; a front-end die such as an analog front-end (AFE) dies; an application-specific die such as an application-specific integrated circuit (ASIC), a field-programmable gate array (FPGA); a combination thereof; or the like. In alternative embodiments, the semiconductor dies 100 are, independently, a memory die with a controller or without a controller, where the memory die includes a single-form die such as a dynamic random access memory (DRAM) die, a static random access memory (SRAM) die, a resistive random-access memory (RRAM), a magnetoresistive random-access memory (MRAM), a NAND flash memory, a wide I/O memory (WIO) a pre-stacked memory cube such as a hybrid memory cube (HMC) module, a high bandwidth memory (HBM) module; a combination thereof; or the like. In further alternative embodiments, the semiconductor dies 100 are, independently, an artificial intelligence (AI) engine such as an AI accelerator; a computing system such as an AI server, a high-performance computing (HPC) system, a high power computing device, a cloud computing system, a networking system, an edge computing system, a immersive memory computing system (ImMC), a SoC system, etc.; a combination thereof; or the like. In some other embodiments, the semiconductor dies 100 are, independently, an electrical and/or optical input/output (I/O) interface die, an integrated passives die (IPD), a voltage regulator die (VR), a local silicon interconnect die (LSI) with or without deep trench capacitor (DTC) features, a local silicon interconnect die with multi-tier functions such as electrical and/or optical network circuit interfaces, IPD, VR, DTC, or the like. The types of the semiconductor dies 100 may be selected and designated based on the demand and design requirement, and thus are specifically limited in the disclosure.

In accordance with some embodiments of the disclosure, the types of some of the semiconductor dies 100 are different from each other, while some of the semiconductor dies 100 are identical types. In alternative embodiments, the types of all of the semiconductor dies 100 are different. In further alternative embodiments, the types of all of the semiconductor dies 100 are identical. In accordance with some embodiments of the disclosure, the sizes of some of the semiconductor dies 100 are different from each other, while some of the semiconductor dies 100 are the same sizes. In alternative embodiments, the sizes of all of the semiconductor dies 100 are different. In further alternative embodiments, the sizes of all of the semiconductor dies 100 are the same. In accordance with some embodiments of the disclosure, the shapes of some of the semiconductor dies 100 are different from each other, while the shapes of some of the semiconductor dies 100 are identical. In alternative embodiments, the shapes of all of the semiconductor dies 100 are different. In further alternative embodiments, the shapes of all of the semiconductor dies 100 are identical. The types, sizes and shapes of each of the semiconductor dies 100 are independent from each other, and may be selected and designed based on the demand and design layout, the disclosure is not limited thereto.

As illustrated in FIG. 1, in some embodiments, the semiconductor dies 100 includes a first group (plurality) of semiconductor dies 100A and a second group (plurality) of semiconductor dies 100B. For example, the semiconductor dies 100A may provide logic functions, memory functions, or input/output (I/O) functions, while the semiconductor dies 100B may be dummy dies. In the case, the semiconductor dies 100B are referred to as dummy dies 100B hereinafter, where the dummy dies 100B can provide better warpage control to the semiconductor structure 10. In one embodiment, the structure (e.g., types, sizes and/or shapes) of the semiconductor dies 100A is substantially identical to the structure (e.g., types, sizes and/or shapes) of the dummy dies 100B. In an alternative embodiment, the structure (e.g., types, sizes and/or shapes) of the semiconductor dies 100A is different from the structure (e.g., types, sizes and/or shapes) of the dummy dies 100B. As shown in FIG. 1, only four the semiconductor dies 100 (e.g., two semiconductor dies 100A and two dummy dies 100B) are presented for illustrative purposes, however, it should be noted that the number of the semiconductor dies 100 (e.g., the semiconductor dies 100A and/or the dummy dies 100B) may be one, two, three, fourth or more than fourth, the disclosure is not limited thereto.

The semiconductor dies 100A and the dummy dies 100B may be arranged aside to each other along the direction X. The semiconductor dies 100A and the dummy dies 100B may be arranged aside to each other along the direction Y. In some embodiments, the semiconductor dies 100A and the dummy dies 100B are arranged in the form of a matrix, such as the N×N array or N×M arrays (N, M>0, N may or may not be equal to M). However, the disclosure is not limited thereto, in an alternative embodiment, the semiconductor dies 100A are arranged in the form of a matrix, such as the N×N array or N×M arrays (N, M>0, N may or may not be equal to M), while the dummy dies 100B are arranged to surround the semiconductor dies 210 (arranged into the array/matrix. The disclosure is not limited thereto.

Figure 2:
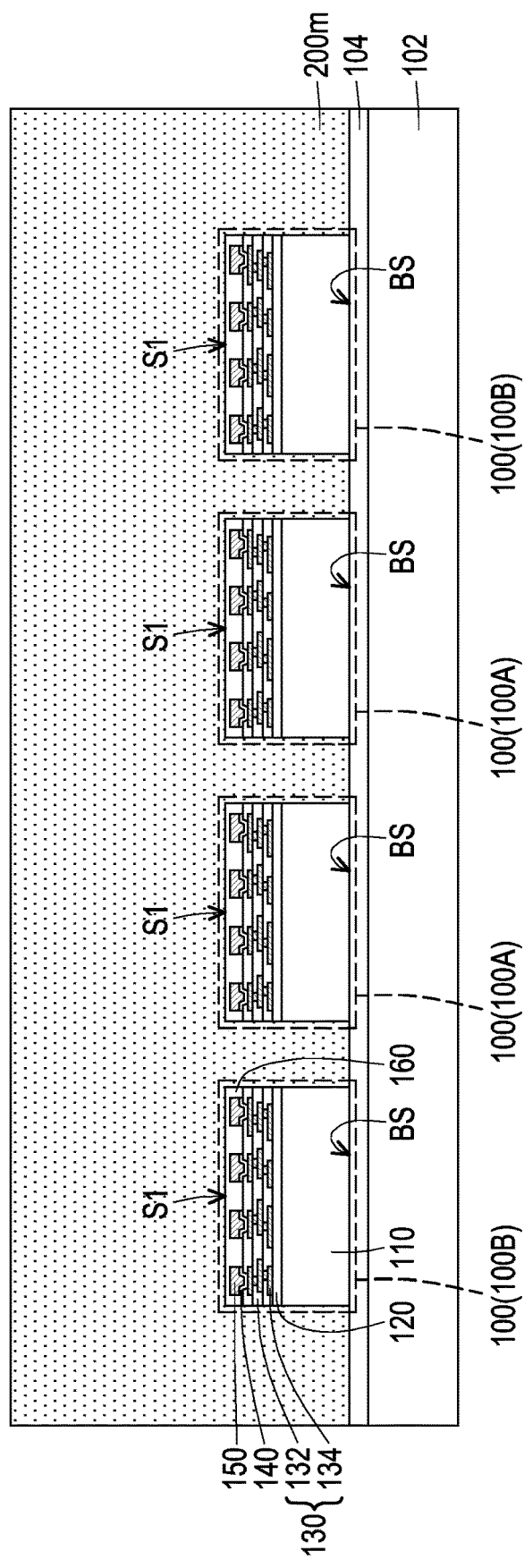

Referring to FIG. 2, in some embodiments, an encapsulation material 200m is formed on the debond layer 104 and over the carrier 102 to encapsulate the semiconductor dies 100A and the dummy dies 100B. The semiconductor dies 100A and the dummy dies 100B are embedded in the encapsulation material 200m, and the debond layer 104 exposed by the semiconductor dies 100A and the dummy dies 100B is covered by the encapsulation material 200m, for example. In other words, the connecting vias 150 and the protection layers 160 of the semiconductor dies 100A and the dummy dies 100B may be not accessibly revealed and are well-protected by the encapsulation material 200m. In some embodiments, the encapsulation material 200m is a molding compound, a molding underfill, a resin (such as epoxy-based resin), or the like. The encapsulation material 200m may be formed by a molding process, such as a compression molding process or a transfer molding process. In some embodiments, the encapsulation material 200m may further include inorganic filler or inorganic compound (e.g., silica, clay, and so on) which can be added therein to optimize coefficient of thermal expansion (CTE) of the encapsulation material 200m. The disclosure is not limited thereto.

Figure 3:
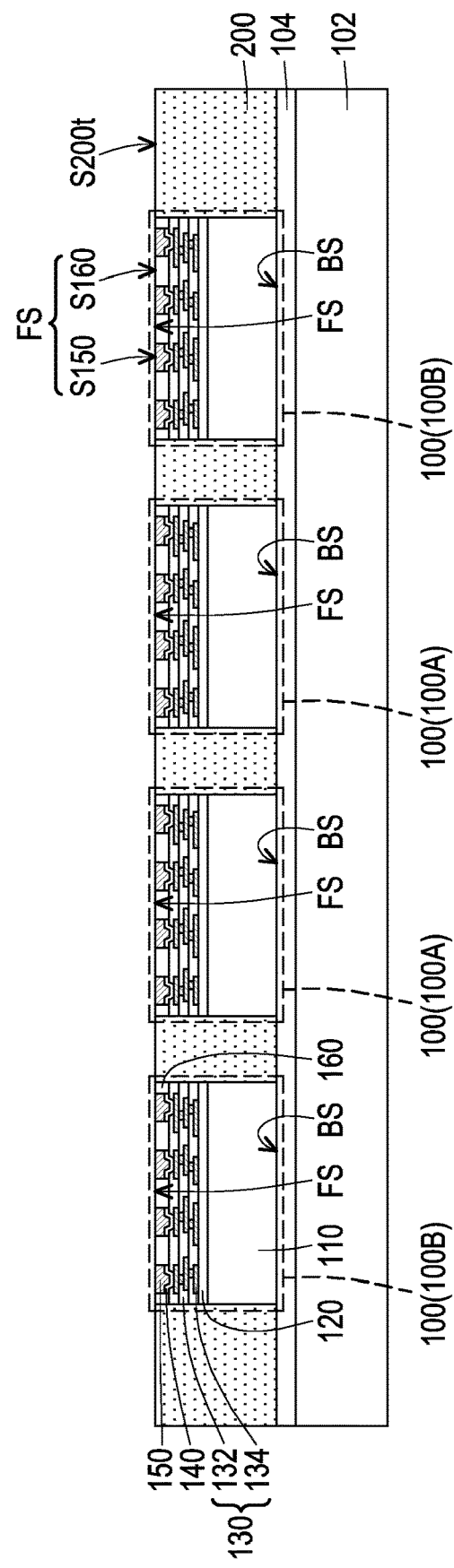

Referring to FIG. 2 and FIG. 3, in some embodiments, the encapsulation material 200m are planarized to form an insulating encapsulation 200 exposing the semiconductor dies 100A and the dummy dies 100B. The insulating encapsulation 200 is disposed on the debond layer 104 to laterally encapsulate the semiconductor dies 100A and the dummy dies 100B, for example, as shown in FIG. 3. In some embodiments, the encapsulation material 200m is planarized by a mechanical grinding process, a chemical mechanical polishing (CMP) process, an etching process, and/or combinations thereof. The etching process may include a dry etching, a wet etching, or a combination thereof. In some embodiments, during the planarizing process of the encapsulation material 200m, the protection layers 160 of the semiconductor dies 100A and the dummy dies 100B are planarized to accessibly reveal the connecting vias 150 of the semiconductor dies 100A and the dummy dies 100B. In some embodiments, portions of the connecting vias 150 of the semiconductor dies 100A and the dummy dies 100B are slightly planarized as well. As shown in FIG. 3 a surface S200t of the insulating encapsulation 200 is substantially leveled with surfaces S150 of the connecting vias 150 and surfaces S160 of the protection layers 160 of each of the semiconductor dies 100A and the dummy dies 100B, for example. In some embodiments, the surface S200t of the insulating encapsulation 200, the surfaces S150 of the connecting vias 150 and the surfaces S160 of the protection layers 160 of the semiconductor dies 100A, and the surfaces S150 of the connecting vias 150 and the surfaces S160 of the protection layers 160 of the dummy dies 100B are substantially coplanar to each other. The surfaces S150 of the connecting vias 150 and the surface S160 of the protection layer 160 of each semiconductor die 100A together may be referred to as a front surface (may also referred to as front side, top surface, or top side) FS of the semiconductor die 100A, and the surfaces S150 of the connecting vias 150 and the surface S160 of the protection layer 160 of each dummy die 100B together may be referred to as a front surface (may also referred to as front side, top surface, or top side) FS of the dummy die 100B. For example, in direction Z, the front surfaces FS of the semiconductor dies 100A and the dummy dies 100B are opposite to the bottom surfaces BS of the semiconductor dies 100A and the dummy dies 100B, as shown in FIG. 3. In some embodiments, the insulating encapsulation 200 encapsulates sidewalls of the semiconductor dies 100A and the dummy dies 100B, where the connecting vias 150 of the semiconductor dies 100A and the dummy dies 100B are accessibly revealed by the insulating encapsulation 200.

However, the disclosure is not limited thereto. Alternatively, the insulating encapsulation 200 may encapsulates sidewalls of the semiconductor dies 100A and the dummy dies 100B, where the connecting vias 150 of the semiconductor dies 100A are accessibly revealed by the insulating encapsulation 200, and the connecting vias 150 of the dummy dies 100B are not accessibly revealed by the insulating encapsulation 200. In the case, the surface S200t of the insulating encapsulation 200 is substantially leveled with surfaces S150 of the connecting vias 150 and surfaces S160 of the protection layers 160 of each of the semiconductor dies 100A, where the surface S200t of the insulating encapsulation 200 and the surfaces S150 of the connecting vias 150 and the surfaces S160 of the protection layers 160 of the semiconductor dies 100A may be substantially coplanar to each other. On the other hand, the surfaces S160 of the protection layers 160 of each of the dummy dies 100B may or may not be substantially leveled with (e.g., exposed by) the surface S200t of the insulating encapsulation 200, where the connecting vias 150 of each of the dummy dies 100B may not be substantially leveled with (e.g., exposed by) the surface S200t of the insulating encapsulation 200. That is, the surfaces S150 of the connecting vias 150 of the dummy dies 100B may not be substantially coplanar to the surface S200t of the insulating encapsulation 200, and the surfaces S160 of the protection layers 160 of the dummy dies 100B may or may not be substantially coplanar to the surface S200t of the insulating encapsulation 200.

In some embodiments, after the planarizing process, a cleaning step may be optionally performed to clean and remove the residue generated from the planarizing process. However, the disclosure is not limited thereto, and the planarizing process may be performed through any other suitable method.

In some embodiments, a redistribution circuit structure 300A is formed on the insulating encapsulation 200 and is electrically coupled to the semiconductor dies 100A. In one embodiment, the redistribution circuit structure 300A is electrically isolated from the dummy dies 100B. In an alternative embodiment, the redistribution circuit structure 300A is electrically coupled to the dummy dies 100B, where the dummy dies 100B are electrically isolated from the semiconductor dies 100A. In some embodiments, as shown in FIG. 4 to FIG. 9, the redistribution circuit structure 300A includes at least one dielectric layer 310 (e.g. a dielectric layer 310a, a dielectric layer 310b, a dielectric layer 310c, and a dielectric layer 1310d), at least one metallization layer 320 (e.g. a metallization layer 320a, a metallization layer 320b, and a metallization layer 320c), at least one metallization layer 330 (e.g. a metallization layer 330a, a metallization layer 330b, and a metallization layer 330c), at least one dielectric layer 340 (e.g. a dielectric layer 340a and a dielectric layer 340b), and a dielectric layer 350. However, in the disclosure, the numbers of layers of the dielectric layers 310, the metallization layers 320, the metallization layers 330, and the dielectric layers 340 are not limited to what is depicted in FIG. 4 to FIG. 9, where the numbers of the layers of the dielectric layers 310, the metallization layers 320, the metallization layers 330, and the dielectric layers 340 may be one or more than one as long as the redistribution circuit structure 300A can provide a sufficient routing function to the semiconductor dies 100A. In addition, a plurality of seed layers (e.g., 322 (including 322a, 322b, and/or 322c) and/or 332 (including 332a, 332b, and/or 332c)) may be further included in the redistribution circuit structure 300A.

Figure 4:
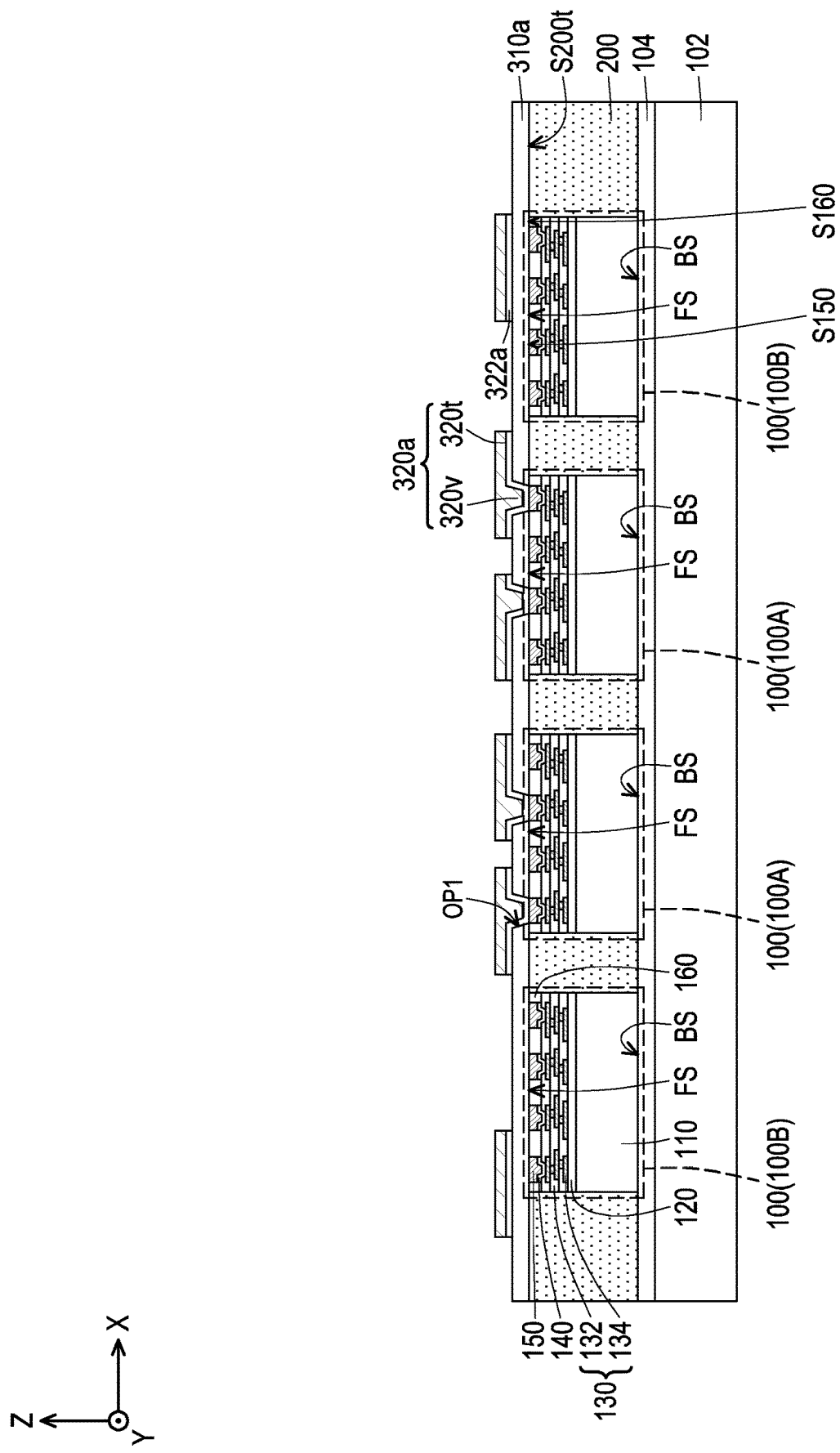

Referring to FIG. 4, in some embodiments, the dielectric layer 310a is formed on the insulating encapsulation 200. In some embodiments, the dielectric layer 310a is formed by, but not limited to, forming a blanket layer of dielectric material over the structure depicted in FIG. 3 to completely cover the insulating encapsulation 200, the semiconductor dies 100A, and the dummy dies 100B; and patterning the dielectric material blanket layer to form the dielectric layer 310a with a plurality of openings OP1 exposing the semiconductor dies 100A and the dummy dies 100B. In some embodiments, the connecting vias 150 of the semiconductor dies 100A and the connecting vias 150 of the dummy dies 100B are accessibly revealed by the dielectric layer 310a through the openings OP1. The dielectric layer 310a may have a thickness (as measured in the direction Z) of about 3 µm to about 10 µm, although other suitable thickness may alternatively be utilized. The openings OP1 each may have a critical dimension (CD) (as measured in the direction X or Y) of about 10 µm to about 20 µm, although other suitable thickness may alternatively be utilized.

In some embodiments, the material of the dielectric layer 310a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The etching process may include a dry etching, a wet etching, or a combination thereof. In some embodiments, the dielectric layer 310a may be formed by suitable fabrication techniques such as spin-on coating, chemical vapor deposition (CVD), (e.g. plasma-enhanced chemical vapor deposition (PECVD)), or the like.

In some embodiments, a seed layer material (not shown) is optionally formed over the dielectric layer 310a. In some embodiments, the seed layer material is formed on the dielectric layer 310a and extends into the openings OP1 formed in the dielectric layer 310a to physically contact the connecting vias 150 of the semiconductor dies 100A exposed by the openings OP1. In other words, the seed layer material penetrates through the dielectric layer 310a, and sidewalls and bottoms of the openings OP1 are completely covered by the seed layer material. In some embodiments, the seed layer material is formed over the dielectric layer 310a in a manner of a blanket layer made of metal or metal alloy materials, the disclosure is not limited thereto. In some embodiments, the seed layer material are referred to as a metal layer, which may be a single layer or a composite layer comprising a plurality of sub-layers formed of different materials. In some embodiments, the seed layer material include titanium, copper, molybdenum, tungsten, titanium nitride, titanium tungsten, combinations thereof, or the like. For example, the seed layer material may include a titanium layer and a copper layer over the titanium layer. The seed layer material may be formed using, for example, sputtering, physical vapor deposition (PVD), or the like. In some embodiments, the seed layer material may be conformally formed on the dielectric layer 310a by sputtering, and in contact with the dielectric layer 310a and the connecting vias 150 exposed by the openings OP1 formed in the dielectric layer 310a.

Continued on FIG. 4, in some embodiments, the metallization layer 320a is formed over the dielectric layer 310a. For example, the metallization layer 320a is disposed on (e.g., in physical contact with) the seed layer material disposed on the dielectric layer 310a and extended into the openings OP1. In some embodiments, the metallization layer 320a may be formed by, but not limited to, forming a blanket layer of conductive material over the dielectric layer 310a to completely cover the seed layer material and patterning the conductive material blanket layer to form the metallization layer 320a. In one embodiment, the metallization layer 320a may be made of conductive materials formed by electroplating or deposition, such as copper, copper alloy, aluminum, aluminum alloy, or combinations thereof, which may be patterned using a photolithography and etching process. In some embodiments, the metallization layer 320a may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The conductive vias 320v and the conductive trenches 320t independently may have a thickness (as measured in the direction Z) of about 3 µm to about 5 µm, although other suitable thickness may alternatively be utilized. The conductive vias 320v and the conductive trenches 320t independently may have a line width (as measured in the direction X or Y) of about 5 µm to about 10 although other suitable thickness may alternatively be utilized. The conductive vias 320v and the conductive trenches 320t independently may have a spacing (as measured in the direction X or Y) of about 8 µm to about 25 although other suitable thickness may alternatively be utilized.

For example, as shown in FIG. 4, the metallization layer 320a includes a plurality of conductive vias 320v in the openings OP1 formed in the dielectric layer 310a and a plurality of conductive trenches 320t over an illustrated top surface (not labeled) of the dielectric layer 310a, where the conductive vias 320v are physically connected to and electrically connected to the conductive trenches 320t, respectively. In some embodiments, the conductive vias 320v are considered as vertical electrical structures extending along the vertical direction (e.g., the direction Z), and the conductive trenches 320t are considered as horizontal electrical structures extending along a horizontal direction (e.g., the direction X and/or Y, such in the X-Y plane).

In some embodiments, the seed layer material is patterned to form a seed layer 322a. In some embodiments, the seed layer material is patterned by using the metallization layer 320a as an etching mask to form the seed layer 322a. For example, the etching process may be a dry etching process, a wet etching process, or a combination thereof; the disclosure is not limited thereto. In other words, for example, in a vertical projection on the insulating encapsulation 200 (e.g. a vertical projection on the carrier 102 along the direction Z), the metallization layer 320a is completely overlapped with the seed layer 322a. In the embodiments of which the seed layer 322a presented, the metallization layer 320a is electrically coupled to the semiconductor dies 100A through physically connecting the seed layer 322a and the conductive vias 150 of the semiconductor dies 100A. In the case, the metallization layer 320a and the corresponding seed layer 322a together may be referred to as a redistribution layer, a redistribution wire, a routing layer, or routing wire of the redistribution circuit structure 300A. For example, the seed layer 322a includes a titanium layer and a copper layer over the titanium layer, where the titanium layer having a thickness (as measured in the direction Z) of about 500 Å, and the copper layer has a thickness (as measured in the direction Z) of about 3000 Å, although other suitable thickness may alternatively be utilized.

In the embodiments of which the seed layer 322a is omitted, the metallization layer 320a is electrically connected to the semiconductor dies 100A through physically connecting the conductive vias 320v of the metallization layer 320a and the conductive vias 150 of the semiconductor dies 100A. In the case, the metallization layer 320a itself may be referred to as a redistribution layer, a redistribution wire, a routing layer, or routing wire of the redistribution circuit structure 300A; the disclosure is not specifically limited thereto.

Figure 5:
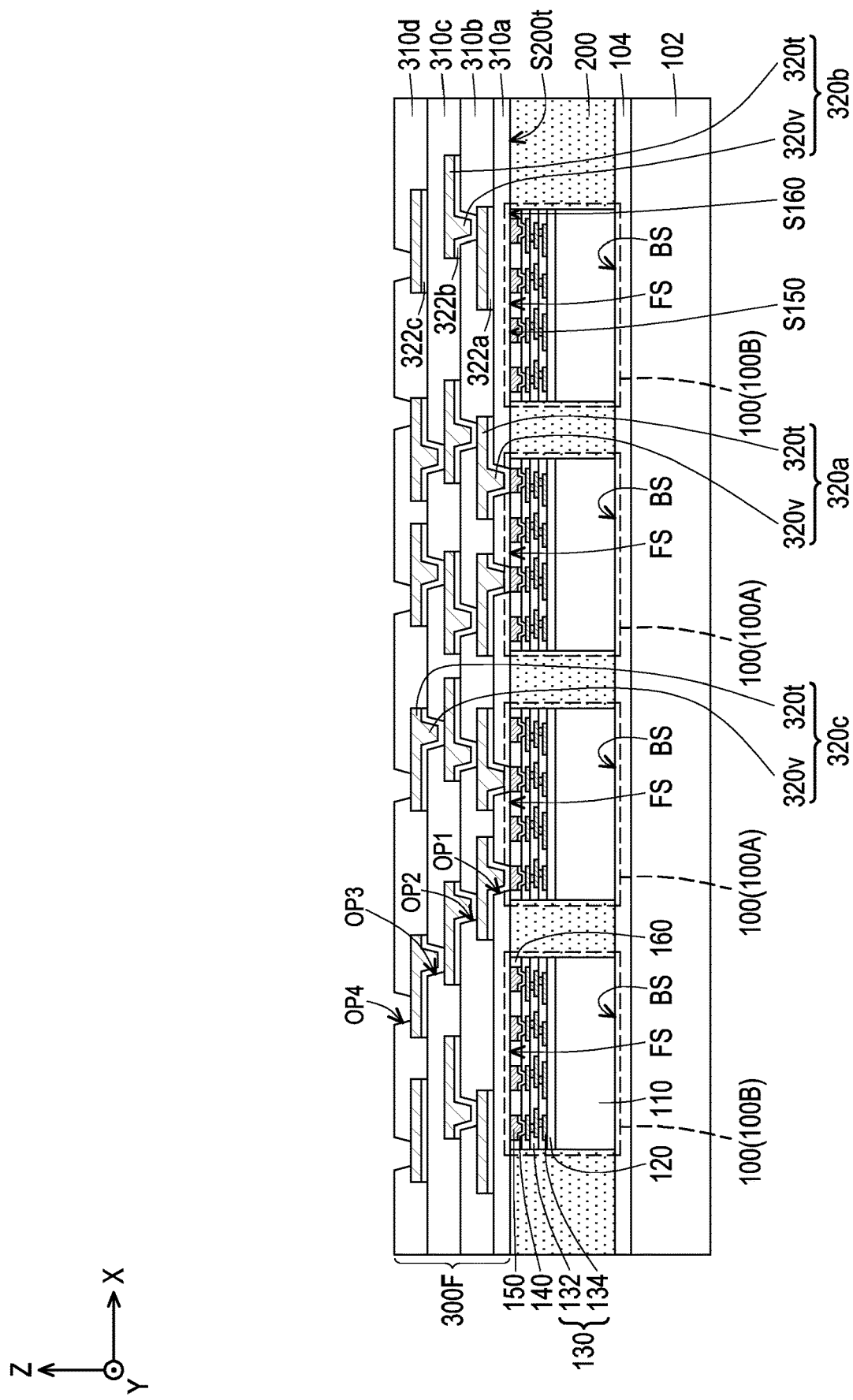

Referring to FIG. 5, in some embodiments, the dielectric layer 310b, the metallization layer 320b, the dielectric layer 310c, the metallization layer 320c, the dielectric layer 320d are sequentially formed over the metallization layer 320 and the dielectric layer 310a exposed by the metallization layer 320a. For example, the metallization layer 320b is electrically coupled to the metallization layer 320a exposed by a plurality of openings OP2 formed in the dielectric layer 310b, the metallization layer 320c is electrically coupled to the metallization layer 320b exposed by a plurality of openings OP3 formed in the dielectric layer 310c, and the metallization layer 320c is exposed by a plurality of openings OP4 formed in the dielectric layer 310d for further electrical connections. The formation and material of each of the dielectric layers 310b, 310c, and 310d are similar to or substantially identical to the formation and the material of the dielectric layer 310a, and the formation and material of each of the metallization layers 320b and 320c are similar to or substantially identical to the formation and the material of the metallization layer 320a, and thus are not repeated herein.

Similar to the dielectric layer 310a and the metallization layer 320a, a seed layer 322b is interposed between the dielectric layer 310b and the metallization layer 320b and a seed layer 322c interposed between the dielectric layer 310c and the metallization layer 320c. The formation and material of each of the seed layers 322b, 322c are substantially identical to or similar to the seed layer 322a previously described in FIG. 4, and thus are not repeated. In the embodiments of which the seed layers 322b, 322c presented, the metallization layer 320b is electrically coupled to the metallization layer 320a through physically connecting the seed layer 322b and the conductive trenches 320t of the metallization layer 320a, and the metallization layer 320c is electrically coupled to the metallization layer 320b through physically connecting the seed layer 322c and the conductive trenches 320t of the metallization layer 320b. In the case, the metallization layer 320b and the corresponding seed layer 322b together may be referred to as a redistribution layer, a redistribution wire, a routing layer, or routing wire of the redistribution circuit structure 300A, and the metallization layer 320c and the corresponding seed layer 322c together may be referred to as a redistribution layer, a redistribution wire, a routing layer, or routing wire of the redistribution circuit structure 300A. For example, the seed layer 322b and the seed layer 322c independently include a titanium layer and a copper layer over the titanium layer, where the titanium layer having a thickness (as measured in the direction Z) of about 500 Å, and the copper layer has a thickness (as measured in the direction Z) of about 3000 Å, although other suitable thickness may alternatively be utilized.

In the embodiments of which the seed layers 322b, 322c are omitted, the metallization layer 320b is electrically connected to the metallization layer 320a through physically connecting the conductive vias 320v of the metallization layer 320b and the conductive trenches 320t of the metallization layer 320a, and the metallization layer 320c is electrically connected to the metallization layer 320b through physically connecting the conductive vias 320v of the metallization layer 320c and the conductive trenches 320t of the metallization layer 320b. In the case, each of the metallization layers 320b and 320c itself may be referred to as a redistribution layer, a redistribution wire, a routing layer, or routing wire of the redistribution circuit structure 300A; the disclosure is not specifically limited thereto.

Figure 6:
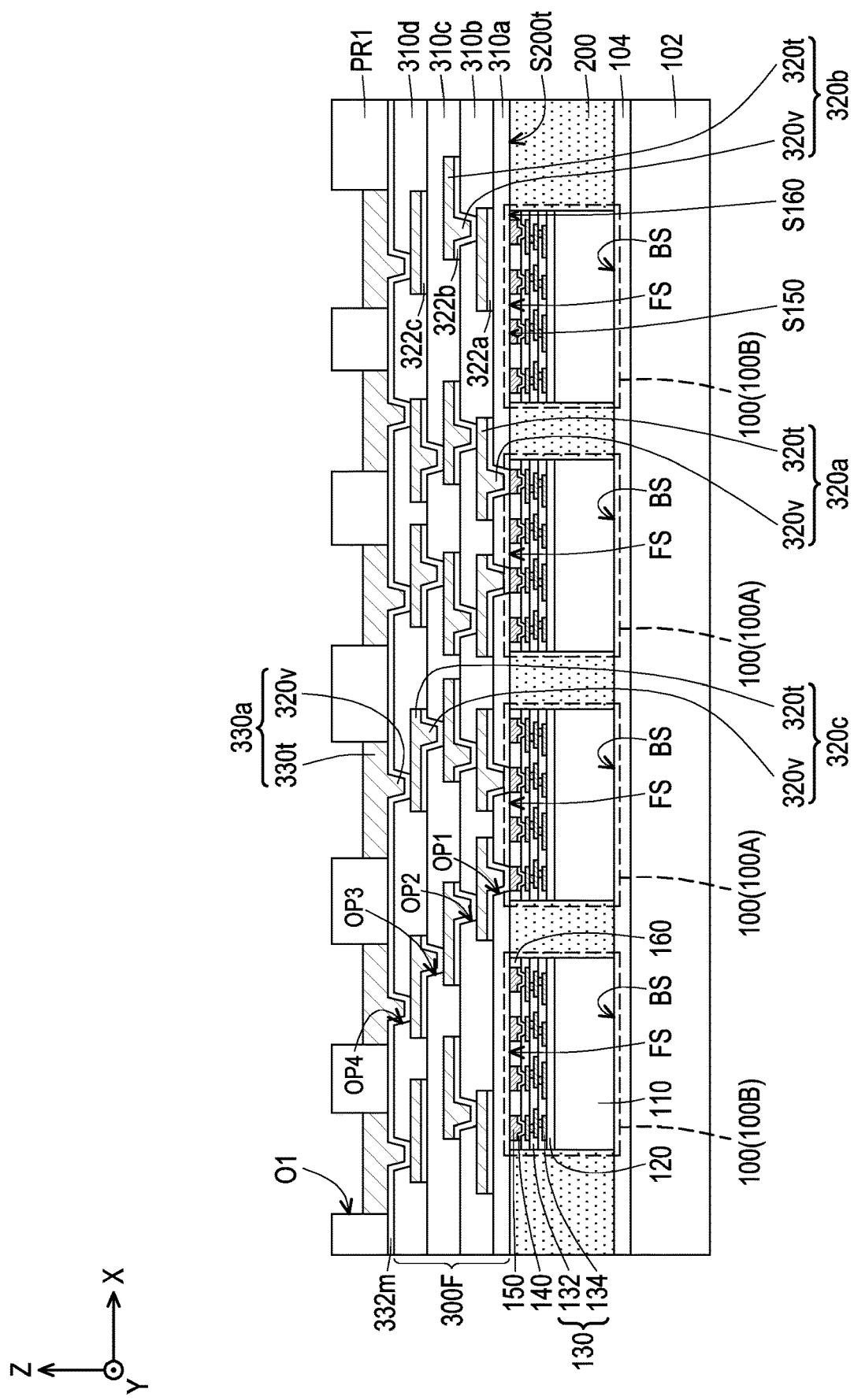

Referring to FIG. 6, in some embodiments, in some embodiments, a patterned photoresist layer PR1 is formed over the dielectric layer 320d, where the patterned photoresist layer PR1 includes at least one opening O1 overlapped with at least one of the openings OP4 formed in the dielectric layer 320d. In some embodiments, as shown in FIG. 6, a plurality of openings O1 are formed in the patterned photoresist layer PR1, where positioning locations of the openings O1 are corresponding to (e.g., overlapped with) positioning locations of the openings OP4, respectively. In one embodiment, the patterned photoresist layer PR1 may be formed by coating and photolithography processes or the like. The number of the openings O1 may, for example, correspond to the number of later-formed conductive structure(s) (such as the metallization layer 330a). However, the disclosure is not limited thereto. In some embodiments, a material of the patterned photoresist layer PR1, for example, includes a positive resist material or a negative resist material, that is suitable for a patterning process such as a photolithography process with a mask or a mask-less photolithography process (for instance, an electron-beam (e-beam) writing or an ion-beam writing).

Prior to the formation of the patterned photoresist layer PR1, for example, an additional seed layer material 332m is optionally formed over the dielectric layer 310d. In some embodiments, the additional seed layer material 332m is formed on the dielectric layer 310b and extends into the openings OP4 formed in the dielectric layer 310d to physically contact the metallization layer 320c exposed by the openings OP4. In other words, the additional seed layer material 332m penetrates through the dielectric layer 310d, and sidewalls and bottoms of the openings OP4 are completely covered by the additional seed layer material 332m. The formation and material of the additional seed layer material 332m are substantially identical or similar to the formation and material of the seed layer material previous discussed in FIG. 4, and thus are not repeated herein for brevity. In the embodiments of the additional seed layer material 332m is presented, portions of the additional seed layer material 332m overlapped with the openings OP4 are exposed by the openings O1 formed in the patterned photoresist layer PR1, respectively.

Continued on FIG. 6, in some embodiments, the metallization layer 330a is formed in the openings O1. For example, as shown in FIG. 6, the metallization layer 330a includes a plurality of conductive vias 320v in the openings OP4 formed in the dielectric layer 310d and a plurality of conductive trenches 330t over an illustrated top surface (not labeled) of the dielectric layer 310d, where the conductive vias 320v are physically connected to and electrically connected to the conductive trenches 330t, respectively. In some embodiments, the conductive vias 320v are considered as vertical electrical structures extending along the vertical direction (e.g., the direction Z), and the conductive trenches 330t are considered as horizontal electrical structures extending along a horizontal direction (e.g., the direction X and/or Y, such in the X-Y plane). The metallization layer 330a may formed by, but not limited to, depositing a conductive material (not shown) into the openings O1 formed in the patterned photoresist layer PR1 to form the metallization layer 330a.

In one embodiment, the metallization layer 330a may be made of conductive materials formed by plating process (e.g., electroplating or electroless plating), such as copper, copper alloy, aluminum, aluminum alloy, combinations thereof or any suitable material, which may be formed by plating process. In some embodiments, the metallization layer 330a may be patterned copper layers or other suitable patterned metal layers. The conductive trenches 330t independently may have a thickness T330t (as measured in the direction Z) of about 10 µm to about 20 µm, although other suitable thickness may alternatively be utilized. The conductive trenches 330t independently may have a line width (as measured in the direction X or Y) of about 10 µm to about 20 µm, although other suitable thickness may alternatively be utilized. The conductive trenches 330t independently may have a spacing (as measured in the direction X or Y) of about 20 µm to about 40 µm, although other suitable thickness may alternatively be utilized.

Figure 7:
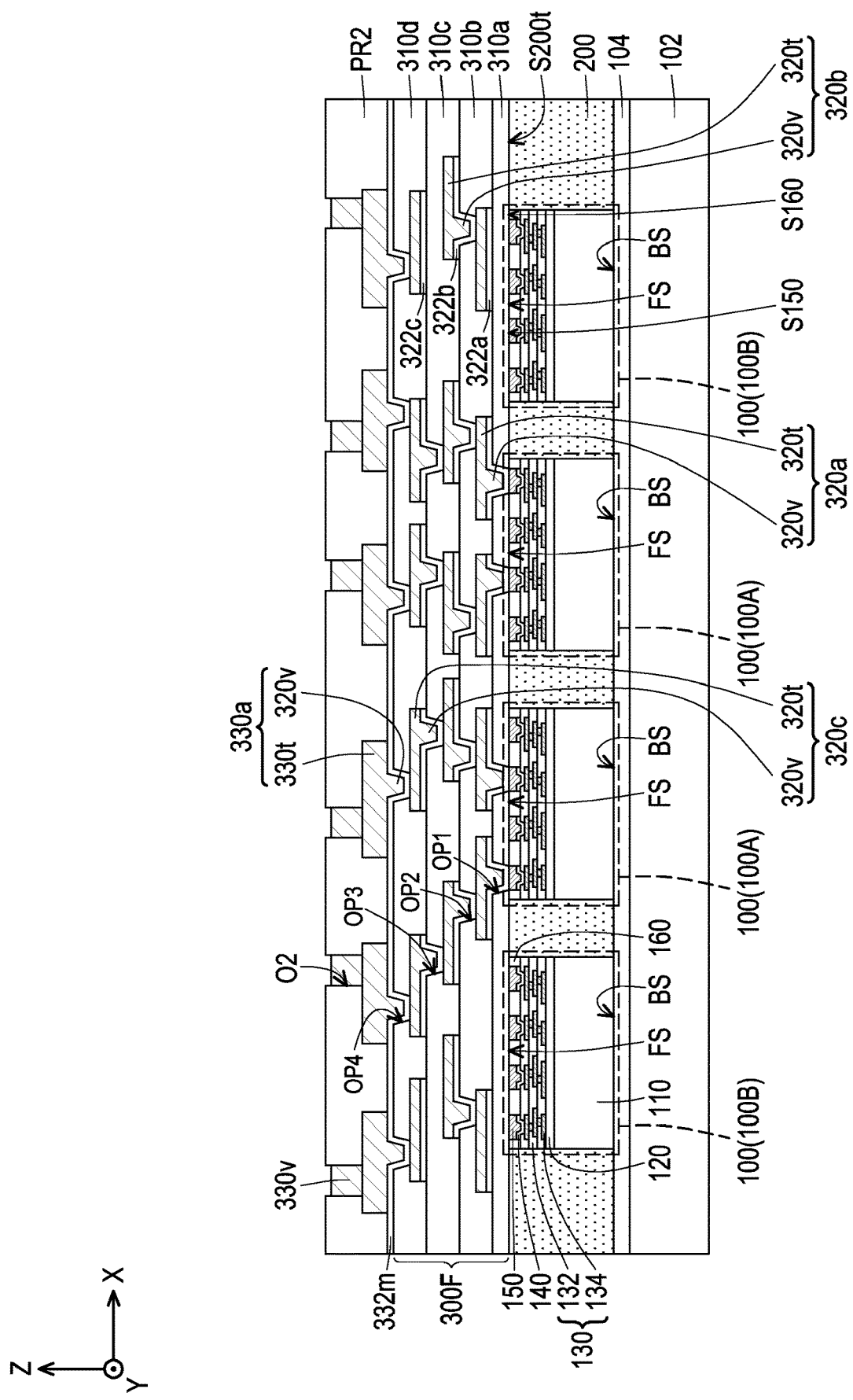

Referring to FIG. 6 and FIG. 7, in some embodiments, the patterned photoresist layer PR1 is removed, and a patterned photoresist layer PR2 is then formed over the metallization layer 330a. The patterned photoresist layer PR1 may be removed and/or stripped through, for example, etching, ashing, or other suitable removal processes. The disclosure is not limited thereto. In some embodiments, as shown in FIG. 7, a plurality of openings O2 are formed in the patterned photoresist layer PR2, where the conductive trenches 330t of the metallization layer 330a are partially exposed by the openings O2. The formation and material of the patterned photoresist layer PR2 are similar to or substantially equal to the formation and material of the patterned photoresist layer PR1 described in FIG. 6, and thus are not repeated herein for brevity.

In some embodiments, the conductive vias 330v are formed in the openings O2. For example, the conductive vias 330v are considered as vertical electrical structures extending along the vertical direction (e.g., the direction Z). The conductive vias 330v may formed by, but not limited to, deposing a conductive material (not shown) into the openings O2 formed in the patterned photoresist layer PR2 to form the conductive vias 330v by plating process, where the exposed portions of the conductive trenches 330t of the metallization layer 330a is used as a seed layer during the plating process. The conductive vias 330v may be made of conductive materials formed by plating process (e.g., electroplating or electroless plating), such as copper, copper alloy, aluminum, aluminum alloy, combinations thereof or any suitable material, which may be formed by plating process. The conductive vias 330v independently may have a thickness (as measured in the direction Z) of about 20 µm to about 40 µm, although other suitable thickness may alternatively be utilized. The conductive vias 330v independently may have a line width (as measured in the direction X or Y) of about 30 µm to about 50 µm, although other suitable thickness may alternatively be utilized. The conductive vias 330v independently may have a spacing (as measured in the direction X or Y) of about 15 µm to about 30 µm, although other suitable thickness may alternatively be utilized.

After forming the conductive vias 330v, the patterned photoresist layer PR2 is removed, for example. The patterned photoresist layer PR2 may be removed and/or stripped through, for example, etching, ashing, or other suitable removal processes. The disclosure is not limited thereto. In the embodiments of which the additional seed layer material 332m is included, portions of the additional seed layer material 332m not being covered by the conductive vias 330v and the conductive trenches 330t are removed to render an additional seed layer 332a. For example, the removal process may include a dry etching process, a wet etching process, or a combination thereof; the disclosure is not limited thereto. In other words, for example, in the vertical projection on the insulating encapsulation 200 (e.g. the vertical projection on the carrier 102 along the direction Z), the conductive trenches 330t is completely overlapped with the additional seed layer 332a. In the embodiments of which the additional seed layer 332a presented, the metallization layer 330a is electrically coupled to the metallization layer 330c through physically connecting the additional seed layer 332a and the conductive trenches 320t of the metallization layer 320c. In the case, the metallization layer 330a and the corresponding additional seed layer 332a together may be referred to as a redistribution layer, a redistribution wire, a routing layer, or routing wire of the redistribution circuit structure 300A. For example, the additional seed layer 332a includes a titanium layer and a copper layer over the titanium layer, where the titanium layer having a thickness (as measured in the direction Z) of about 500 Å, and the copper layer has a thickness (as measured in the direction Z) of about 3000 Å, although other suitable thickness may alternatively be utilized.

In the embodiments of which the additional seed layer 332a is omitted, the metallization layer 330a is electrically connected to the metallization layer 320c through physically connecting the conductive vias 320v of the metallization layer 330a and the conductive trenches 320t of the metallization layer 320c. In the case, the metallization layer 330a itself may be referred to as a redistribution layer, a redistribution wire, a routing layer, or routing wire of the redistribution circuit structure 300A; the disclosure is not specifically limited thereto.

Figure 8:
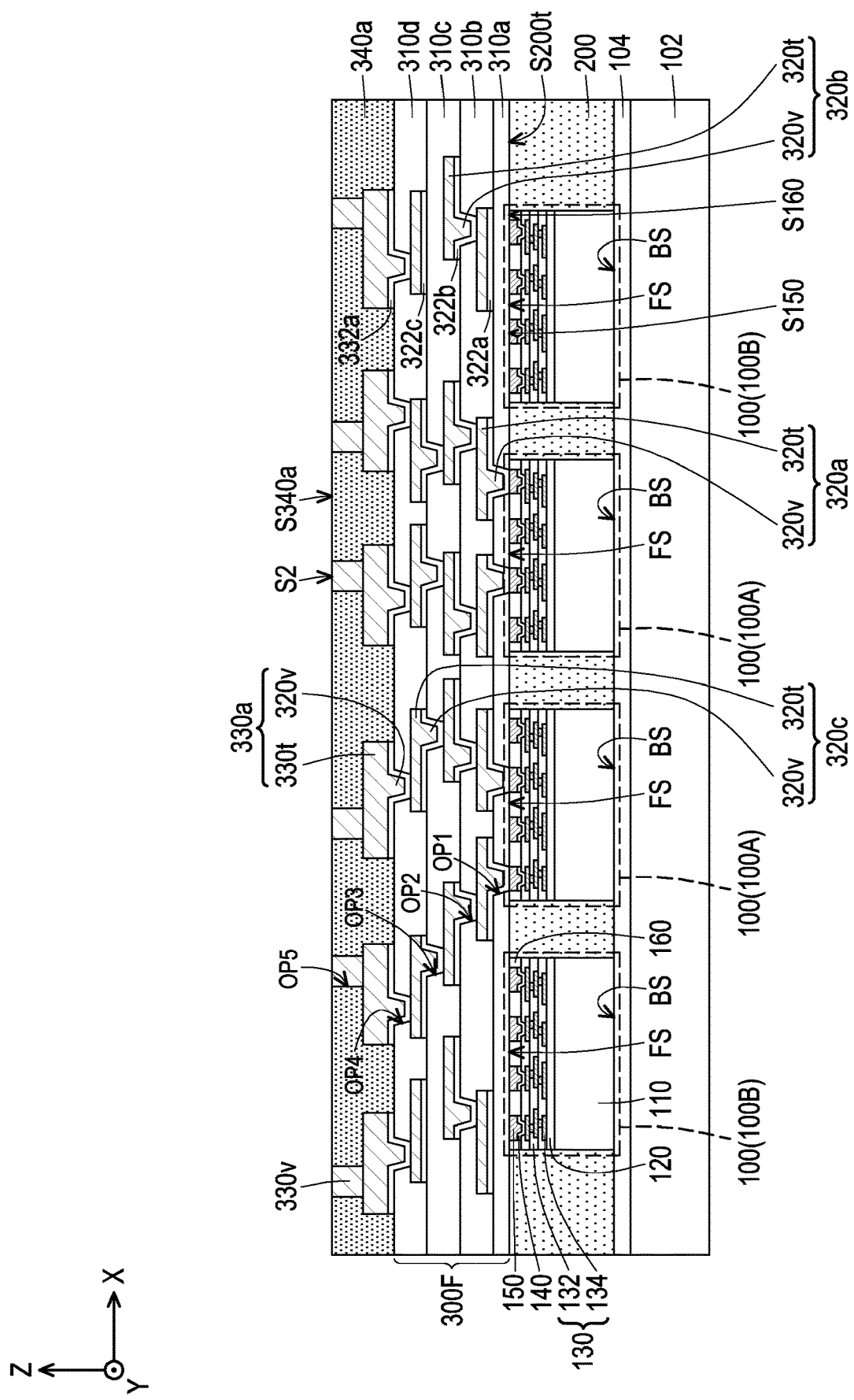

Referring to FIG. 8, in some embodiments, the dielectric layer 340a is formed over the dielectric layer 310d to laterally cover the conductive vias 330. As shown in FIG. 8, a surface S340a of the dielectric layer 340a is substantially leveled with surfaces S2 of the conductive vias 330v, for example. In some embodiments, the surface S340a of the dielectric layer 340a is substantially coplanar to the surfaces S2 of the conductive vias 330v. As shown in FIG. 8, the surface S340a of the dielectric layer 340a, for example, provides a high degree of coplanarity and flatness. Due to the high degree of coplanarity and flatness in the surface S340a of the dielectric layer 340a, the formation of the later-formed layer(s) and/or element(s) is beneficial, such as a process window of a pick-and-place process for a semiconductor die is enlarged.

The dielectric layer 340a may be formed by, but not limited to, forming a blanket of a dielectric material over the conductive vias 330v, and planarizing the dielectric material blanket to form the dielectric layer 340a exposing the conductive vias 330v. For example, the dielectric material blanket is a pre-formed dielectric material blanket layer, which can be formed on the conductive vias 330v through lamination. In some embodiments, a material (e.g., the dielectric material) of the dielectric material blanket includes a molding compound or a polymer-based resin. The molding compound, for example, includes epoxy resin, hardener resin, a suitable resin, or the like. The polymer-based resin, for example, includes PI, acrylate polymer, epoxy polymer, a suitable polymer, or the like. In some embodiments, the dielectric material blanket may further include a filler. The filler, for example, includes $SiO_2$, $Al_2O_3$, AlN, diamond, BN, a suitable inorganic filler, or a combination thereof.

In some embodiments, the dielectric material blanket is planarized by a mechanical grinding process, a CMP process, an etching process, or combinations thereof. The etching process may include a dry etching, a wet etching, or a combination thereof. During the planarizing process of the dielectric material blanket, portions of the conductive vias 330v may be slightly planarized as well. After the planarizing process, a cleaning process may be optionally performed, for example to clean and remove the residue generated from the planarizing process. However, the disclosure is not limited thereto, and the planarizing process may be performed through any other suitable method.

Referring to FIG. 9, in some embodiments, the conductive trenches 330t of the metallization layer 330b, the conductive vias 330v of the metallization layer 330c, the dielectric layer 340b, the conductive trenches 330t of the metallization layer 330c, and the dielectric layer 350 are sequentially formed over the dielectric layer 340a. For example, the metallization layer 330b is electrically coupled to the metallization layer 330a exposed by a plurality of openings OP5 formed in the dielectric layer 340a, the metallization layer 330c is electrically coupled to the metallization layer 330b exposed by a plurality of openings OP6 formed in the dielectric layer 340b, and the metallization layer 330c is exposed by a plurality of openings OP7 formed in the dielectric layer 350 for further electrical connections. The dielectric layer 350 may have a thickness T350 (as measured in the direction Z) of about 15 µm to about 30 µm, although other suitable thickness may alternatively be utilized. The openings OP7 independently may have a critical dimension CD in a width W0 (as measured in the direction X or Y) of about 200 µm to about 350 µm, although other suitable thickness may alternatively be utilized. The formation and material of each of the conductive vias 330v, the conductive trenches 330t and the dielectric layer 340b have been described in FIG. 6 and FIG. 7, the formation and material of the dielectric layer 340b are similar to or substantially identical to the formation and the material of the dielectric layer 340a described in FIG. 8, the formation and material of the dielectric layer 350 are similar to or substantially identical to the formation and the material of the dielectric layer 310a described in FIG. 4, and thus are not repeated herein.

Similarly, an additional seed layer 332b is interposed between the dielectric layer 340a and the conductive trenches 330t of the metallization layer 330b and an additional seed layer 332c is interposed between the dielectric layer 340b and the metallization layer 330c. The formation and material of each of the additional seed layers 332a, 332b, 332c are substantially identical to or similar to the seed layer 322a previously described in FIG. 4, and thus are not repeated. In the embodiments of which the additional seed layers 332b, 332c presented, the conductive vias 330v of the metallization layer 330b is electrically coupled to the conductive trenches 330t of the metallization layer 330b through the additional seed layer 332b, and the conductive vias 330v of the metallization layer 330c is electrically coupled to the conductive trenches 330t of the metallization layer 330c through the additional seed layer 332c. In the case, the metallization layer 330b and the corresponding additional seed layer 332b together may be referred to as a redistribution layer, a redistribution wire, a routing layer, or routing wire of the redistribution circuit structure 300A, and the metallization layer 330c and the corresponding additional seed layer 332c together may be referred to as a redistribution layer, a redistribution wire, a routing layer, or routing wire of the redistribution circuit structure 300A. For example, the additional seed layer 332b and the additional seed layer 332b independently include a titanium layer and a copper layer over the titanium layer, where the titanium layer having a thickness (as measured in the direction Z) of about 1000 Å, and the copper layer has a thickness (as measured in the direction Z) of about 5000 Å, although other suitable thickness may alternatively be utilized.

In the embodiments of which the additional seed layers 332b, 332c are omitted, the conductive vias 330v of the metallization layer 330b is electrically coupled to the conductive trenches 330t of the metallization layer 330b through a physical contact therebetween, and the conductive vias 330v of the metallization layer 330c is electrically coupled to the conductive trenches 330t of the metallization layer 330c through a physical contact therebetween. In the case, each of the metallization layers 330b and 330c itself may be referred to as a redistribution layer, a redistribution wire, a routing layer, or routing wire of the redistribution circuit structure 300A; the disclosure is not specifically limited thereto.

Up to here, the redistribution circuit structure 300A is manufactured, where the conductive vias 320v, the conductive trenches 320t, and a dielectric structure (e.g., including the dielectric layers 320a through 320d) surrounding thereto together constitute a fine-featured portion 300F of the redistribution circuit structure 300A, and the conductive vias 330v, the conductive trenches 330t, and a dielectric structure (e.g., including the dielectric layers 340a through 340b and the dielectric layer 350) surrounding thereto together constitute a coarse-featured portion 300C of the redistribution circuit structure 300A.

Referring to FIG. 10, in some embodiments, a seed layer material 410m is formed over the redistribution circuit structure 300A. In some embodiments, the seed layer material 410m is formed on the dielectric layer 350 and extends into the openings OP7 formed in the dielectric layer 350 to physically contact the conductive trenches 330t of the metallization layer 330c exposed by the openings OP7. In other words, the seed layer material 410m penetrates through the dielectric layer 350, and sidewalls and bottoms of the openings OP7 are completely covered by the seed layer material 410m. In some embodiments, the seed layer material 410m is formed over the dielectric layer 410m in a manner of a blanket layer made of metal or metal alloy materials, the disclosure is not limited thereto. In some embodiments, the seed layer material 410m are referred to as a metal layer, which may be a single layer or a composite layer comprising a plurality of sub-layers formed of different materials. In some embodiments, the seed layer material 410m include titanium, copper, molybdenum, tungsten, titanium nitride, titanium tungsten, combinations thereof, or the like. The seed layer material 410m may be formed using, for example, sputtering, PVD, or the like. In some embodiments, the seed layer material 410m may be conformally formed on the dielectric layer 350 by sputtering, and in contact with the dielectric layer 350 and the conductive trenches 330t of the metallization layer 330c exposed by the openings OP7.

For example, the seed layer material 410m includes a first sub-layer (not shown) and a second sub-layer (not shown) disposed on the first sub-layer, where the first sub-layer is disposed between the dielectric layer 350 and the second sub-layer. In some embodiments, the first sub-layer include a titanium layer, where the first sub-layer has a thickness (as measured in the direction Z) of about 500 Å to about 1500 Å, although other suitable thickness may alternatively be utilized. In some embodiments, the second sub-layer includes a copper layer, where the second sub-layer has a thickness (as measured in the direction Z) of about 2000 Å to about 7000 Å, although other suitable thickness may alternatively be utilized.

After forming the seed layer material 410m, a patterned photoresist layer PR3 is then formed over the seed layer material 410m, for example. In some embodiments, as shown in FIG. 10, a plurality of openings O3 are formed in the patterned photoresist layer PR3, where portions of the seed layer material 410m are partially exposed by the openings O3. The formation and material of the patterned photoresist layer PR3 are similar to or substantially equal to the formation and material of the patterned photoresist layer PR1 described in FIG. 6, and thus are not repeated herein for brevity. For example, positioning locations of the openings O3 formed in the patterned photoresist layer PR3 are corresponding to (e.g., overlapped with) positioning locations of the openings OP7 formed in the dielectric layer 350, respectively, as shown in FIG. 10.

Referring to FIG. 11, in some embodiment, a plurality of UBMs 420 and a capping material 430m are sequentially formed in the openings O3 formed in the patterned photoresist layer PR3. For example, the UBMs 420 are disposed on (e.g., in physical contact with) the seed layer material 410m and further extended into the openings OP7 formed in the dielectric layer 350, where the openings OP7 formed in the dielectric layer 350 are filled with the UBMs 420, and each of the UBMs 420 includes a recess R1, as shown in FIG. 11. That is, illustrated top surfaces of the UBMs 420 are not planar, for example. For example, positioning locations of the recesses R1 included in the UBMs 420 are corresponding to (e.g., overlapped with) the positioning locations of the openings OP7 formed in the dielectric layer 350, respectively, as shown in FIG. 11. In the case, the capping material 430m is conformally disposed on and in physical contact with the UBMs 420, and further extended into the recesses R1 formed in the UBMs 420, where the recesses R1 formed in the UBMs 420 are partially filled with the capping material 430m.

The UBMs 420 each may be a metal layer, which may include a single layer or a composite layer comprising a plurality of sub-layers formed of different materials. In some embodiments, the material of the UBMs 420 includes copper, nickel, titanium, molybdenum, tungsten, titanium nitride, titanium tungsten, or alloys thereof or the like, and may be formed by an electroplating process, for example. The UBMs 420 each may include titanium layer and a copper layer over the titanium layer. In some embodiments, the UBMs 420 are formed using, for example, sputtering, PVD, or the like. The shape and number of the UBMs 420 are not limited in this disclosure. For example, the UBMs 420 are made of Cu.

The capping material 430m may be a single layer made of a lead-free (LF) material, such as Sn—Ag, Sn—Cu, Sn—Ag—Cu, or the like, which can be formed by plating or any suitable forming technique. For example, the capping material 430m are made of Sn—Ag, where a weight percentage (wt %) of Ag included in Sn—Ag is about 0.5 wt % to about 3 wt % and a weight percentage of Sn included in Sn—Ag is about 97 wt % to about 99.5 wt %. As shown in FIG. 11 and FIG. 13, for example, the topography of the UBMs 420 is adopted by the capping material 430m, where an illustrated top surface S430mt of the capping material 430m is not planar.

After forming the capping material 430m, the patterned photoresist layer PR3 is removed, for example. The patterned photoresist layer PR3 may be removed and/or stripped through, for example, etching, ashing, or other suitable removal processes. The disclosure is not limited thereto.

Referring to FIG. 12, in some embodiments, the seed layer material 410m is patterned to form a seed layer 410. In some embodiments, the seed layer material 410m is patterned by using the UBMs 420 and the capping material 430m as an etching mask to form the seed layer 410. For example, the etching process may be a dry etching process, a wet etching process, or a combination thereof; the disclosure is not limited thereto. For example, in the vertical projection on the insulating encapsulation 200 (e.g. the vertical projection on the carrier 102 along the direction Z), the UBMs 420 and the capping material 430m are completely overlapped with the seed layer 410. Thereafter, a reflowing process is performed, where the capping material 430m is reflowed and then transformed into capping layers (or structures) 430 filling the recesses R1 formed in the UBMs 420, as shown in FIG. 12 and FIG. 14, for example. In some embodiments, for the formation of each terminal 400A, during the reflowing process (e.g., a heating process), a portion of the capping material 430m at a periphery region of the capping material 430m flows towards a center region of the capping material 430m to fill up the recess R1, and thus obtains a resulting structure, the capping layer 430 with a substantially planar top surface. In some embodiments, the capping layers 430 are electrically coupled to the seed layer 410 through the UBMs 420, and the capping layers 430 are electrically coupled to the redistribution circuit structure 300A through the seed layer 410 and the UBMs 420. The seed layer 410, the UBMs 420 and the capping layers 430 are together referred to as terminals (or conductive terminal) 400A of the semiconductor structure 10. The terminals 400A independently may have a width W400 (as measured in the direction X or Y) of about 400 µm to about 600 µm, although other suitable thickness may alternatively be utilized. Up to here, the semiconductor structure 10 is manufactured. In some embodiments, at least some of the terminals 400A are electrically coupled to the semiconductor dies 100A through the redistribution circuit structure 300A. In one embodiment, the terminals 400A is electrically isolated from the dummy dies 100B. In an alternative embodiment, the terminals 400A is electrically coupled to the dummy dies 100B through the redistribution circuit structure 300A, where the dummy dies 100B are electrically isolated from the semiconductor dies 100A. That is, the dummy dies 100B may be electrically grounded or electrically floating.

Referring to FIGS. 12 and 14, in some embodiments, the openings O7 each has a thickness T1 (or height, as measured along the direction Z) of about 15 µm to about 30 µm, although other suitable thickness may alternatively be utilized. For example, an angle θ1 between the sidewall of one opening OP7 and an illustrated top surface (not labeled) of the conductive trench 330t of the metallization layer 330c covering by the dielectric layer 350 is approximately ranging from 60 degrees to 90 degrees. In some embodiments, each of the UBMs 420 has a first via portion (not labeled) disposed in a respective one opening OP7 and a first line portion (not labeled) disposed over the dielectric layer 350, where the first via portion has a first bottom opening with a width W1 (as measured in the direction X or Y) of about 200 µm to about 350 µm and a first top opening with a width W2 (as measured in the direction X or Y) of about 215 µm to about 365 µm, and the first line portion has a thickness T2 (as measured in the direction Z) of about 10 µm to about 20 µm, although other suitable thickness may alternatively be utilized. The width W1 is less than the width W2, for example, as shown in FIG. 14. For example, an angle θ2 between the sidewall of a respective one recess R1 (denoted in FIG. 11 and FIG. 13) and a plane parallel to an illustrated top surface S350 of the dielectric layer 350 is approximately ranging from 60 degrees to 90 degrees. For example, an angle θ3 between the sidewall of a respective one UBM 420 and a plane parallel to the illustrated top surface S350 of the dielectric layer 350 (not covering by the respective one UMB 420) is approximately ranging from 60 degrees to 90 degrees. In some embodiments, each of the capping layers 430 has a second via portion (not labeled) disposed in a respective recess R1 and a second line portion (not labeled) disposed over the second via portion, where the second via portion has a second bottom opening with a width W3 (as measured in the direction X or Y) of about 175 µm to about 340 µm and a second top opening with a width W4 (as measured in the direction X or Y) of about 190 µm to about 355 µm, the second via portion has a thickness T430v (as measured in the direction Z) of about 15 µm to about 30 µm, and the line portion has a thickness T430t (as measured in the direction Z) of about 0.3 µm to about 3 µm, although other suitable thickness may alternatively be utilized. The width W3 is less than the width W4, for example, as shown in FIG. 14. As shown in FIG. 12 and FIG. 14, illustrated top surfaces (e.g., S430t in FIG. 14) of the terminals 400A includes substantially planar surface, in some embodiments. Owing to the configuration of the terminals 400A (e.g., planar top surfaces S430t), a void (e.g., air voids) can be greatly suppressed or eliminated from an joint after bonding the semiconductor structure 10 and an additional semiconductor package or structure, thereby improving the performance of the semiconductor structure 10 bonded with the additional semiconductor package or structure. Thus, the reliability of the semiconductor structure 10 bonded with the additional semiconductor package or structure is enhanced.

In the embodiments of which the terminals 400A are included in the semiconductor structure 100, the sidewalls SW420 of the UBMs 420 and the sidewalls SW430 of the capping layers 430 are aligned to each other, where the sidewalls SW420 of the UBMs 420 are free of the capping layers 430, see FIG. 12 and FIG. 14. However, the disclosure is not limited thereto; alternatively, the terminals 400A may be substituted by terminals 400B depicted in FIG. 15. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. In some embodiments, for the terminals 400B, the sidewalls SW420 of the UBMs 420 and the sidewalls SW430 of the capping layers 430 are aligned to each other, and the sidewalls SW420 of the UBMs 420 are at least partially covered by extending portions 432. For example, the extending portions 432 are simultaneously formed with the capping layers 430 during the reflowing process for forming the capping layers 430, as a part of the lead-free material 430m included in the capping material 430m further extends onto the sidewalls SW420 of the UMBs 420. In some embodiments, the extending portions 432 are considered as a part of the capping layers 430. In some embodiments, the extending portions 432 each have a width W6 (as measured in the direction X or Y) of about 0.1 µm to about 0.5 µm, although other suitable thickness may alternatively be utilized.

In the embodiments of which the terminals 400A are included in the semiconductor structure 100, the sidewalls SW420 of the UBMs 420 are continuously vertical and planar sidewalls, where the sidewalls of the seed layer 410, the sidewalls of a respective one UBM 420, and the sidewalls of a respective one capping layer 430 are aligned with each other. However, the disclosure is not limited thereto; alternatively, the terminals 400A may be substituted by terminals 400C depicted in FIG. 16, where in the terminals 400C, the UBMs 420' are adopted to substitute the UBMs 420, where the UBMs 420' each have non-continuously vertical and planar sidewalls. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. In some embodiments, each sidewall SW420' of the UBMs 420' included in the terminals 400C has a vertical sidewall SW1 and a slant sidewall SW2 connected to the vertical sidewall SW1, where the vertical sidewall SW1 connects the slant sidewall SW2 and the sidewall SW430 of the respective one capping layer 430, and the slant sidewalls SW2 connects the vertical sidewall SW1 and the sidewall SW410 of the respective one seed layer 410. In some embodiments, a distance W5a (as measured in the direction X or Y) between the vertical sidewall SW1 and the sidewall SW410 of the respective one seed layer 410 of about 1 μm to about 10 μm, although other suitable thickness may alternatively be utilized.

Similarly, the sidewalls SW420' of the UBMs 420' may be further covered by the capping layers 430, such as the extending portions 432, see terminals 400D as shown in FIG. 17. The details of the extending portions 432 have been described in FIG. 15, and thus are not repeated herein for brevity.

Figure 18:
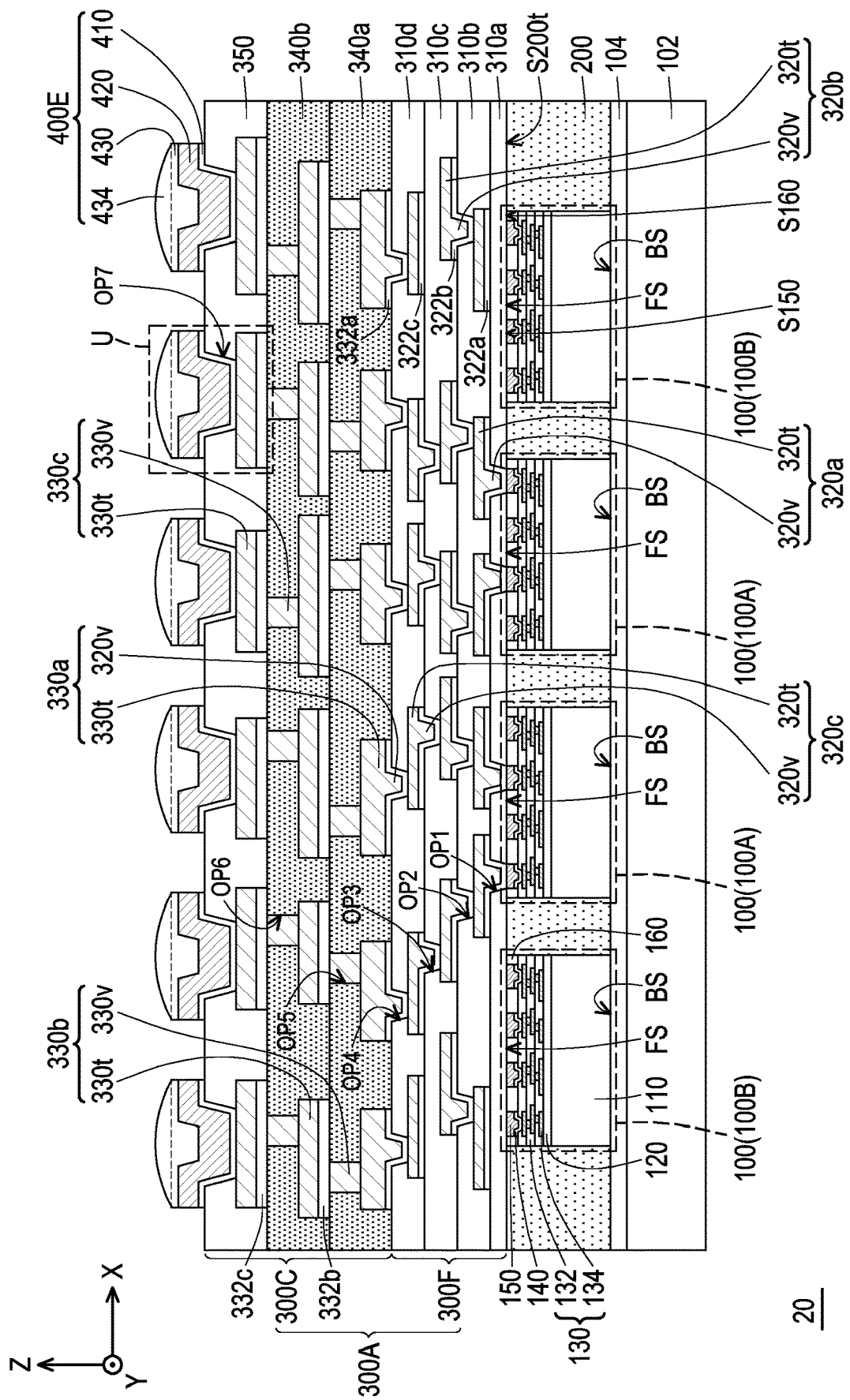
FIG. 18 is a schematic cross-sectional view of a semiconductor structure in accordance with some embodiments of the disclosure.
Figure 19:
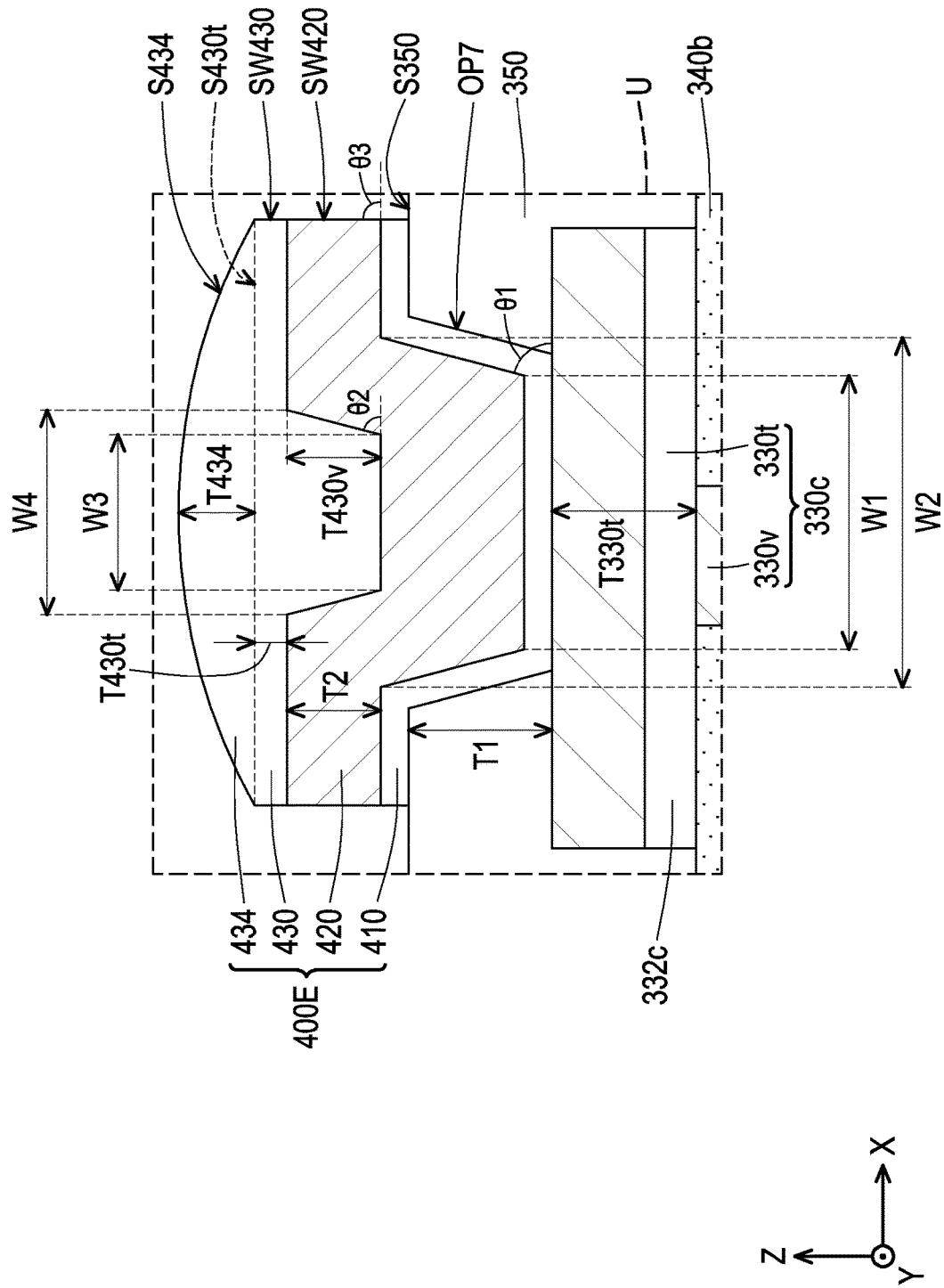
FIG. 19 through FIG. 22 are schematic cross-sectional views respectively showing various embodiments of terminals included in a semiconductor structure in accordance with alternative embodiments of the disclosure.

FIG. 18 is a schematic cross-sectional view of a semiconductor structure 20 in accordance with some embodiments of the disclosure. FIG. 19 through FIG. 22 are schematic cross-sectional views respectively showing various embodiments of terminals included in a semiconductor structure in accordance with alternative embodiments of the disclosure, where the enlarged and schematic cross-sectional views of FIG. 19 through FIG. 22 are outlined in a dashed box U as shown in FIG. 18. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 12 and FIG. 18 together, the semiconductor structure 10 depicted in FIG. 12 and the semiconductor structure 20 depicted in FIG. 18 are similar; the difference is that, the semiconductor structure 20 includes a plurality of terminals 400E instead of the terminals 400A. In such embodiment of the semiconductor structure 20, for each of the terminals 400E, a dome portion 434 is disposed on the capping layer 430, where the capping layer 430 is interposed between the dome portion 434 and the UBM 420. As shown in FIG. 18 and FIG. 19, the dome portions 434 each has a curved top surface S434, such as a convex surface with respect to the illustrated top surface S350 of the dielectric layer 350, in some embodiments. For example, the dome portions 434 are simultaneously formed with the capping layers 430 during the reflowing process for forming the capping layers 430, as a part of the lead-free material 430m included in the capping material 430m is formed into the dome portion 434 due to its cohesive force. In some embodiments, the dome portions 434 are considered as a part of the capping layers 430. In the case, for the formation of each terminal 400E, during the reflowing process (e.g., a heating process), a portion of the capping material 430m at a periphery region of the capping material 430m flows towards a center region of the capping material 430m to not only fill up the recess R1 but also have an excess amount of the capping material 430m at the center region, and thus obtains a resulting structure, the capping layer 430 with a convex top surface (e.g., the dome portion 434). In some embodiments, the dome portions 434 each have a thickness T434 (as measured in the direction Z) being greater than 0 μm and being less than or substantially equal to about 10 μm, although other suitable thickness may alternatively be utilized. Owing to the configuration of the terminals 400E (e.g., with the dome portion 434 having the thickness less than or substantially equal about 10 μm), a void (e.g., air voids) can be greatly suppressed or eliminated from an joint after bonding the semiconductor structure 20 and an additional semiconductor package or structure, thereby improving the performance of the semiconductor structure 20 bonded with the additional semiconductor package or structure. Thus, the reliability of the semiconductor structure 20 bonded with the additional semiconductor package or structure is enhanced.

Figure 20:
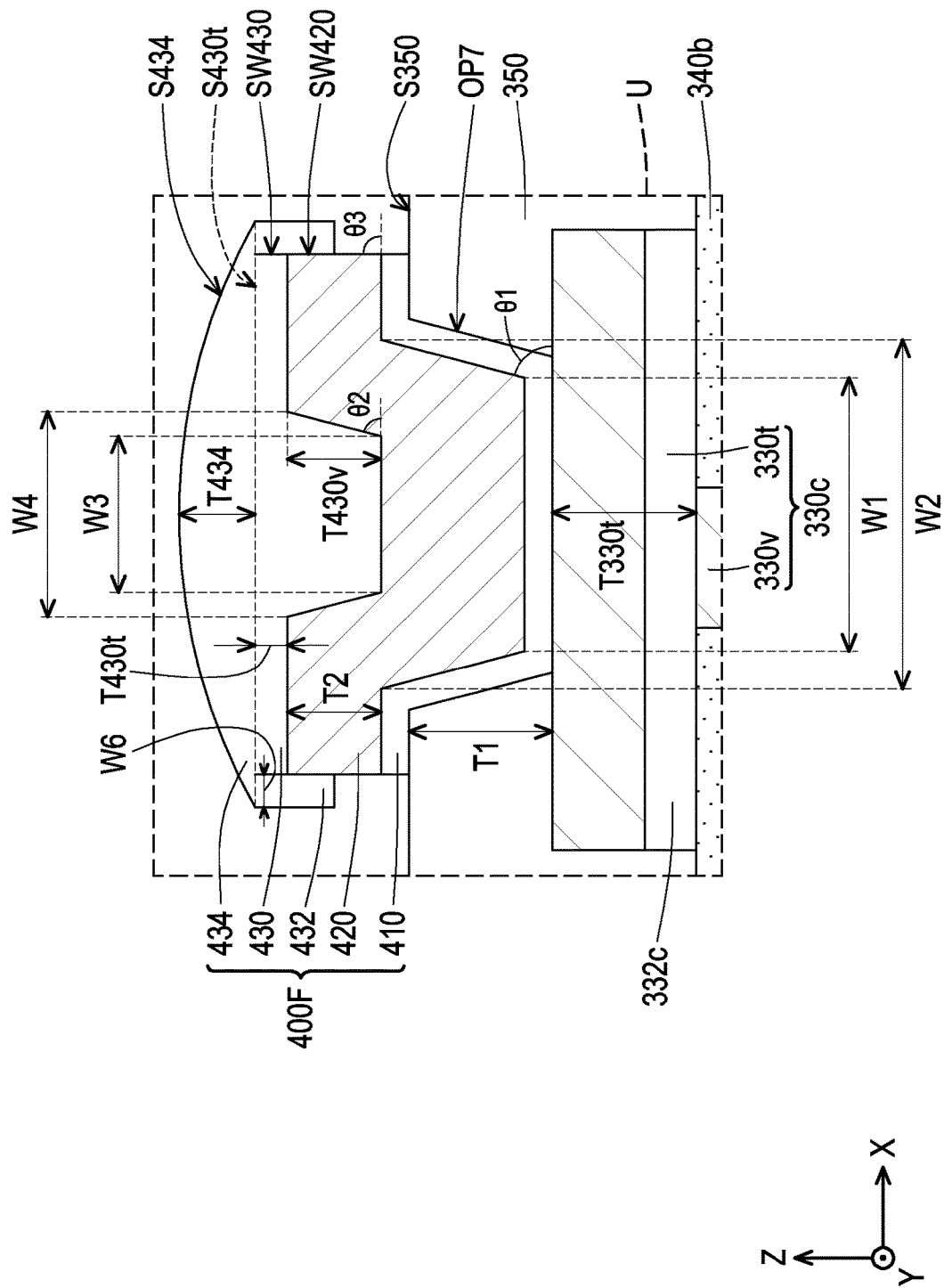
Figure 21:
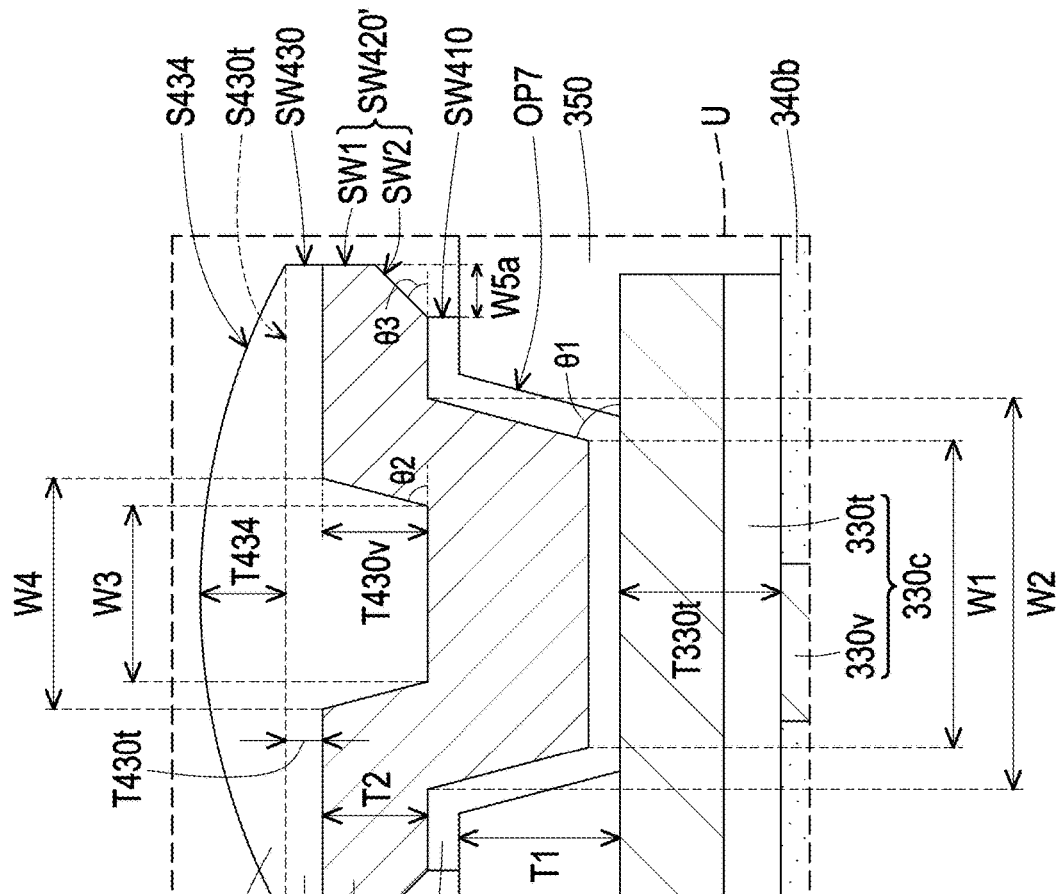
Figure 22:
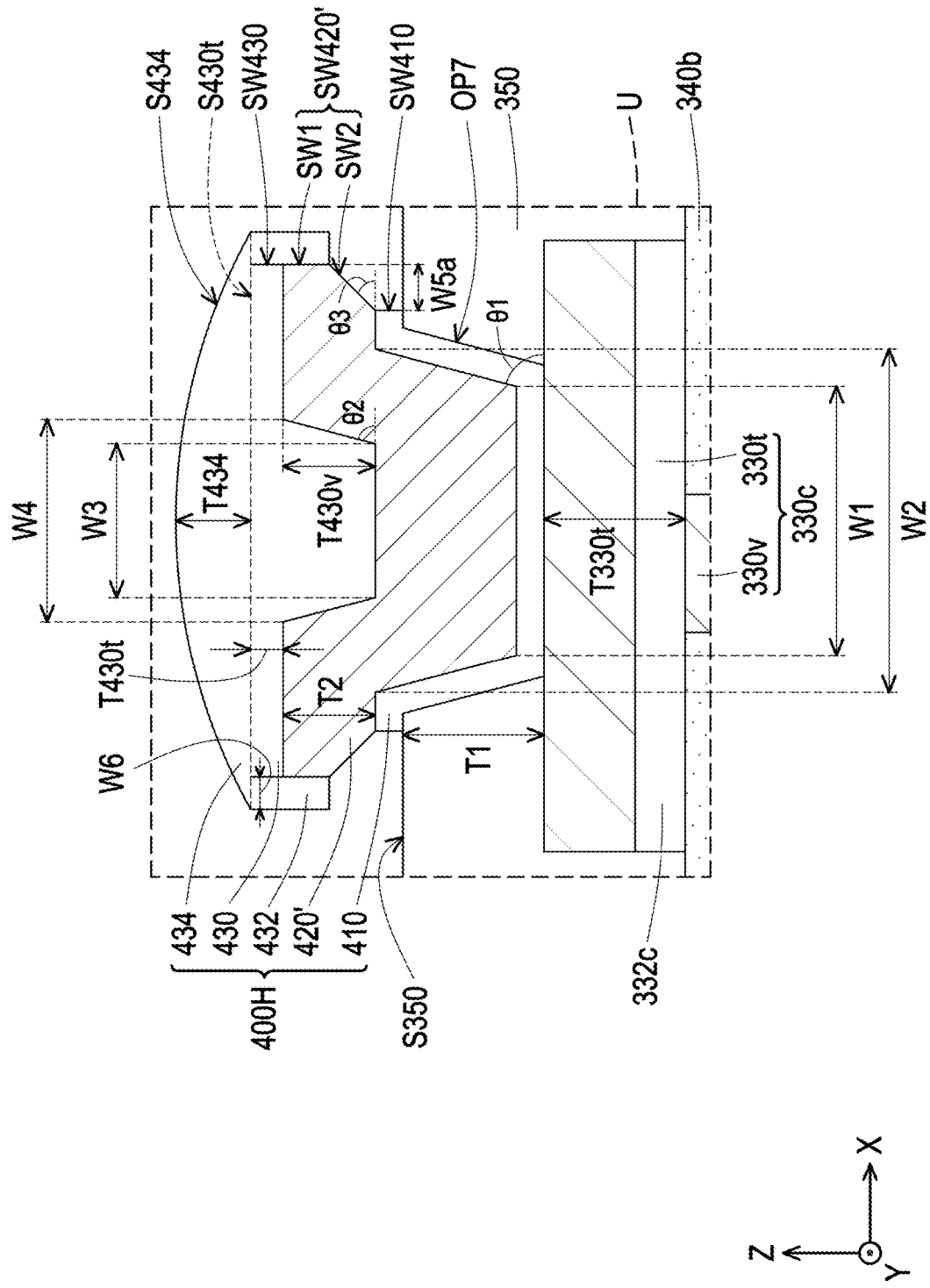

However, the disclosure is not limited thereto; alternatively, the sidewalls SW420 of the UBMs 420 may be partially covered by the extending portions 432, see terminals 400F as shown in FIG. 20. Or alternatively, the UBMs 420 may be substituted by UMBs 420', see terminals 400G as shown in FIG. 21. Or alternatively, the UBMs 420 may be substituted by UMBs 420' and the sidewalls SW420' of the UBMs 420' may be partially covered by the extending portions 432, see terminals 400H as shown in FIG. 22. The details of the extending portions 432 and the details of the UBMs 420' have been respectively described in FIG. 15 and FIG. 16, and thus are not repeated herein for brevity.

Figure 23:
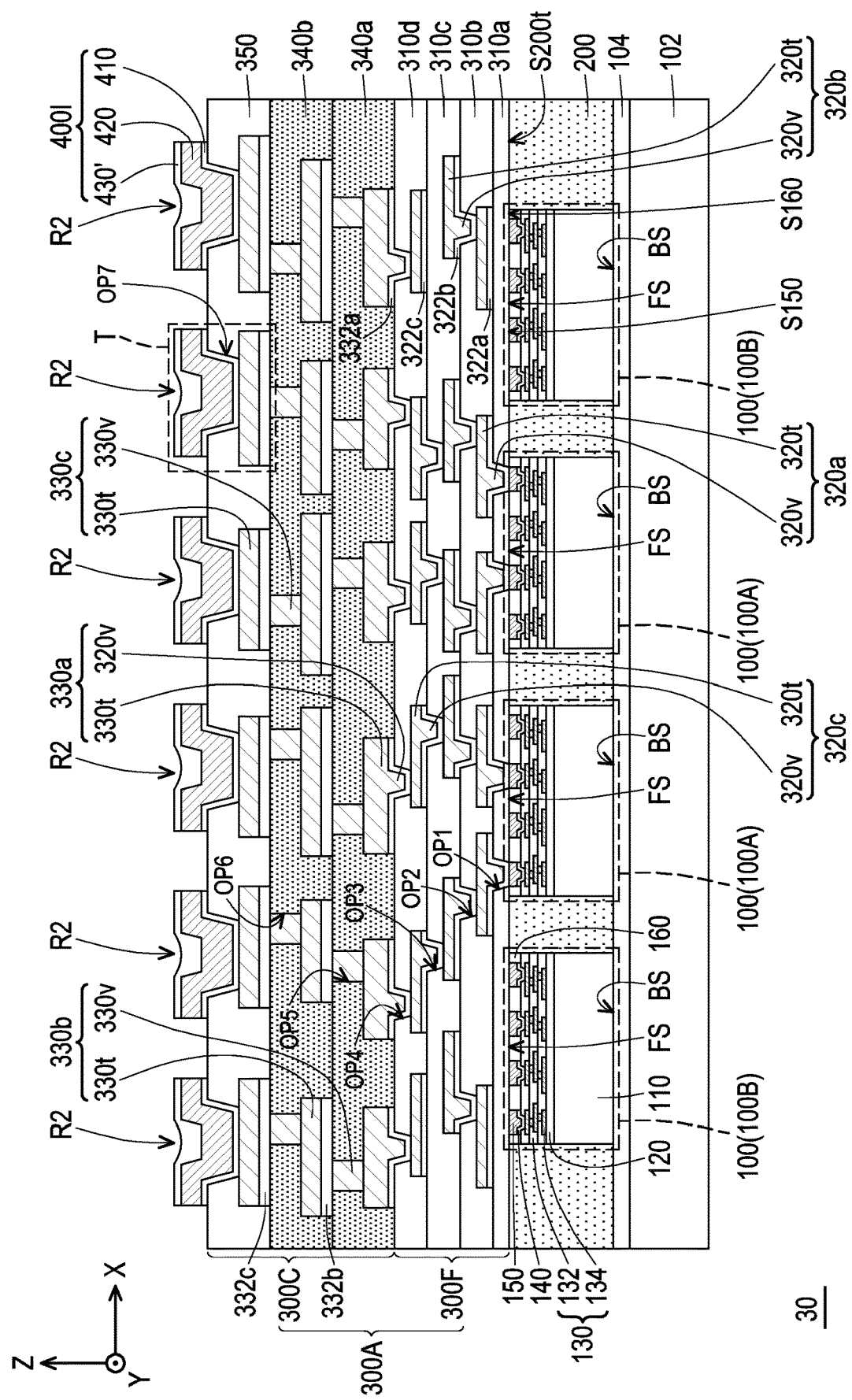
FIG. 23 is a schematic cross-sectional view of a semiconductor structure in accordance with some embodiments of the disclosure.
Figure 24:
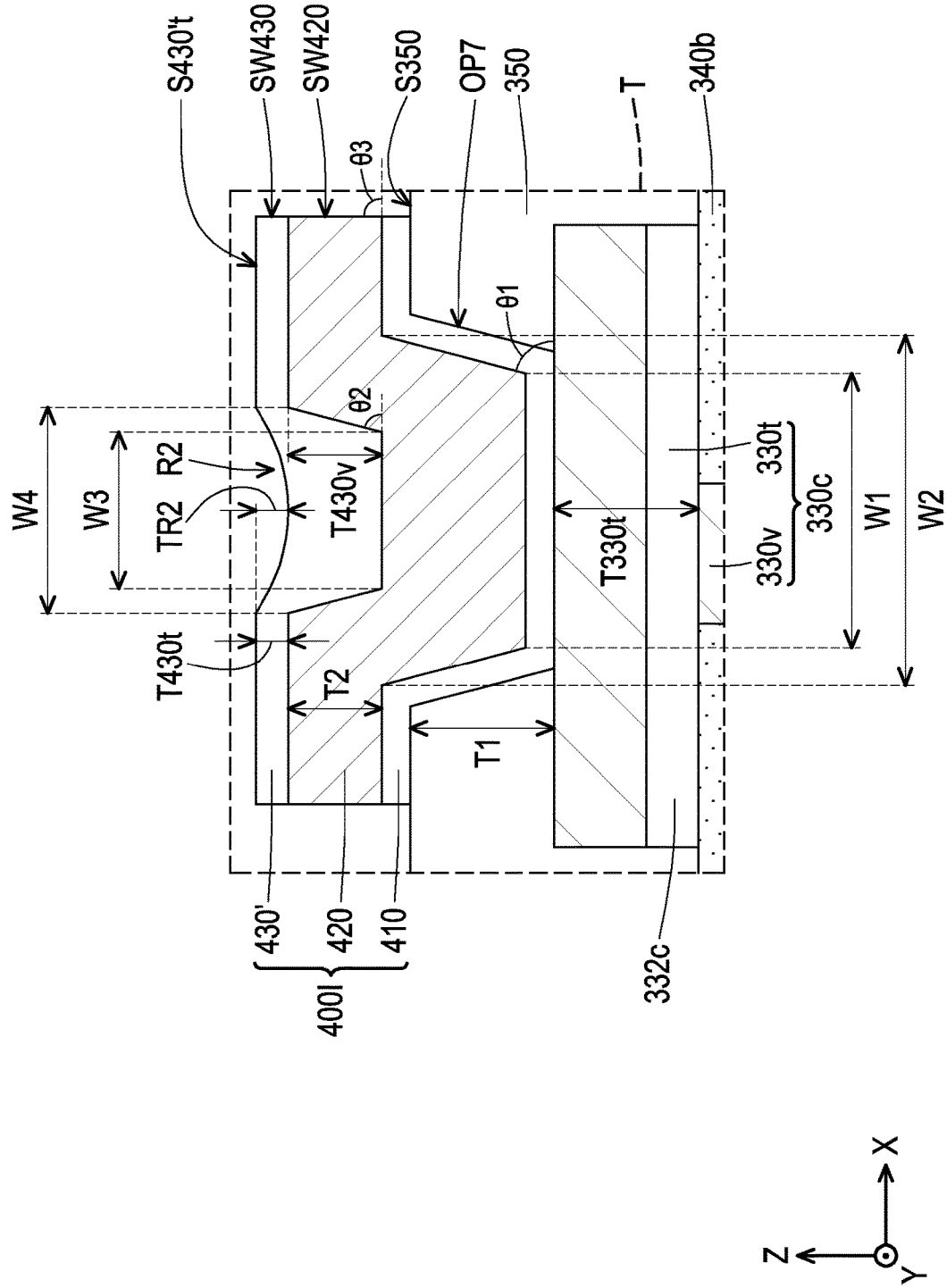
FIG. 24 through FIG. 27 are schematic cross-sectional views respectively showing various embodiments of terminals included in a semiconductor structure in accordance with alternative embodiments of the disclosure.

FIG. 23 is a schematic cross-sectional view of a semiconductor structure 30 in accordance with some embodiments of the disclosure. FIG. 24 through FIG. 27 are schematic cross-sectional views respectively showing various embodiments of terminals included in a semiconductor structure in accordance with alternative embodiments of the disclosure, where the enlarged and schematic cross-sectional views of FIG. 24 through FIG. 27 are outlined in a dashed box T as shown in FIG. 23. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 12 and FIG. 23 together, the semiconductor structure 10 depicted in FIG. 12 and the semiconductor structure 30 depicted in FIG. 23 are similar; the difference is that, the semiconductor structure 30 includes a plurality of terminals 400I instead of the terminals 400A. In such embodiment of the semiconductor structure 30, for each of the terminals 400I, a capping layer 430' having a recess R2 is included, instead of the capping layer 430. For example, the capping layers 430' each have a respective one recess R2 disposed at an illustrated to surface S430' t, as shown in FIG. 23 and FIG. 24. For example, the recesses R2 are simultaneously formed with the capping layers 430' during the reflowing process for forming the capping layers 430'. In the case, for the formation of each terminal 400I, during the reflowing process (e.g., a heating process), a portion of the capping material 430m at a periphery region of the capping material 430m flows towards a center region of the capping material 430m to fill up the recess R1 but the capping material 430m at the center region has a top surface lower than that of the capping material 430m at the periphery region, and thus obtains a resulting structure, the capping layer 430' with a concave top surface (e.g., the recess R2). In some embodiments, the recesses R2 each have a thickness TR2 (as measured in the direction Z) being greater than 0 µm and being less than or substantially equal to about 10 µm, although other suitable thickness may alternatively be utilized. Owing to the configuration of the terminals 400I (e.g., with the recess R2 having the thickness/depth less than or substantially equal about 10 µm), a void (e.g., air voids) can be greatly suppressed or eliminated from an joint after bonding the semiconductor structure 30 and an additional semiconductor package or structure, thereby improving the performance of the semiconductor structure 30 bonded with the additional semiconductor package or structure. Thus, the reliability of the semiconductor structure 30 bonded with the additional semiconductor package or structure is enhanced.

Figure 25:
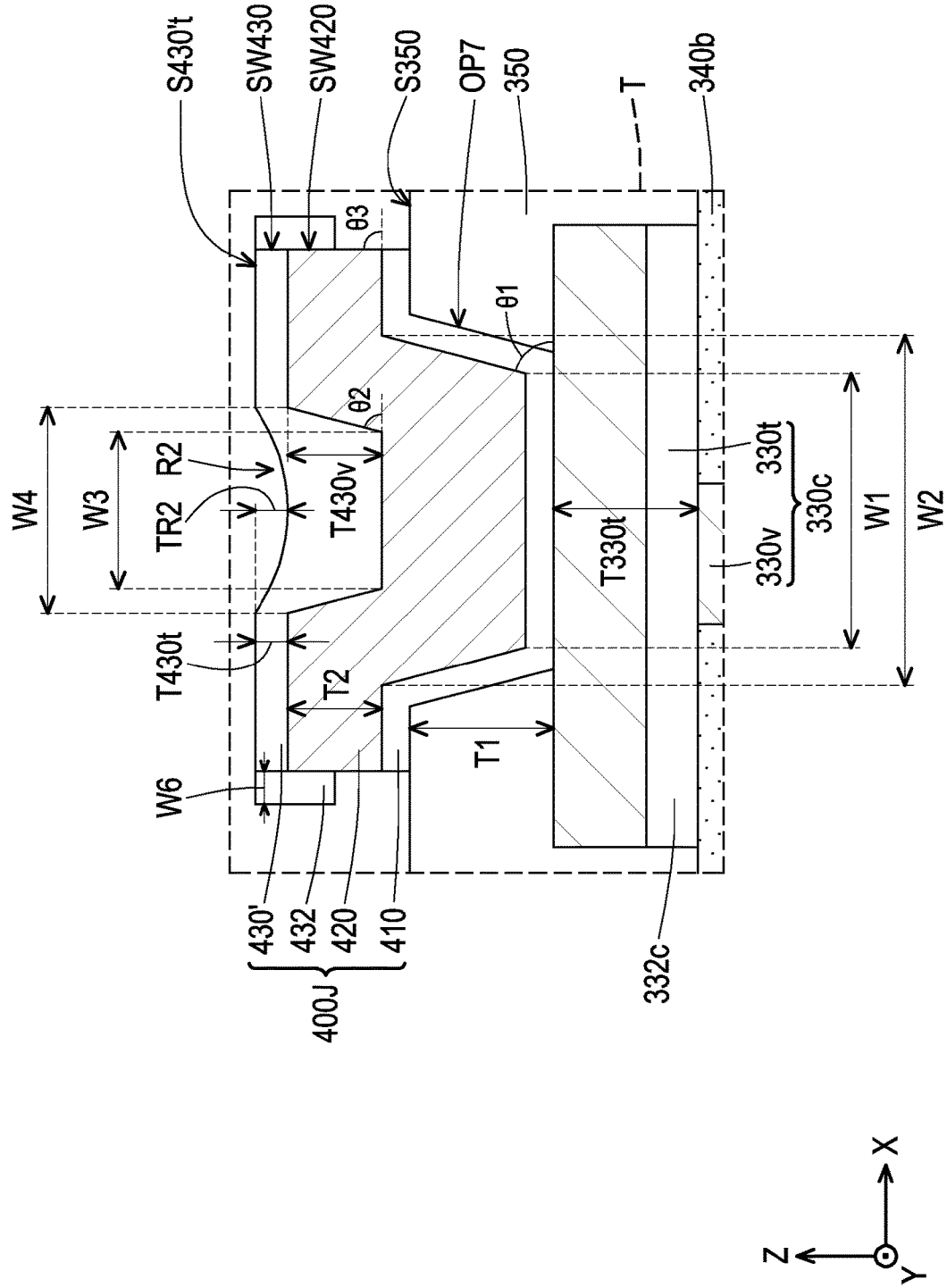
Figure 26:
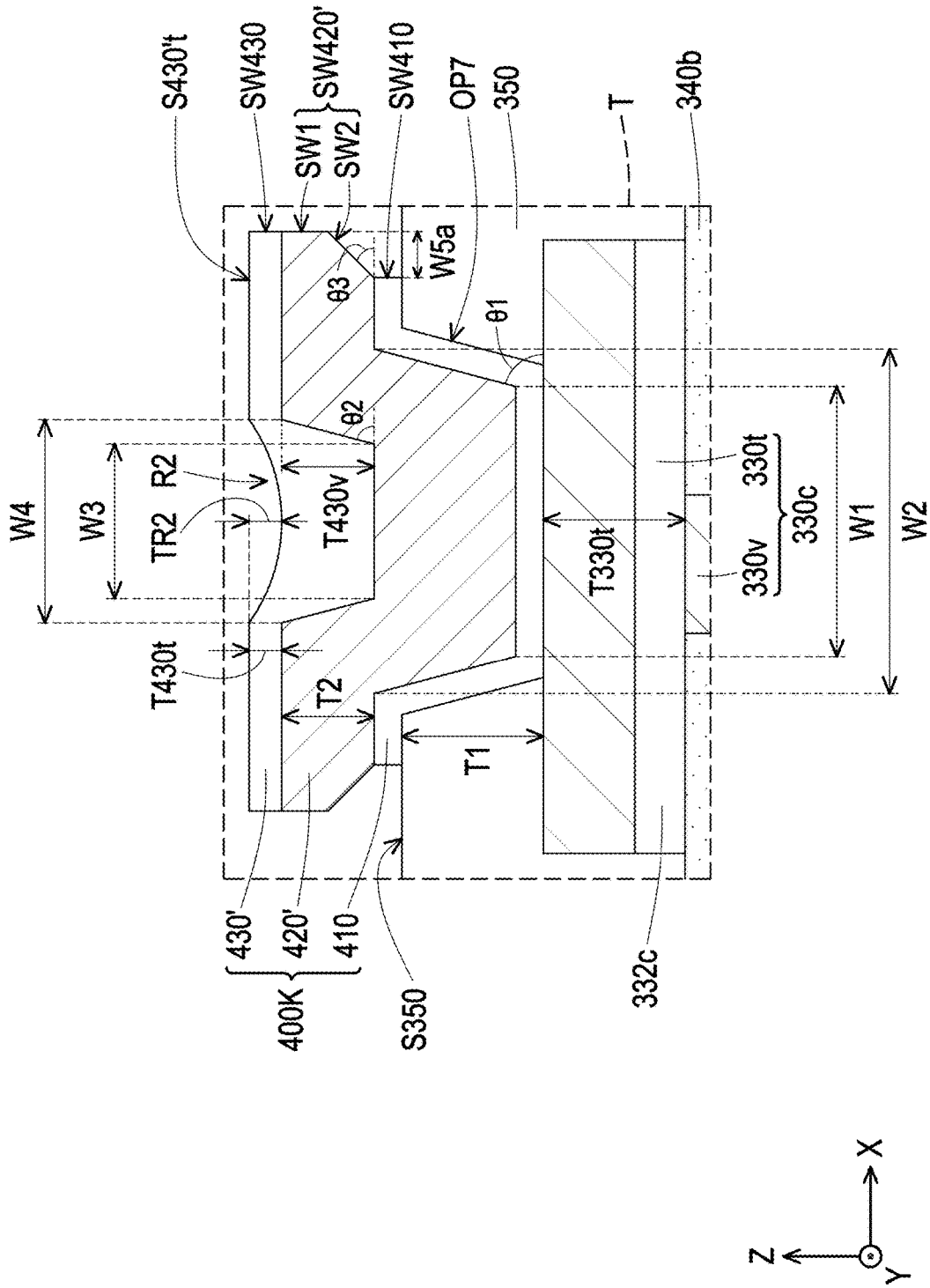
Figure 27:
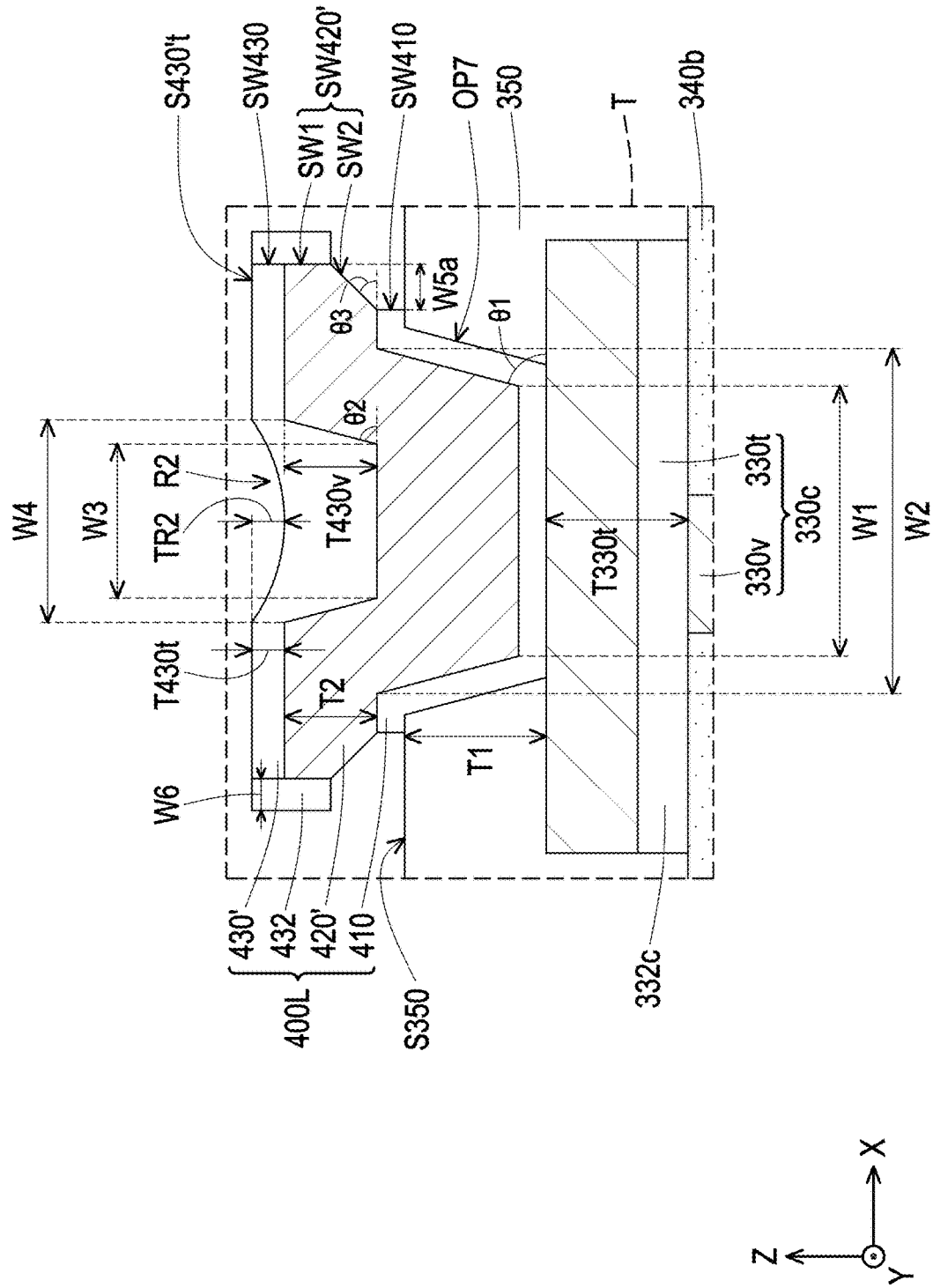

However, the disclosure is not limited thereto; alternatively, the sidewalls SW420 of the UBMs 420 may be partially covered by the extending portions 432, see terminals 400J as shown in FIG. 25. Or alternatively, the UBMs 420 may be substituted by UMBs 420', see terminals 400K as shown in FIG. 26. Or alternatively, the UBMs 420 may be substituted by UMBs 420' and the sidewalls SW420' of the UBMs 420' may be partially covered by the extending portions 432, see terminals 400L as shown in FIG. 27. The details of the extending portions 432 and the details of the UBMs 420' have been respectively described in FIG. 15 and FIG. 16, and thus are not repeated herein for brevity.

Figure 28:
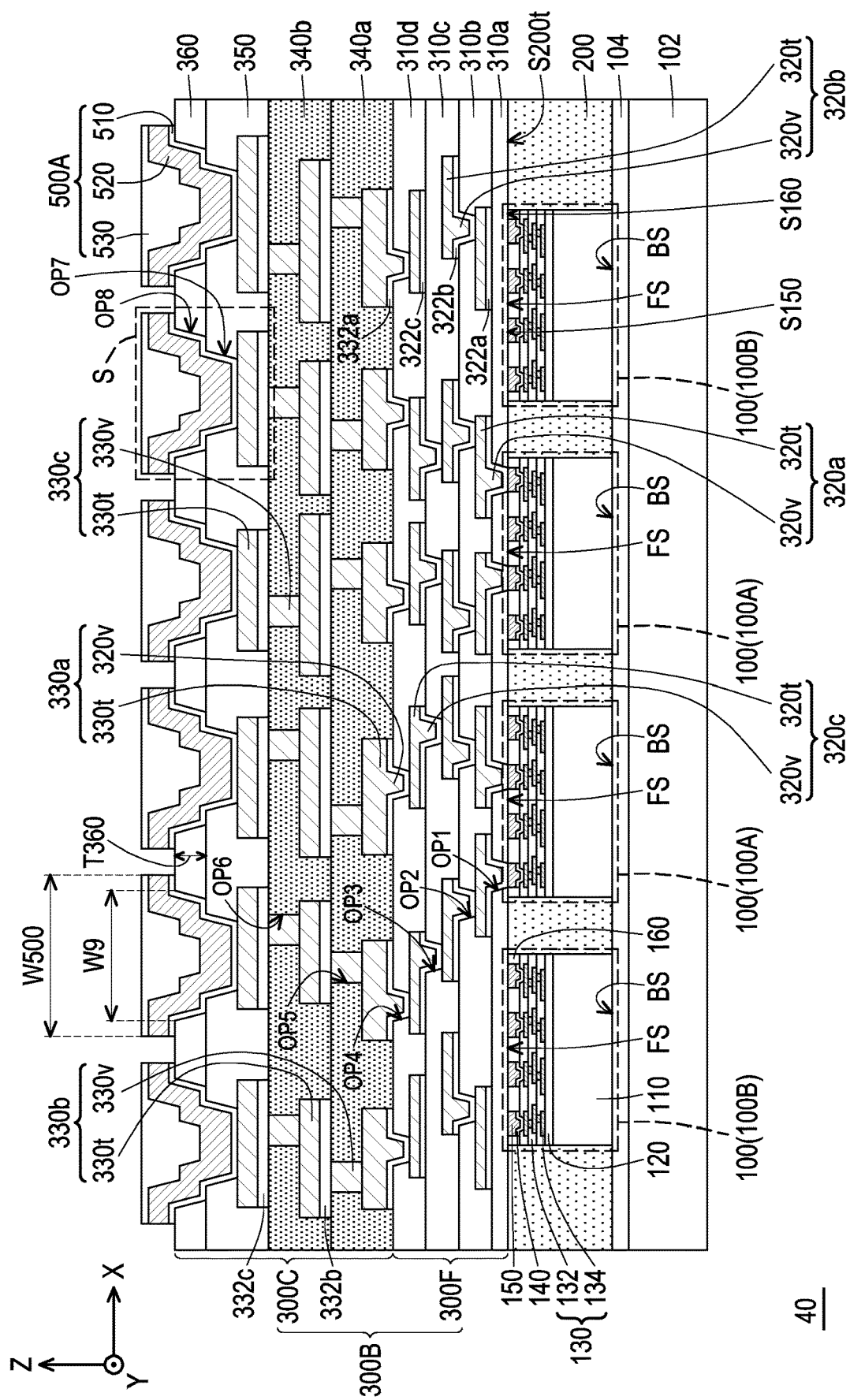
FIG. 28 is a schematic cross-sectional view of a semiconductor structure in accordance with some embodiments of the disclosure.

FIG. 28 is a schematic cross-sectional view of a semiconductor structure 40 in accordance with some embodiments of the disclosure. FIG. 29 through FIG. 32 are schematic cross-sectional views respectively showing various embodiments of terminals included in a semiconductor structure in accordance with alternative embodiments of the disclosure, where the enlarged and schematic cross-sectional views of FIG. 29 through FIG. 32 are outlined in a dashed box S as shown in FIG. 28. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein. Referring to FIG. 12 and FIG. 28 together, the semiconductor structure 10 depicted in FIG. 12 and the semiconductor structure 40 depicted in FIG. 28 are similar; the difference is that, the semiconductor structure 40 substitutes the redistribution circuit structure 300A with a redistribution circuit structure 300B.

In some embodiments, the redistribution circuit structure 300B includes at least one dielectric layer 310 (e.g. a dielectric layer 310a, a dielectric layer 310b, a dielectric layer 310c, and a dielectric layer 1310d), at least one metallization layer 320 (e.g. a metallization layer 320a, a metallization layer 320b, and a metallization layer 320c), at least one metallization layer 330 (e.g. a metallization layer 330a, a metallization layer 330b, and a metallization layer 330c), at least one dielectric layer 340 (e.g. a dielectric layer 340a and a dielectric layer 340b), a dielectric layer 350, and a dielectric layer 380. However, in the disclosure, the numbers of layers of the dielectric layers 310, the metallization layers 320, the metallization layers 330, and the dielectric layers 340 are not limited to what is depicted in FIG. 28, where the numbers of the layers of the dielectric layers 310, the metallization layers 320, the metallization layers 330, and the dielectric layers 340 may be one or more than one as long as the redistribution circuit structure 300B can provide a sufficient routing function to the semiconductor dies 100A. In addition, a plurality of seed layers (e.g., 322 (including 322a, 322b, and/or 322c) and/or 332 (including 332a, 332b, and/or 332c)) may be further included in the redistribution circuit structure 300B. The conductive vias 320v, the conductive trenches 320t, and a dielectric structure (e.g., including the dielectric layers 320a through 320d) surrounding thereto together constitute a fine-featured portion 300F of the redistribution circuit structure 300B, and the conductive vias 330v, the conductive trenches 330t, and a dielectric structure (e.g., including the dielectric layers 340a through 340b, the dielectric layer 350, and the dielectric layer 360) surrounding thereto together constitute a coarse-featured portion 300C of the redistribution circuit structure 300B. The details of each of the dielectric layers 310, the metallization layers 320, the metallization layers 330, the dielectric layers 340, and the dielectric layer 350 have been previously described in FIG. 4 through FIG. 9, and thus are not repeated herein for simplicity.

In some embodiments, as shown in FIG. 28, the dielectric layer 360 is disposed on the dielectric layer 350 and includes a plurality of openings OP8, where positioning locations of the openings OP8 formed in the dielectric layer 360 are corresponding to (e.g., overlapped with) the positioning locations of the openings OP7 formed in the dielectric layer 350, respectively. The dielectric layer 360 may have a thickness T360 (as measured in the direction Z) of about 15 µm to about 30 µm, although other suitable thickness may alternatively be utilized. The openings OP8 independently may have a critical dimension CD in a width W9 (as measured in the direction X or Y) of about 350 µm to about 500 µm, although other suitable thickness may alternatively be utilized. The formation and material of the dielectric layer 360 are similar to or substantially identical to the formation and the material of the dielectric layer 350 described in FIG. 9, and thus are not repeated herein.

Figure 29:
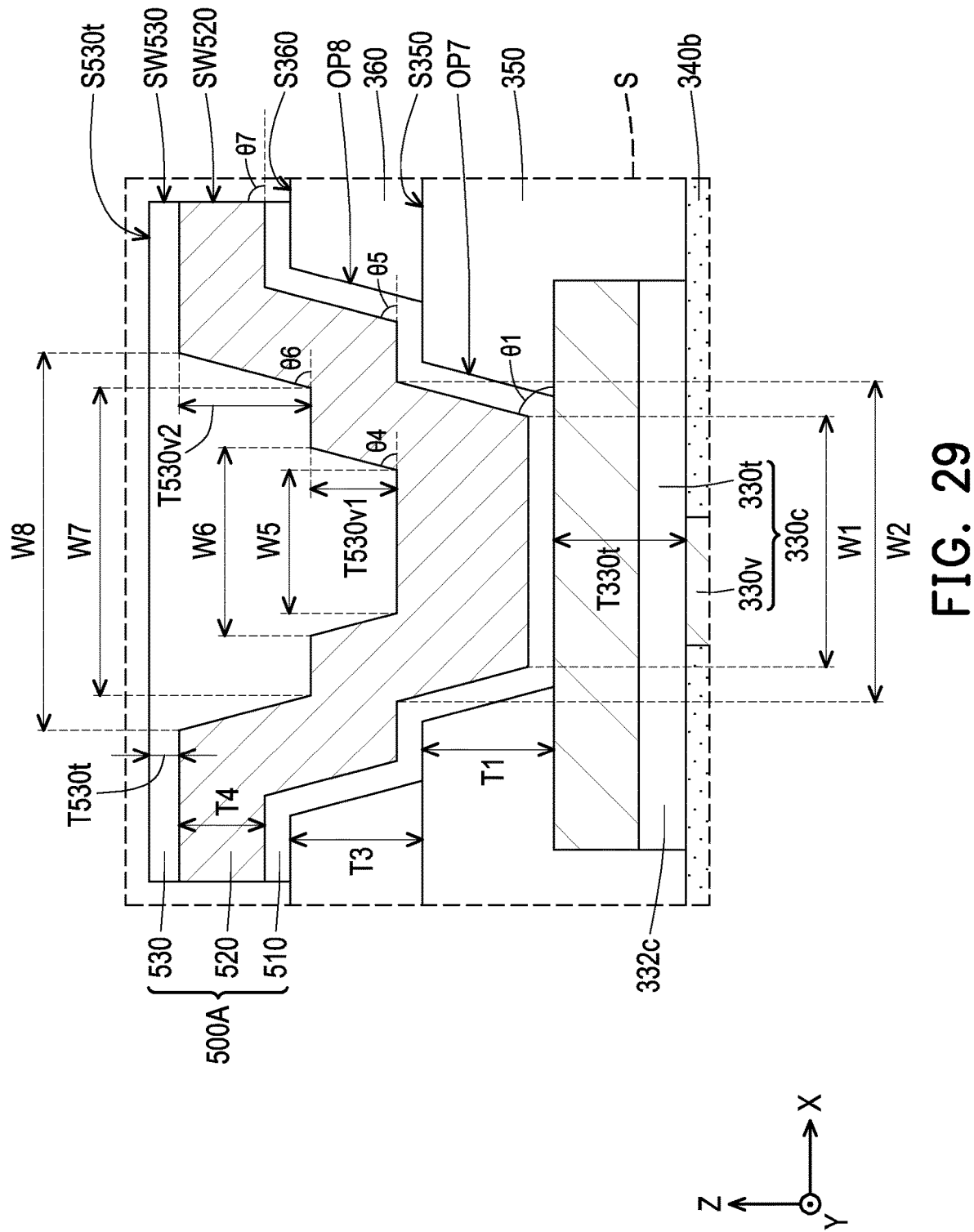
FIG. 29 through FIG. 32 are schematic cross-sectional views respectively showing various embodiments of terminals included in a semiconductor structure in accordance with alternative embodiments of the disclosure.

Continued on FIG. 28, in some embodiments, a plurality of terminals 500A are disposed on and electrically coupled to the redistribution circuit structure 300B. In some embodiments, at least some of the terminals 500A are electrically coupled to the semiconductor dies 100A through the redistribution circuit structure 300B. For example, as shown in FIG. 28 and FIG. 29, each of the terminals 500A includes a seed layer 510, an UBM 520, and a capping layer 530, where the UBM 520 are interposed between and electrically connecting the seed layer 510 underlying thereto and the capping layer 530 overlying thereto. In the case, the seed layer 510 lines sidewalls and bottoms of the openings OP7 formed in the dielectric layer 350 and sidewalls of the openings OP8 formed in the dielectric layer 360 and further extends onto an illustrated top surface S360 of the dielectric layer 360, wherein the UBMs 520 line the inner surfaces of the seed layer 510, and the capping layers 530 are disposed on illustrated top surfaces (not labeled) of the UBMs 520.

Referring to FIGS. 28 and 29, in some embodiments, the openings O7 each has a thickness T1 (or height, as measured along the direction Z) of about 15 µm to about 30 although other suitable thickness may alternatively be utilized. For example, an angle θ1 between the sidewall of one opening OP7 and an illustrated top surface (not labeled) of the conductive trench 330t of the metallization layer 330c covering by the dielectric layer 350 is approximately ranging from 60 degrees to 90 degrees. In some embodiments, each of the UBMs 520 has a first via portion (not labeled) disposed in (e.g., filled up) a respective one opening OP7, a first line portion (not labeled) disposed over the dielectric layer 350 and a third line portion (not labeled) disposed over the dielectric layer 360, where the first via portion has a first bottom opening with a width W1 (as measured in the direction X or Y) of about 200 µm to about 350 µm and a first top opening with a width W2 (as measured in the direction X or Y) of about 215 µm to about 365 the first line portion has a thickness T3 (as measured in the direction Z) of about 15 µm to about 30 and the third line portion has a thickness T4 (as measured in the direction Z) of about 10 µm to about 30 although other suitable thickness may alternatively be utilized. The width W1 is less than the width W2, for example, as shown in FIG. 28 and FIG. 29.

For example, an angle θ4 between an inner sidewall of the first line portion and a plane parallel to an illustrated top surface S350 of the dielectric layer 350 is approximately ranging from 60 degrees to 90 degrees. For example, an angle θ5 between an outer sidewall of the first line portion and the plane parallel to the illustrated top surface S350 of the dielectric layer 350 (not covering by the respective one UMB 520) is approximately ranging from 60 degrees to 90 degrees. For example, an angle θ6 between an inner sidewall of the second line portion and a plane parallel to an illustrated top surface S360 of the dielectric layer 360 is approximately ranging from 60 degrees to 90 degrees. For example, an angle θ7 between an outer sidewall of the second line portion and the plane parallel to the illustrated top surface S360 of the dielectric layer 360 (not covering by the respective one UMB 520) is approximately ranging from 60 degrees to 90 degrees.

In some embodiments, each of the capping layers 530 has a third via portion (not labeled) laterally covered by the first line portion of a respective one UBM 520, a fourth via portion (not labeled) laterally covered by the second line portion of the respective one UBM 520, and a third line portion (not labeled) disposed over the fourth via portion, where the fourth via portion is interposed between and connected to the third via portion and the third line portion. In the case, the third via portion has a third bottom opening with a width W5 (as measured in the direction X or Y) of about 175 µm to about 340 µm and a third top opening with a width W6 (as measured in the direction X or Y) of about 190 µm to about 355 µm, and has the third via portion has a thickness T530v1 (as measured in the direction Z) of about 15 µm to about 30 µm. The fourth via portion has a fourth bottom opening with a width W7 (as measured in the direction X or Y) of about 335 µm to about 475 µm and a fourth top opening with a width W8 (as measured in the direction X or Y) of about 350 µm to about 500 µm, and has the fourth via portion has a thickness T530v2 (as measured in the direction Z) of about 15 µm to about 30 µm. The line portion has a thickness T530t (as measured in the direction Z) of about 0.3 µm to about 3 µm, although other suitable thickness may alternatively be utilized. The width W5 is less than the width W6, and the width W7 is less than the width W8, for example, as shown in FIG. 29. As shown in FIG. 28 and FIG. 29, illustrated top surfaces (e.g., S530t in FIG. 29) of the terminals 500A includes substantially planar surface, in some embodiments. Owing to the configuration of the terminals 500A (e.g., planar top surfaces S530t), a void (e.g., air voids) can be greatly suppressed or eliminated from an joint after bonding the semiconductor structure 40 and an additional semiconductor package or structure, thereby improving the performance of the semiconductor structure 40 bonded with the additional semiconductor package or structure. Thus, the reliability of the semiconductor structure 40 bonded with the additional semiconductor package or structure is enhanced.

Figure 30:
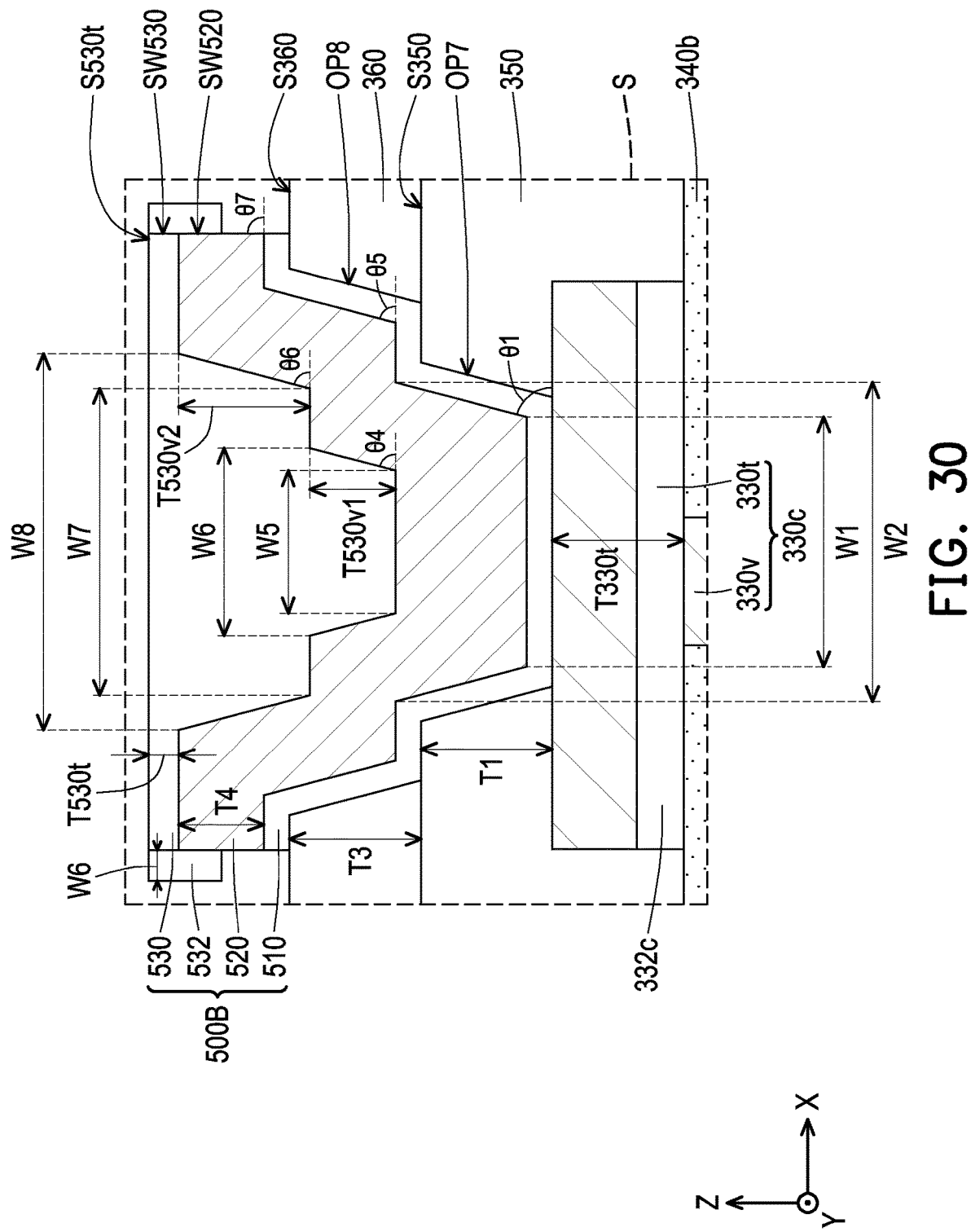
Figure 31:
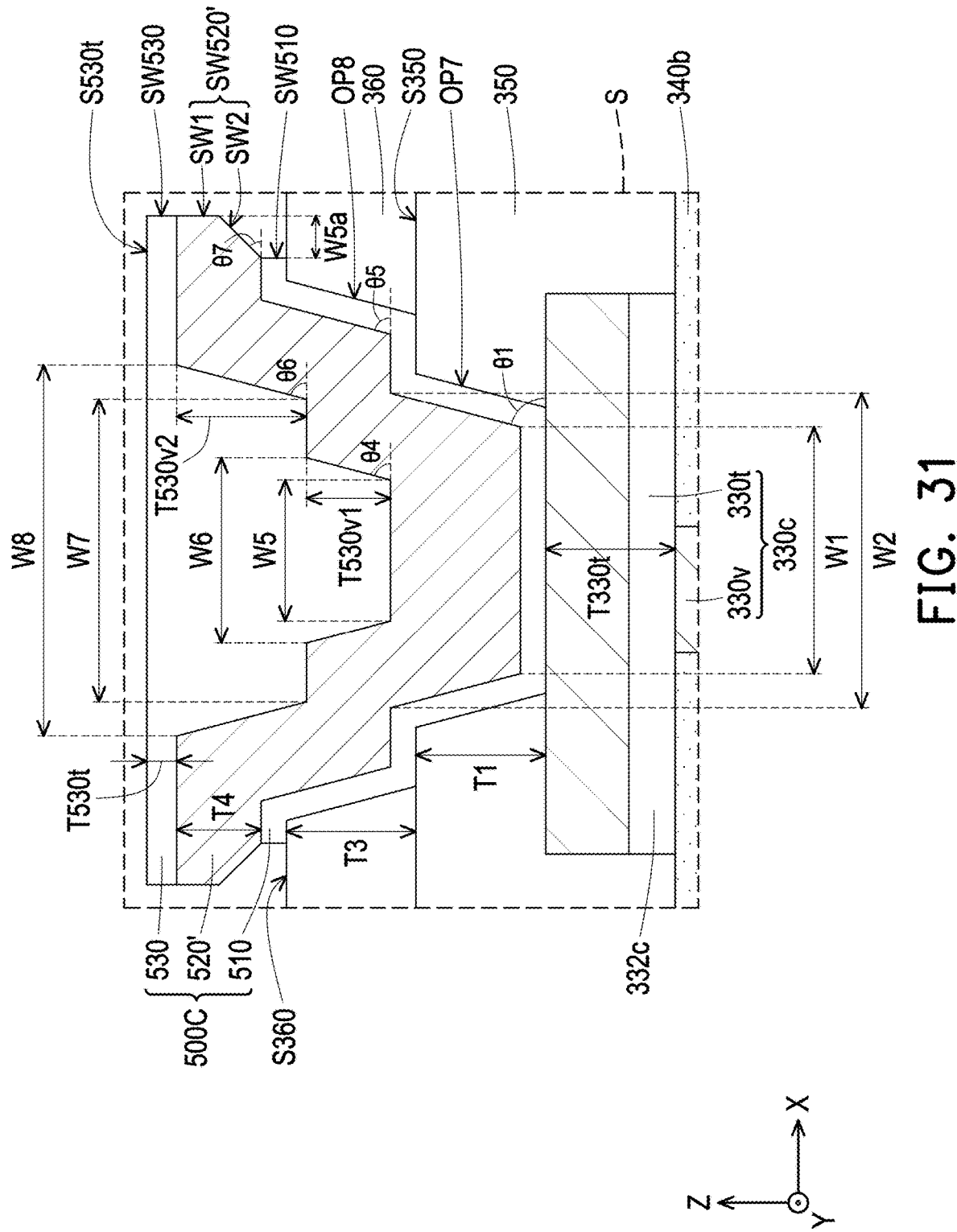
Figure 32:
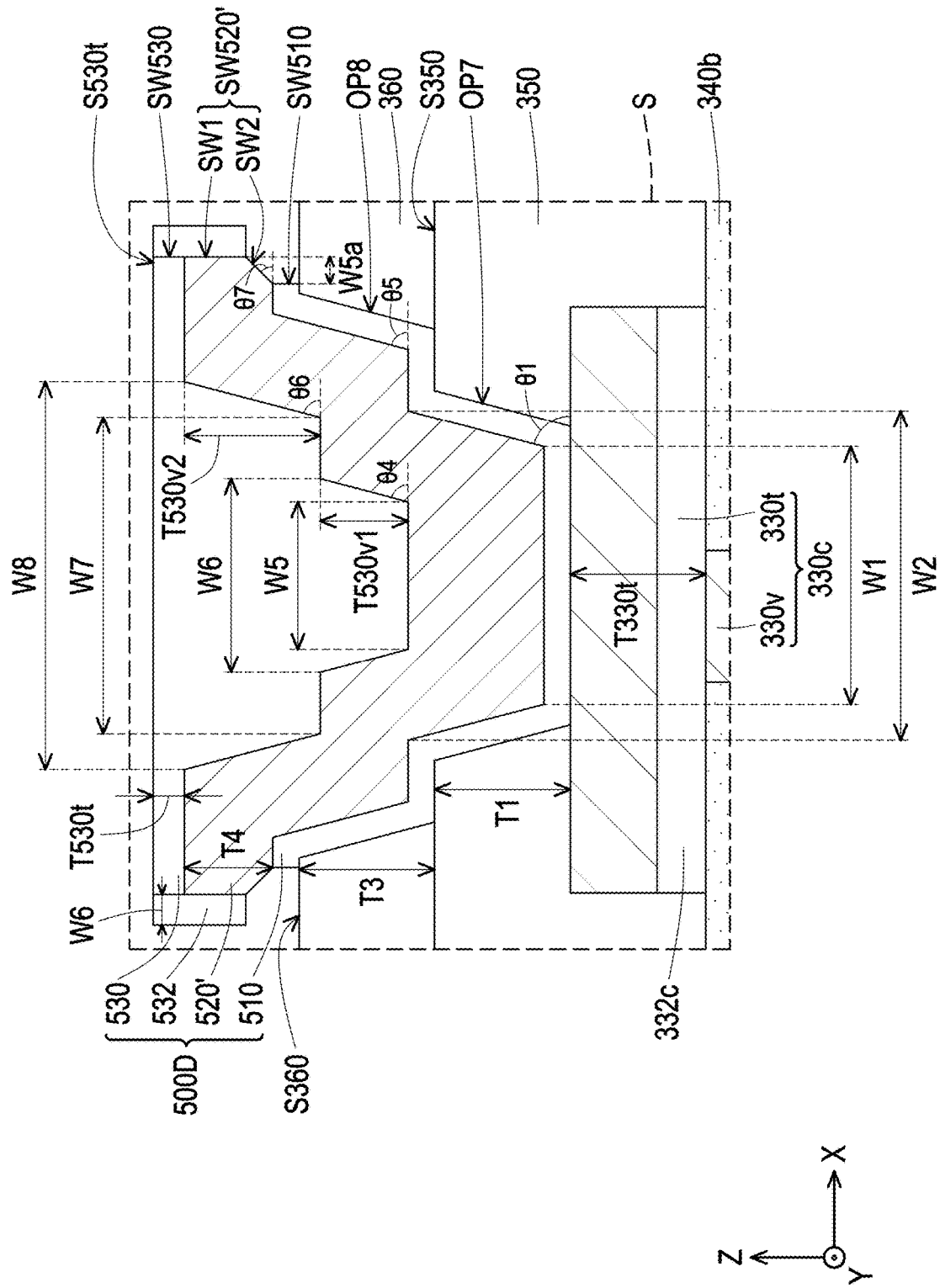

However, the disclosure is not limited thereto; alternatively, sidewalls SW520 of the UBMs 520 may be partially covered by extending portions 532, see terminals 500B as shown in FIG. 30. Or alternatively, the UBMs 520 may be substituted by UMBs 520', see terminals 500C as shown in FIG. 31. Or alternatively, the UBMs 520 may be substituted by UMBs 520' and sidewalls SW520' of the UBMs 520' may be partially covered by extending portions 532, see terminals 500D as shown in FIG. 32. The details of the extending portions 532 and the details of the UBMs 520' are similar to or substantially identical to the details of the extending portions 432 as previously described in FIG. 15 and the details of the UBMs 420' as previously described in FIG. 16, and thus are not repeated herein for brevity. In alternative embodiments, the terminals 500A each may be modified to include a dome portion overlying the capping layer 530 similar to the dome portion 434 as previously described in FIG. 18 through FIG. 22. In further alternative embodiments, the terminals 500A each may be modified to include a recess in the capping layer 530 similar to the recesses R2 as previously described in FIG. 23 through FIG. 27. The disclosure is not limited thereto.

The semiconductor structures 10 through 40 may further be mounted with an additional semiconductor package (or structure) to form a semiconductor structure having a stacked structure. FIG. 33 through FIG. 36 are schematic cross-sectional views of various stages in a manufacturing method of a semiconductor structure 1000 in accordance with some embodiments of the disclosure. The elements similar to or substantially the same as the elements described above will use the same reference numbers, and certain details or descriptions of the same elements (e.g., the formations and materials) and the relationship thereof (e.g., the relative positioning configuration and electrical connection) will not be repeated herein.

Figure 33:
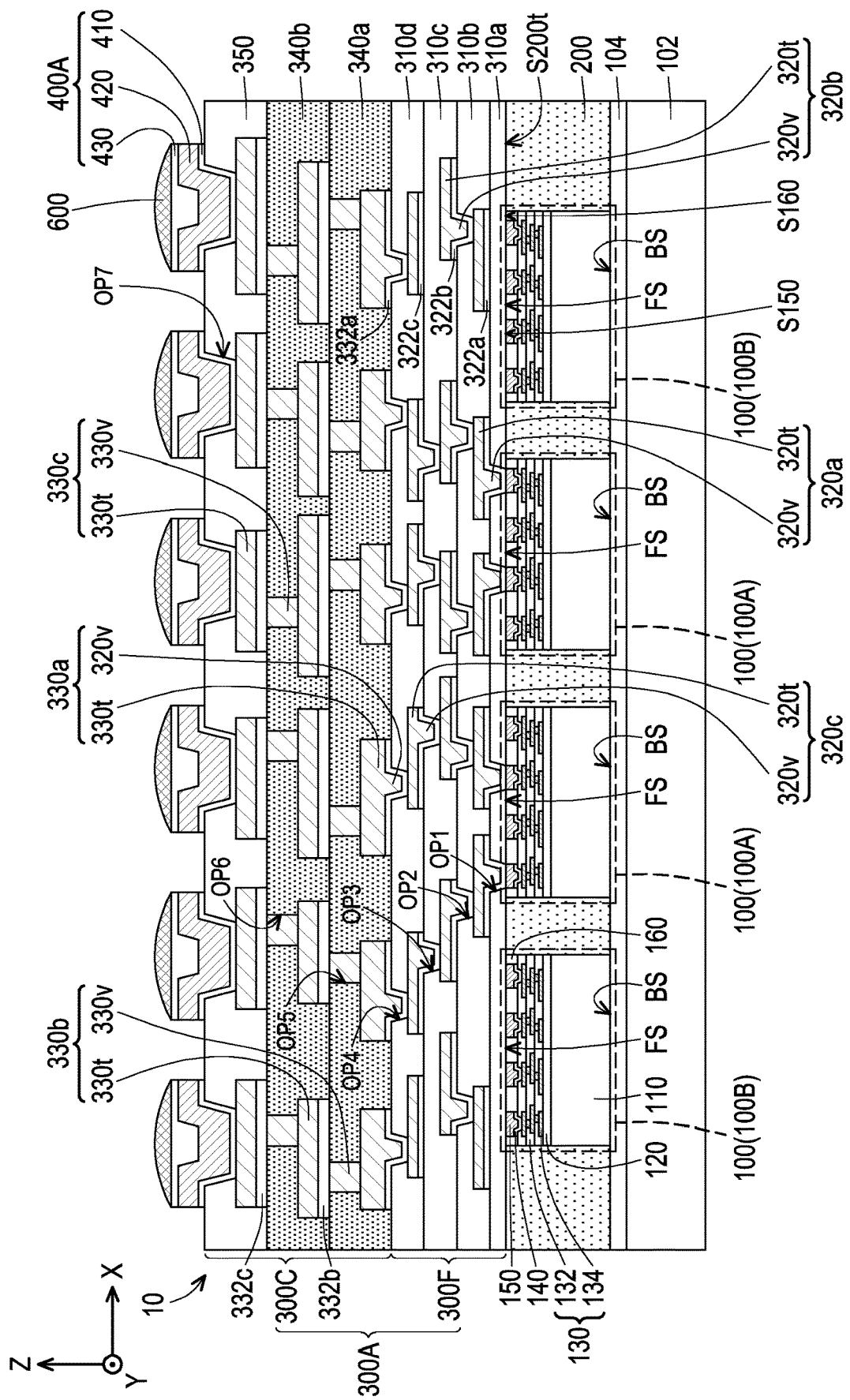
FIG. 33 through FIG. 36 are schematic cross-sectional views of various stages in a manufacturing method of a semiconductor structure in accordance with some embodiments of the disclosure.

Referring to FIG. 33, in some embodiments, the semiconductor structure 10 is provided, and a plurality of pre-solders 600 are formed on the terminals 400A of the semiconductor structure 10. The details of the semiconductor structure 10 have been described in FIG. 1 through FIG. 17, and thus are not repeated herein for brevity. In some embodiments, the pre-solders 600 are pre-solder pastes, for example. In an alternative embodiment, the pre-solders 600 may be pre-solder blocks. In some embodiments, the material of the pre-solders 600 may include a lead-free solder material (such as Sn-base materials) with or without additional impurity (such as Ni, Bi, Sb, Ag, Cu, Au, or the like). The disclosure is not limited thereto. For example, the pre-solders 600 are made of SnBi. Owing to the capping layers 430 of the terminals 400A, the air voids between the pre-solders 600 and the terminals 400A can be prevented.

Figure 34:
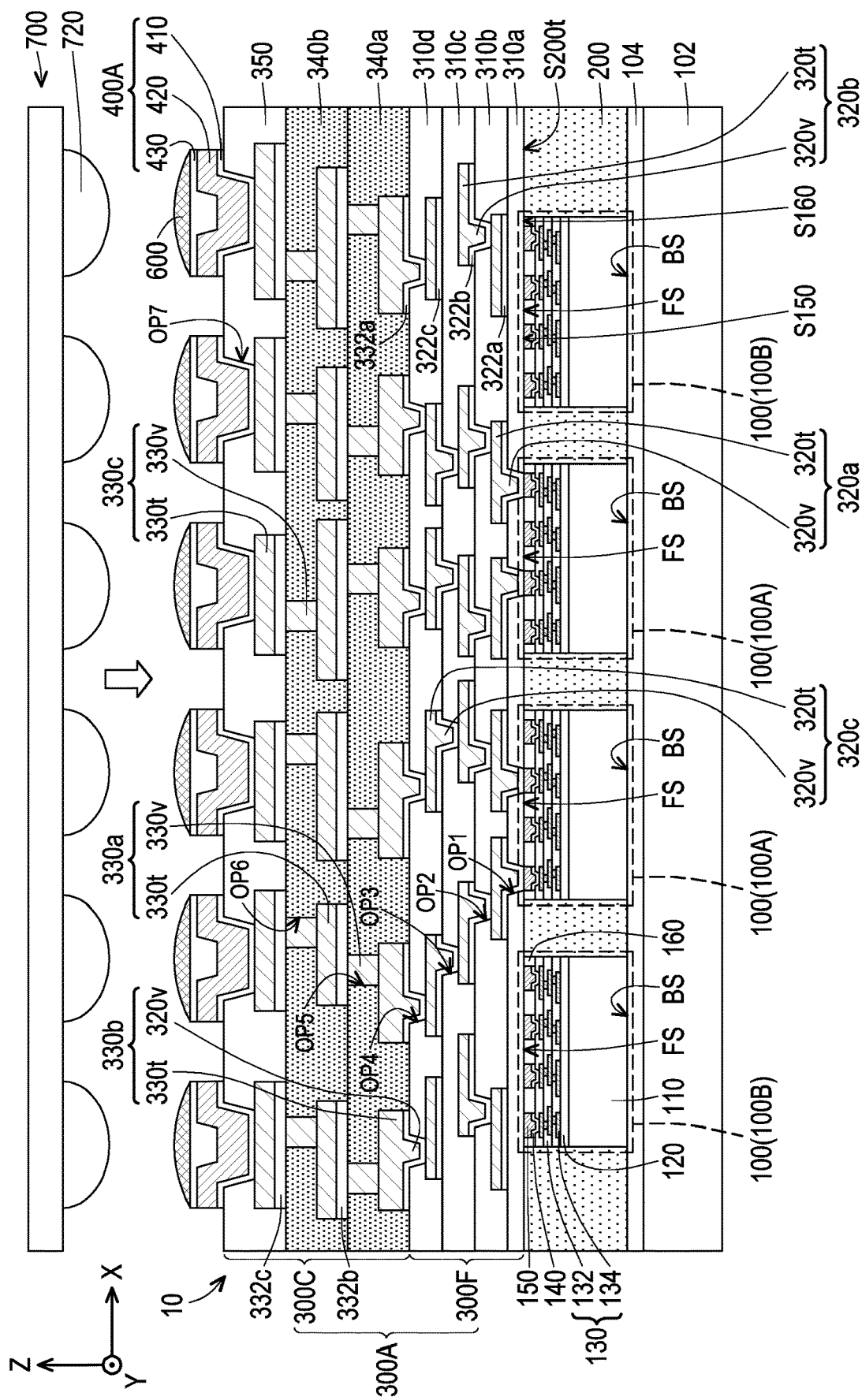

Referring to FIG. 34, in some embodiments, an additional semiconductor package (or structure) 700 is provided over the semiconductor structure 10. For example, the additional semiconductor package 700 includes a plurality of terminals (or conductive terminals) 720 disposed thereon and electrically coupled to devices (not shown) included in the additional semiconductor package 700. The devices may include memory structures (e.g., a memory die or chip), processing structures (e.g., a logic die or chip), I/O structures (e.g., an I/O die or chip), or the like. The types, shape and/or size of the devices may be the same. Alternatively, the types, shape and/or size of the devices may be different, in part or all. The number and types of the devices may be selected and designed based on the demand and design requirement, the disclosure is not limited thereto. In some embodiments, the terminals 720 are or include micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. The conductive terminals 720 may be referred to as conductive input/output terminals of the additional semiconductor package 700.

In some embodiments, the additional semiconductor package 700 is in form of a system-on-wafer (SoW). For example, the additional semiconductor package 700 is in a wafer or panel form. The additional semiconductor package 700 may be in a form of wafer-size having a diameter of about 4 inches or more. The additional semiconductor package 700 may be in a form of wafer-size having a diameter of about 6 inches or more. The additional semiconductor package 700 may be in a form of wafer-size having a diameter of about 8 inches or more. Or alternatively, the additional semiconductor package 700 may be in a form of wafer-size having a diameter of about 12 inches or more. On the other hand, the additional semiconductor package 700 may be in a form of panel-size having a long axis of about 4 inches or more, about 6 inches or more, about 8 inches or more, about 12 inches or more, or any other suitable size. The disclosure is not limited thereto.

Figure 35:
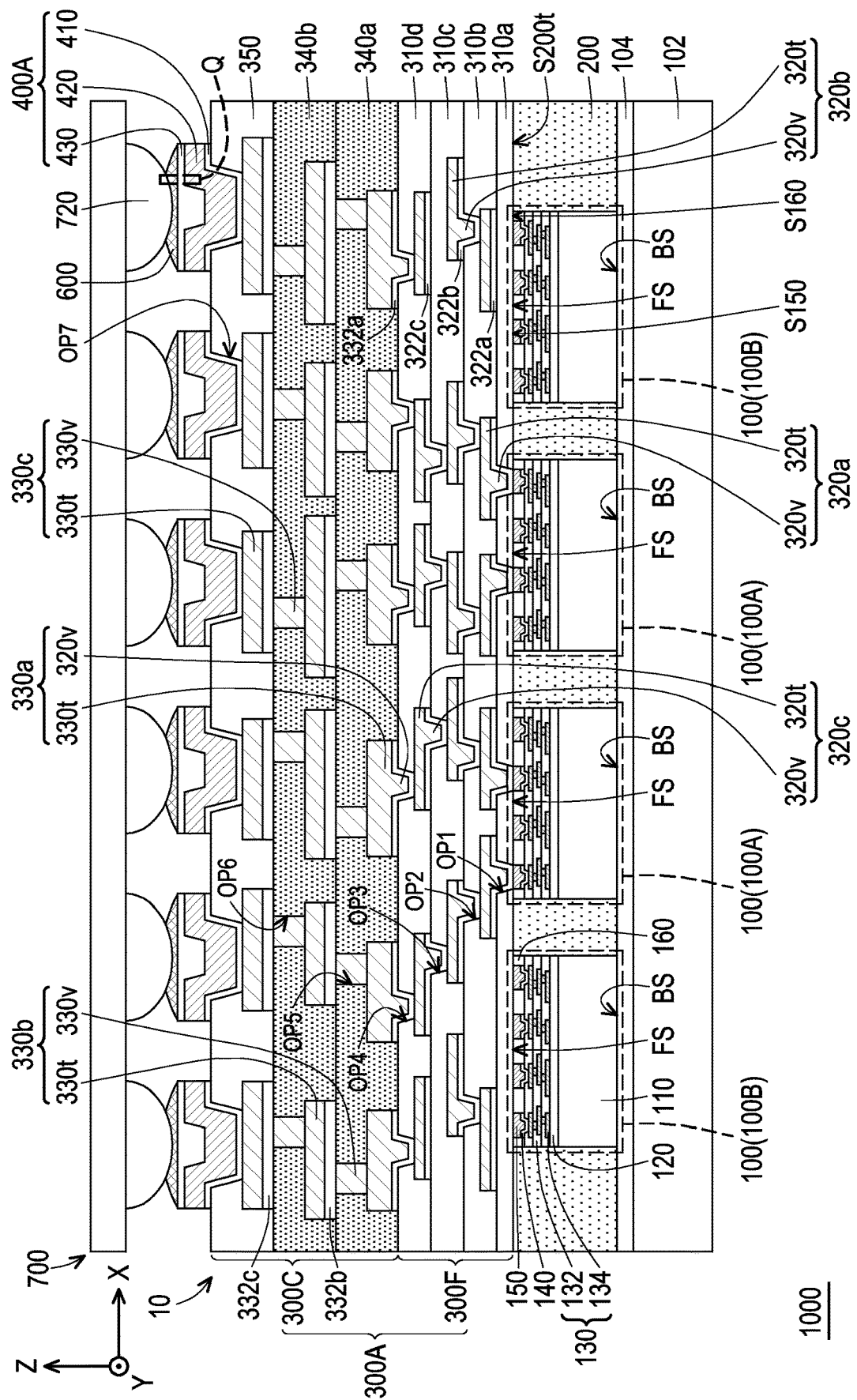

Referring to FIG. 34 and FIG. 35, in some embodiments, the additional semiconductor package 700 is mounted to the semiconductor structure 10 by connecting the terminals 720 and the pre-solders 600 via a flip-chip bonding process. In some embodiments, the bonding process may include a reflow process. In some embodiments, during the bonding process, the reflow process is performed by heating the terminals 720 of the additional semiconductor package 700, the pre-solders 600, and the capping layers 430 of the terminals 400A of the semiconductor structure 10 to a suitable temperature for bonding. For example, during the reflow process, the temperature gradually increases until it reaches the melting temperature of the terminals 720, the pre-solders 600, and the capping layers 430 of the terminals 400A. In embodiments where the terminals 720, the pre-solders 600, and the capping layers 430 of the terminals 400A are solder-containing layers, the terminals 720, the pre-solders 600, and the capping layers 430 of the terminals 400A may be heated to a temperature of or greater than a melting point of the terminals 720, the pre-solders 600, and the capping layers 430 of the terminals 400A. For example, the temperature is elevated about 20° C. above the melting temperature of the terminals 720, the pre-solders 600, and the capping layers 430 of the terminals 400A. It is noted that the reflowed temperature may vary depending on the composition content of the solder-containing layer. In embodiments where SnBi solder is included, the terminals 720, the pre-solders 600, and the capping layers 430 of the terminals 400A may be heated to a lower temperature (e.g., greater than about 130° C.). In embodiments where SAC solder is included, the terminals 720, the pre-solders 600, and the capping layers 430 of the terminals 400A may be heated to a higher temperature (e.g., greater than about 200° C.). After the reflow process, the temperature may gradually decrease, and the terminals 720, the pre-solders 600, and the capping layers 430 of the terminals 400A are bonded together and allowed to cool off and solidify. Up to here, the semiconductor structures 1000 having a stacked structure is manufactured.

Figure 36:
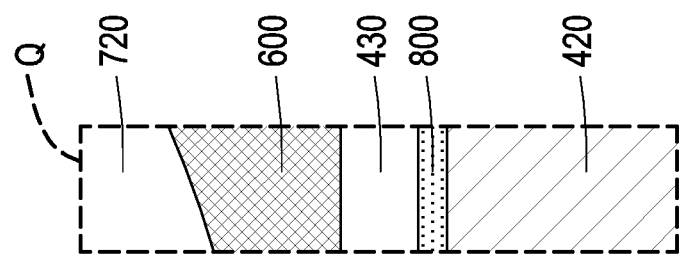

In addition, during the reflowing process, intermetallic compound (IMC) regions 800 (FIG. 36) are further formed between the capping layers 430 and the UBMs 420 of the terminals 400A, for example. In the case, the terminals 720, the pre-solders 600, the IMC regions 800 and the capping layers 430 of the terminals 400A together may be referred to as solder joints of the semiconductor structures 1000. The dashed box Q in FIG. 35 is magnified and illustrated in greater detail in FIG. 36. In FIG. 36, a close up of a portion of one solder joint is illustrated, in accordance with some embodiments (see the dashed box Q of FIG. 35). The material of the IMC regions 800 may include $Cu_3Sn$ and/or $Cu_6Sn_5$, where Cu atoms of the IMC regions 800 is from the UBMs 420, and Sn atoms of the IMC regions 800 is from the capping layers 430. Due to the capping layers 430 serve as barrier layers to prevent Sn atoms of the pre-solders 600 being diffusing downwards for subjecting with Cu atoms from the UBMs 420 to form IMC regions, which eliminates a formation of brittle Bi-rich region (or phase) in the solder joints, thereby improving the mechanical strength and reliability of the solder joints of the semiconductor structures 1000. In addition, owing to the capping layers 430 of the terminals 400A, the air voids between the pre-solders 600 and the terminals 400A are prevented. Therefore, no air trapped by the air voids can be in the solder joints after bonding, thereby improving the performance of the semiconductor structure 100. The reliability of the semiconductor structure 100 is ensured.

The disclosure is not limited thereto. In some embodiments, the semiconductor structure 10 included in the semiconductor structure 1000 may be replaced with the semiconductor structures 20, 30 or the modifications of the semiconductor structures 10, 20, 30. The disclosure is not limited thereto.

In accordance with some embodiments, a semiconductor structure includes a semiconductor die, a redistribution circuit structure, and a terminal. The redistribution circuit structure is disposed on and electrically coupled to the semiconductor die. The terminal is disposed on and electrically coupled to the redistribution circuit structure, where the redistribution circuit structure is disposed between the semiconductor die and the terminal, and the terminal includes an under-bump metallization (UBM) and a capping layer. The UBM is disposed on and electrically coupled to the redistribution circuit structure, where the UBM includes a recess. The capping layer is disposed on and electrically coupled to the UBM, where the UBM is between the capping layer and the redistribution circuit structure, and the capping layer fills the recess of the UBM.

In accordance with some embodiments, a stacked structure includes a semiconductor structure including at least one semiconductor die and at least one dummy die, an insulating encapsulation, a redistribution circuit structure, and a plurality of terminals. The at least one semiconductor die and the at least one dummy die are encapsulated by the insulating encapsulation. The redistribution circuit structure is disposed on the insulating encapsulation and electrically coupled to the at least one semiconductor die. The plurality of terminals are disposed on and electrically coupled to the redistribution circuit structure, where the plurality of terminals each include a Cu-containing layer and a capping layer. The Cu-containing layer is disposed over the redistribution circuit structure, where the Cu-containing layer includes a recess therein. The capping layer is disposed on the Cu-containing layer, where the capping layer fills the recess of the Cu-containing layer, and the Cu-containing layer is disposed between the redistribution circuit structure and the capping layer.

In accordance with some embodiments, a method of manufacturing a semiconductor structure includes the following steps: disposing a redistribution circuit structure over a semiconductor die, the redistribution circuit structure being electrically coupled to the semiconductor die; and forming a terminal over the redistribution circuit structure, the terminal being electrically coupled to the redistribution circuit structure, wherein forming the terminal comprises: forming an under-bump metallization (UBM) over and electrically coupled to the redistribution circuit structure, wherein the UBM comprises a recess; forming a capping material over the UBM, the capping material further extending into the recess of the UBM; and performing a reflowing process on the capping material to form a capping layer, wherein the capping layer fills the recess of the UBM.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
a semiconductor die;
a redistribution circuit structure, disposed on and electrically coupled to the semiconductor die; and
a terminal, disposed on and electrically coupled to the redistribution circuit structure, wherein the redistribution circuit structure is disposed between the semiconductor die and the terminal, and the terminal comprises:
an under-bump metallization (UBM), disposed on and electrically coupled to the redistribution circuit structure, wherein the UBM comprises a recess; and
a capping layer, disposed on and electrically coupled to the UBM, wherein the UBM is between the capping layer and the redistribution circuit structure, and the capping layer fills the recess of the UBM,
wherein at least a portion of an outer sidewall of the UBM is further covered by the capping layer.

2. The semiconductor structure of claim 1, wherein the capping layer comprises a via portion disposed in the recess of the UBM—and a line portion connecting to the via portion and disposed on the UBM, wherein the line portion has a first surface and a second surface opposite to the first surface, and the second surface is closer to the UBM than the first surface is,
wherein the first surface is a planar surface.

3. The semiconductor structure of claim 1, wherein the capping layer comprises a via portion disposed in the recess of the UBM, a line portion connecting to the via portion and disposed on the UBM, and a dome portion connecting to the line portion, wherein the line portion is disposed between the via portion and the dome portion, and the dome portion has a top surface and a bottom surface opposite to the top surface, and the bottom surface is in contact with the line portion,
wherein the top surface is a curved surface, and a thickness of the dome portion is greater than 0 µm and is less than or substantially equal to 10 µm.

4. The semiconductor structure of claim 3, wherein the top surface is a convex surface with respect to the line portion.

5. The semiconductor structure of claim 1, wherein the capping layer comprises a via portion disposed in the recess of the UBM and a line portion connecting to the via portion and disposed on the UBM, wherein the line portion has a first surface and a second surface opposite to the first surface, and the second surface is closer to the UBM than the first surface is,
wherein the line portion comprises an additional recess disposed at the first surface, and a depth of the addition recess is greater than 0 µm and is less than or substantially equal to 10 µm.

6. The semiconductor structure of claim 1, wherein a portion of the UBM disposed over the redistribution circuit structure has a width being constant along a direction from the redistribution circuit structure towards the capping layer.

7. The semiconductor structure of claim 1, wherein a sidewall of the UBM comprises a non-planar sidewall, and a portion of the UBM disposed over the redistribution circuit structure has a width being gradually increased along a direction from the redistribution circuit structure towards the capping layer.

8. The semiconductor structure of claim 1, wherein the terminal further comprises:
a seed layer, disposed between and electrically connected to the UBM and conductive features of the redistribution circuit structure.

9. The semiconductor structure of claim 1, further comprising:
a semiconductor package, comprising a die; and
a plurality of solder joints, disposed between and connecting the redistribution circuit structure and the semiconductor package, wherein at least one of the plurality of solder joints comprises the terminal disposed on the redistribution circuit structure, a conductive terminal comprised in the semiconductor package, and a pre-solder interposed therebetween.

10. The semiconductor structure of claim 9, wherein the at least one of the plurality of solder joints further comprises:
an IMC region, disposed between and electrically connected to the UBM and the capping layer, wherein a material of the IMC region comprises $Cu_3Sn$ and/or $Cu_6Sn_5$.

11. A stacked structure, comprising:
a semiconductor structure, comprising:
at least one semiconductor die and at least one dummy die encapsulated by an insulating encapsulation;
a redistribution circuit structure, disposed on the insulating encapsulation and electrically coupled to the at least one semiconductor die, wherein the at least one dummy die is electrically isolated from the redistribution circuit structure; and
a plurality of terminals, disposed on and electrically coupled to the redistribution circuit structure, wherein the plurality of terminals each comprise:
a Cu-containing layer, disposed over the redistribution circuit structure, wherein the Cu-containing layer comprises a recess therein; and
a capping layer, disposed on the Cu-containing layer, wherein the capping layer fills the recess of the Cu-containing layer, and the Cu-containing layer is disposed between the redistribution circuit structure and the capping layer.

12. The stacked structure of claim 11, wherein a material of the capping layer comprise Sn—Ag, and a weight percentage of Ag included in the material of the capping layer is about 0.5 wt % to about 3 wt % and a weight percentage of Sn included in the material of the capping layer is about 97 wt % to about 99.5 wt %.

13. The stacked structure of claim 11, wherein the plurality of terminals each further comprise:

a seed layer, disposed on the redistribution circuit structure, wherein the seed layer further lines a respective one opening of a plurality of openings comprised in the redistribution circuit structure and is connected to a conductive feature of the redistribution circuit structure exposed by the respective one opening, and the Cu-containing layer fills the respective one opening, wherein the seed layer is between the Cu-containing layer and the conductive feature of the redistribution circuit structure, and the Cu-containing layer is between the capping layer and the seed layer, and wherein:

each of the plurality of openings comprises a bottom surface and a continuously planar sidewall connecting to the bottom surface, or each of the plurality of openings comprises a bottom surface and a step-form sidewall connecting to the bottom surface.

14. The stacked structure of claim 11, further comprising:
a semiconductor package, comprising a die; and
a plurality of solder joints, disposed between and electrically connecting the semiconductor structure and the semiconductor package, wherein the plurality of solder joints each comprise one of the plurality of terminals comprised in the semiconductor structure, a respective one of a plurality of conductive terminals comprised in the semiconductor package, and a pre-solder interposed therebetween.

15. The stacked structure of claim 14, wherein the plurality of solder joints each further comprise:
an IMC region, disposed between and electrically connected to the Cu-containing layer and the capping layer, wherein a material of the IMC region comprises $Cu_3Sn$ and/or $Cu_6Sn_5$.

16. A method of manufacturing a semiconductor structure, comprising:
disposing a redistribution circuit structure over a semiconductor die, the redistribution circuit structure being electrically coupled to the semiconductor die; and
forming a terminal over the redistribution circuit structure, the terminal being electrically coupled to the redistribution circuit structure, wherein forming the terminal comprises:
forming an under-bump metallization (UBM) over and electrically coupled to the redistribution circuit structure, wherein the UBM comprises a recess;
forming a capping material over the UBM, the capping material further extending into the recess of the UBM; and
performing a reflowing process on the capping material to form a capping layer, wherein the capping layer fills the recess of the UBM, and at least a portion of an outer sidewall of the UBM is further covered by the capping layer.

17. The method of claim 16, further comprising:
laterally encapsulating the semiconductor die in an insulating encapsulation prior to disposing the redistribution circuit structure over the semiconductor die.

18. The method of claim 16, wherein performing the reflowing process on the capping material to form the capping layer comprises heating the capping material, so that a portion of the capping material at a periphery region thereof flows towards a center region thereof to fill up the recess of the UBM, wherein the capping layer comprises a via portion disposed in the recess of the UBM and a line portion connecting to the via portion and disposed on the UBM, wherein the line portion has a first surface and a second surface opposite to the first surface, and the second surface is closer to the UBM than the first surface is,
wherein the first surface is a planar surface.

19. The method of claim 16, wherein performing the reflowing process on the capping material to form the capping layer comprises heating the capping material, so that a portion of the capping material at a periphery region thereof flows towards a center region thereof to fill up the recess of the UBM, wherein the capping layer comprises a via portion disposed in the recess of the UBM, a line portion connecting to the via portion and disposed on the UBM, and a dome portion connecting to the line portion, wherein the line portion is disposed between the via portion and the dome portion, and the dome portion has a top surface and a bottom surface opposite to the top surface, and the bottom surface is in contact with the line portion,
wherein the top surface is a curved surface, and a thickness of the dome portion is greater than 0 μm and is less than or substantially equal to 10 μm.

20. The method of claim 16, wherein performing the reflowing process on the capping material to form the capping layer comprises heating the capping material, so that a portion of the capping material at a periphery region thereof flows towards a center region thereof to fill up the recess of the UBM, wherein the capping layer comprises a via portion disposed in the recess of the UBM and a line portion connecting to the via portion and disposed on the UBM, wherein the line portion has a first surface and a second surface opposite to the first surface, and the second surface is closer to the UBM than the first surface is,
wherein the line portion comprises an additional recess disposed at the first surface, and a depth of the addition recess is greater than 0 μm and is less than or substantially equal to 10 μm.

* * * * *